United States Patent [19]

Kakuishi et al.

[11] Patent Number: 5,610,943
[45] Date of Patent: Mar. 11, 1997

[54] SIGNAL PROCESSING APPARATUS

[75] Inventors: Mitsuo Kakuishi; Tsuyoshi Ueshima, both of Yokohama, Japan

[73] Assignee: Fujitsu Limited, Kawasaki, Japan

[21] Appl. No.: 436,928

[22] Filed: May 8, 1995

Related U.S. Application Data

[63] Continuation of Ser. No. 55,767, May 3, 1993, abandoned, which is a continuation of Ser. No. 455,319, filed as PCT/JP89/00579, Jun. 7, 1989, published as WO89/12359, Dec. 14, 1989, abandoned.

[30] Foreign Application Priority Data

Jun. 8, 1988 [JP] Japan ................................. 63-140692
Jul. 25, 1988 [JP] Japan ................................. 63-183487

[51] Int. Cl.⁶ .......................... H04B 14/02; H03H 17/02
[52] U.S. Cl. ........................ 375/243; 375/254; 341/110; 341/144; 341/155
[58] Field of Search .......................... 375/222, 240–243, 375/254; 341/108, 110, 126, 144, 155

[56] References Cited

U.S. PATENT DOCUMENTS

| | | | |
|---|---|---|---|
| 4,053,712 | 10/1977 | Reindl | 341/143 |
| 4,141,039 | 2/1979 | Yamamoto | 358/339 |
| 4,312,075 | 1/1982 | Murano et al. | 375/354 |
| 4,334,237 | 6/1982 | Reitmeier et al. | 348/619 |
| 4,348,768 | 9/1982 | Svala | 375/243 |
| 4,393,516 | 7/1983 | Itani | 375/354 |
| 4,430,642 | 2/1984 | Weigand et al. | 341/145 |
| 4,460,890 | 7/1984 | Busby | 341/61 |
| 4,518,950 | 5/1985 | Petr | 341/75 |
| 4,755,994 | 7/1988 | Staples et al. | 375/240 |
| 4,805,189 | 2/1989 | Mahoney | 375/224 |
| 4,920,543 | 4/1990 | Martin | 375/225 |
| 4,937,579 | 6/1990 | Maio et al. | 341/156 |
| 5,051,981 | 9/1991 | Kline | 375/222 |

FOREIGN PATENT DOCUMENTS 0176946  9/1985  European Pat. Off..

OTHER PUBLICATIONS

Crochiere et al., "Multistage Structures Based on Half–Band FIR Filters", *Multirate Digital Signal Processing*, 1986, Prentice–Hall, NJ, US, Sec. 5.4, pp. 218–227.

*Primary Examiner*—Young T. Tse
*Attorney, Agent, or Firm*—Staas & Halsey

[57] ABSTRACT

The present invention provides a two-system A/D converter, which provides a digital output signal with a higher conversion precision than is achieved by a single-system A/D converter. Conversely, by using a two-system D/A converter with a lower conversion precision, the present invention provides an analog output signal with a higher conversion precision than is achieved by a single-system D/A converter. Further, a digital signal clock changing unit produces data by performing high sampling of the first digital data trains, and the second digital data is synchronized with a second clock through an interpolation processing based on the timing difference between the first and second clocks. A high-precision A/D and D/A converter apparatus is thus realized by using two pulse code modulation coder/decoders (PCM-CODECs) and one digital signal processor (DSP).

12 Claims, 31 Drawing Sheets

| SEGMENT | LINEAR INPUT | μ-LOW PCM OUTPUT | OUTPUT VALUE | QUANTIZING STEP |
|---|---|---|---|---|
| 1 | 0<br>1 ~ 2<br>3 ~ 4<br>⋮<br>29 ~ 30 | 1111 1111<br>1111 1110<br>1111 1101<br>⋮<br>1111 0000 | 0<br>2<br>4<br>⋮<br>30 | 2 |
| 2 | 31 ~ 34<br>⋮<br>91 ~ 94 | 1110 1111<br>⋮<br>1110 0000 | 33<br>⋮<br>93 | 4 |
| 3 | 95 ~ 102<br>⋮<br>215 ~ 222 | 1101 1111<br>⋮<br>1101 0000 | 99<br>⋮<br>219 | 8 |
| 4 | 223 ~ 238<br>239 ~ 254<br>255 ~ 270<br>271 ~ 286<br>287 ~ 302<br>303 ~ 318<br>319 ~ 334<br>335 ~ 350<br>351 ~ 366<br>367 ~ 382<br>383 ~ 398<br>399 ~ 414<br>415 ~ 430<br>431 ~ 446<br>447 ~ 462<br>463 ~ 478 | 1100 1111<br>1100 1110<br>1100 1101<br>1100 1100<br>1100 1011<br>1100 1010<br>1100 1001<br>1100 1000<br>1100 0111<br>1100 0110<br>1100 0101<br>1100 0100<br>1100 0011<br>1100 0010<br>1100 0001<br>1100 0000 | 231<br>247<br>263<br>279<br>295<br>311<br>327<br>343<br>359<br>375<br>391<br>407<br>423<br>439<br>455<br>471 | 16 |
| 5 | 479 ~ 510<br>⋮<br>959 ~ 990 | 1011 1111<br>⋮<br>1011 0000 | 495<br>⋮<br>975 | 32 |
| 6 | 991 ~ 1054<br>⋮<br>1951 ~ 2014 | 1010 1111<br>⋮<br>1010 0000 | 1023<br>⋮<br>1983 | 64 |
| 7 | 2015 ~ 2142<br>⋮<br>3935 ~ 4062 | 1001 1111<br>⋮<br>1001 0000 | 2079<br>⋮<br>3999 | 128 |
| 8 | 4063 ~ 4319<br>⋮<br>7903 ~ 8158 | 1000 1111<br>⋮<br>1000 0000 | 4191<br>⋮<br>8031 | 256 |

Fig. 7

| $\alpha$ | $\alpha k$ | $\alpha \cdot \frac{1}{k}$ | $D(\alpha k)$ | $D(\alpha \frac{1}{k})$ | Dout | |
|---|---|---|---|---|---|---|
| ⋮ | ⋮ | ⋮ | ⋮ | ⋮ | | |
| 384 | 388 | 380 | 391 | 375 | 383 | Q1 |
| 386 | 390 | 382 | " | " | " | |
| 387 | 391 | 383 | " | 391 | 391 | |
| 388 | 392 | 384 | " | " | " | |
| 390 | 394 | 386 | " | " | " | |
| 392 | 396 | 388 | " | " | " | Q2' |
| 394 | 398 | 390 | " | " | " | |
| 395 | 399 | 391 | 407 | " | 399 | |
| 396 | 400 | 392 | " | " | " | |
| 398 | 402 | 394 | " | " | " | Q2 |
| 400 | 404 | 396 | " | " | " | |
| 402 | 406 | 398 | " | " | " | |
| 403 | 407 | 399 | " | 407 | 407 | |
| 404 | 408 | 400 | " | " | " | |
| 406 | 410 | 402 | " | " | " | |
| 408 | 412 | 404 | " | " | " | Q3' |
| 410 | 414 | 406 | " | " | " | |
| 411 | 415 | " | 423 | " | 415 | |
| 412 | 416 | 408 | " | " | " | |
| 414 | 418 | 410 | " | " | " | Q3 |
| 416 | 420 | 412 | " | " | " | |
| 418 | 422 | 414 | " | " | " | |
| 420 | 424 | 416 | " | 423 | 423 | |
| 422 | 426 | 418 | " | " | " | |
| 424 | 428 | 420 | " | " | " | Q4' |
| 426 | 430 | 422 | " | " | " | |
| 427 | 431 | 423 | 439 | " | 431 | |
| 428 | 432 | 424 | " | " | " | |
| 430 | 434 | 426 | " | " | " | Q4 |
| ⋮ | ⋮ | ⋮ | ⋮ | ⋮ | | |

Fig. 8

| $\beta$ | P3 | A1 D($\beta$) | N | 2E | $\beta+2E$ | P4 | A2 | Aout |
|---|---|---|---|---|---|---|---|---|
| 383 | 1100 0101 | 391 | -8 | -16 | 368 | 1100 0110 | 375 | 385.7 |
| 384 | " | " | -7 | -14 | 370 | " | " | " |
| 386 | " | " | -5 | -10 | 376 | " | " | " |
| 388 | " | " | -3 | -6 | 382 | 1100 0101 | 391 | 391 |
| 389 | " | " | -2 | -4 | 385 | " | " | " |
| 390 | " | " | -1 | -2 | 388 | " | " | " |
| 391 | " | " | 0 | 0 | 391 | " | " | " |
| 392 | " | " | 1 | 2 | 394 | " | " | " |
| 394 | " | " | 2 | 4 | 397 | 1100 0100 | 407 | 396.3 |
| 396 | " | " | 3 | 6 | 400 | " | " | " |
| 398 | " | " | 4 | 8 | 406 | " | " | " |
| 399 | 1100 0100 | 407 | 5 | 10 | 412 | " | " | " |
| 400 | " | " | 6 | 12 | — | 1100 0101 | 391 | 401.7 |
| 402 | " | " | 7 | 14 | 383 | " | " | " |
| 404 | " | " | -8 | -16 | 386 | " | " | " |
| 406 | " | " | -7 | -14 | 392 | " | " | " |
| 408 | " | " | -5 | -10 | 398 | 1100 0100 | 407 | 407 |
| 410 | " | " | -3 | -6 | 401 | " | " | " |
| 412 | " | " | -1 | -2 | 404 | " | " | " |
| 414 | " | " | +1 | 2 | 410 | 1100 0011 | 423 | 412.3 |
|  |  |  | +3 | 6 | 413 | " | " | " |
|  |  |  | +5 | 10 | 416 | " | " | " |
|  |  |  | +7 | 14 | 422 | " | " | " |
|  |  |  |  |  | 428 | " | " | " |

| β | P3 | A1 D(β) | N | 2E | β+2E | P4 | A2 | Aout |
|---|---|---|---|---|---|---|---|---|
| 415 | 1100 0011 | 423 | -8 | -16 | 399 | 1100 0100 | 407 | 417.7 |
| 416 | " | " | -7 | -14 | 402 | " | " | " |
| 418 | " | " | -5 | -10 | 408 | " | " | " |
| 420 | " | " | -3 | -6 | 414 | " | " | " |
| 422 | " | " | -1 | -2 | 417 | 1100 0011 | 423 | 423 |
| 424 | " | " | -1 | -2 | 420 | " | " | " |
| 426 | " | " | 3 | 6 | 426 | " | " | " |
| 428 | " | " | 5 | 10 | 429 | 1100 0010 | 439 | 428.3 |
| 430 | " | " | 7 | 14 | 432 | " | " | " |
| 431 | 1100 0010 | 439 | -8 | -16 | 438 | " | " | " |
| 432 | " | " | -7 | -14 | 444 | " | " | " |
| 434 | " | " | -5 | -10 | 415 | 1100 0011 | 423 | 433.7 |
| 436 | " | " | -3 | -6 | 418 | " | " | " |
| 438 | " | " | -1 | -2 | 424 | " | " | " |
| 440 | " | " | -1 | -2 | 430 | 1100 0010 | 439 | 439 |
| 442 | " | " | +1 | 2 | 436 | " | " | " |
| 444 | " | " | +3 | 6 | 442 | 1100 0001 | 455 | 444.3 |
| | | | | | 445 | | | |
| | | | | | 448 | | | |

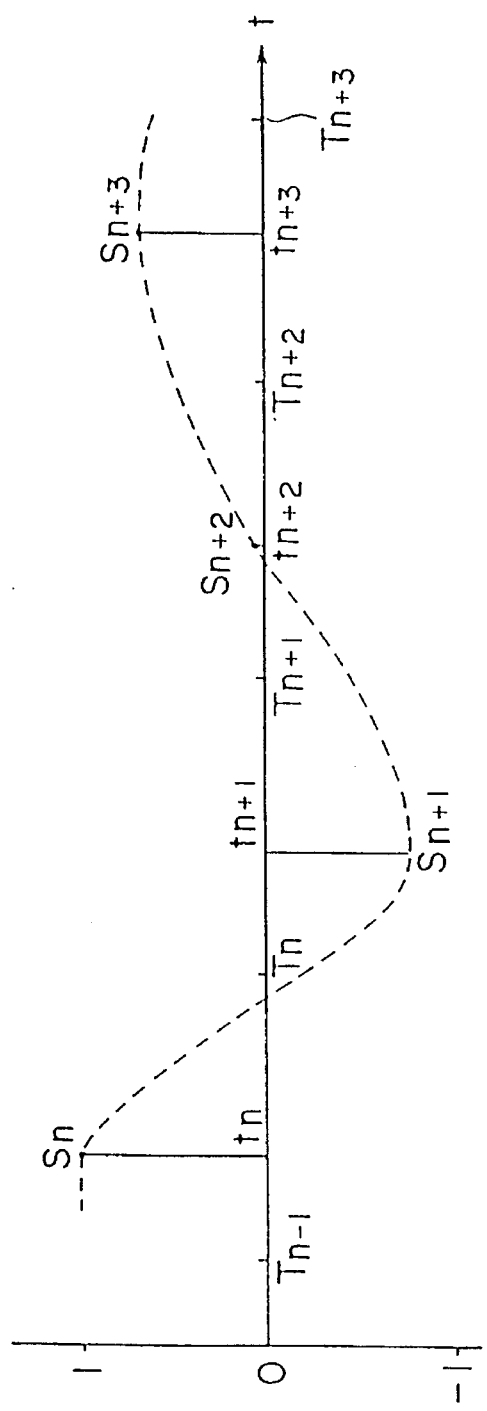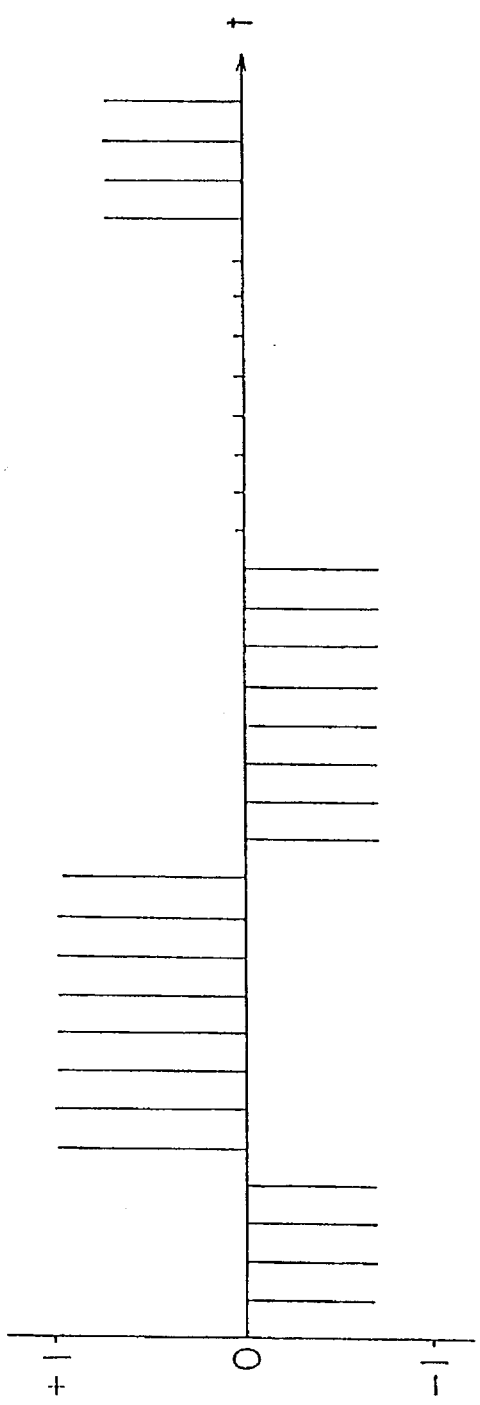
Fig. 14A
Fig. 14B

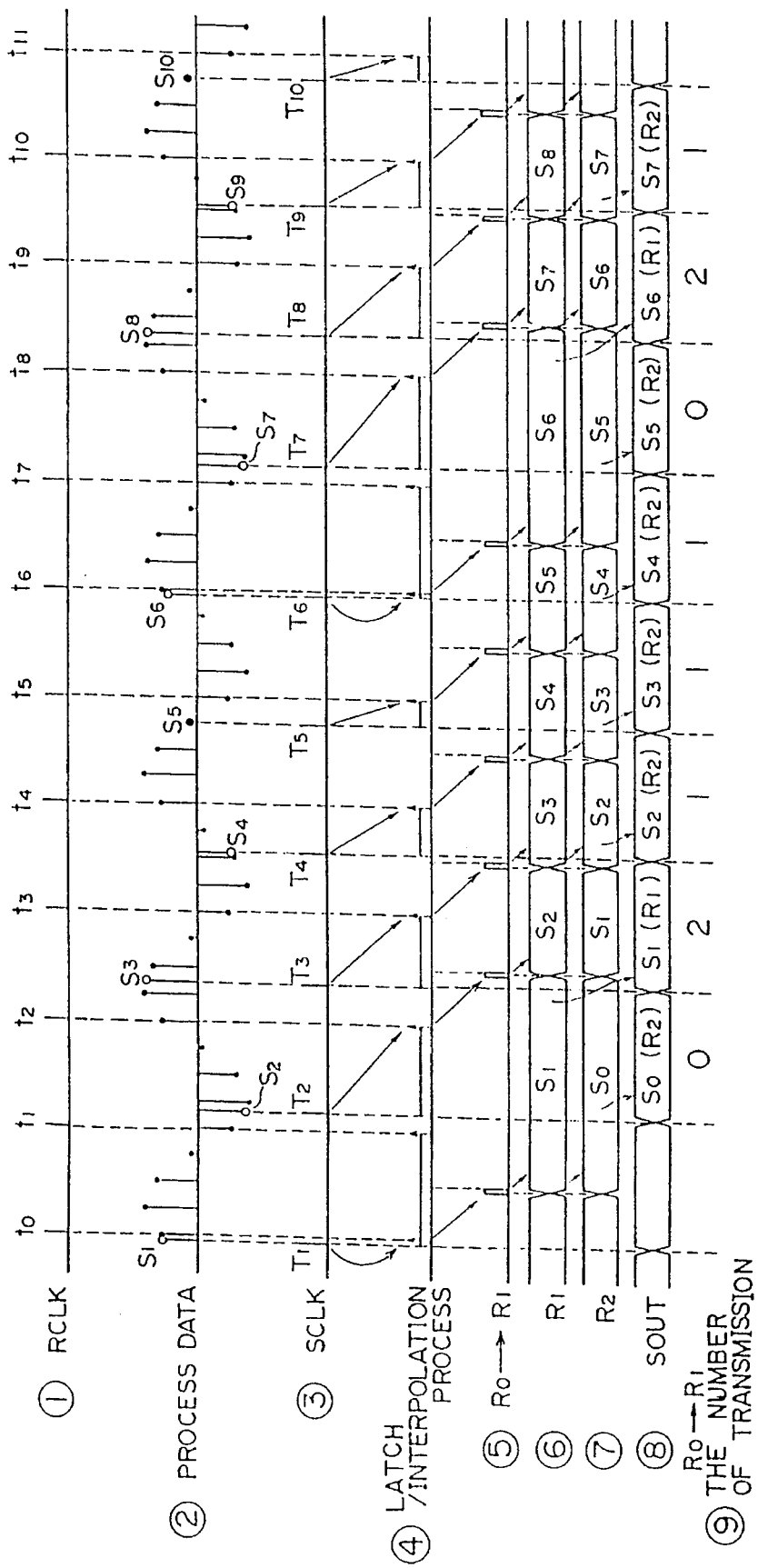
Fig. 27A (S > R)

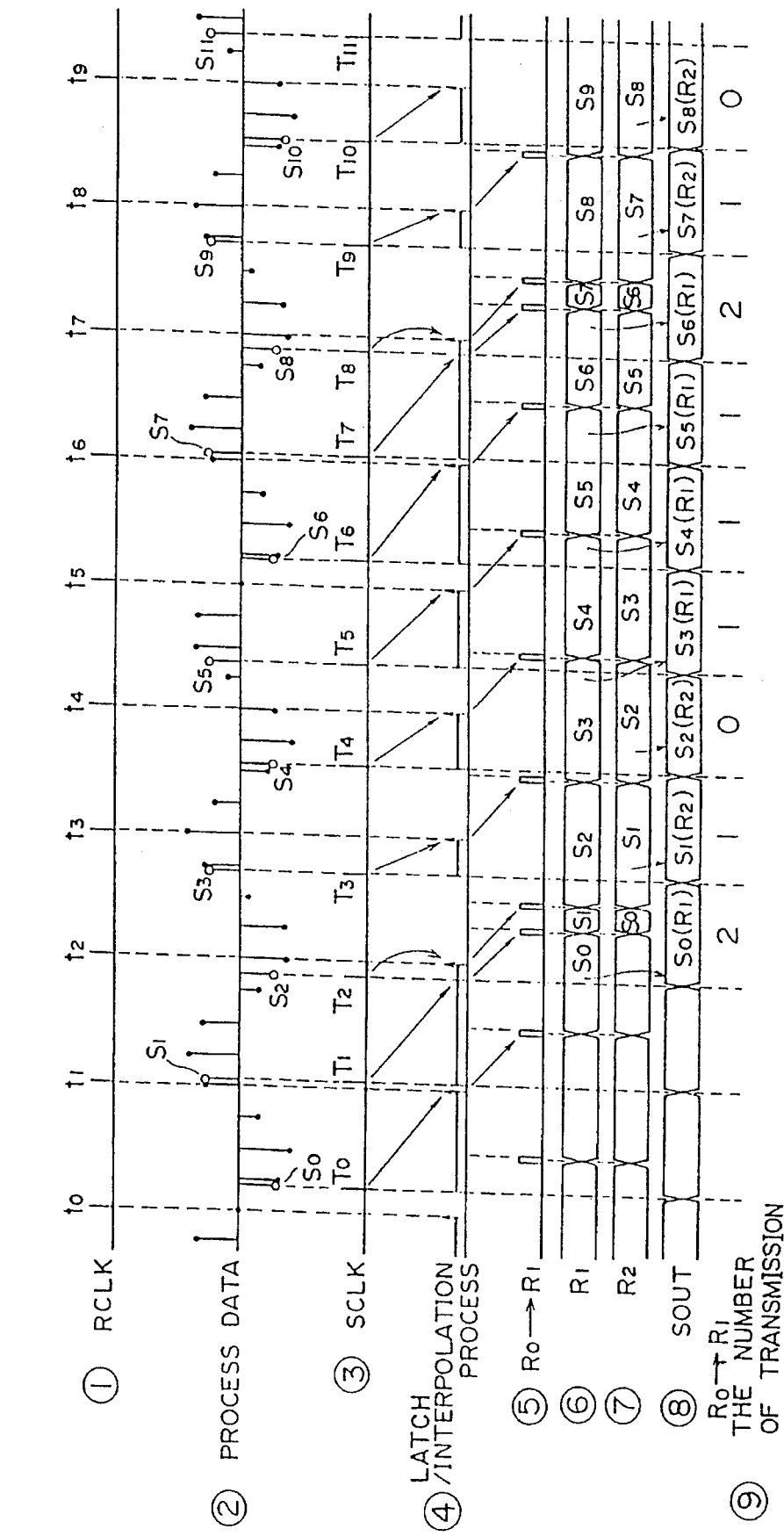
Fig. 27B  (S < R)

SIGNAL PROCESSING APPARATUS

This application is a continuation, of application Ser. No. 08/055,767, filed May 3, 1993, now abandoned, which is a continuation of application Ser. No. 07/455,319, filed as PCT/JP89/00579, Jun. 7, 1989, published as WO89/12359, Dec. 14, 1989, now abandoned.

BACKGROUND OF THE INVENTION

1. Field of the Invention

The present invention relates to a signal processing apparatus for performing coding/decoding and other processes on digital PCM signals, for example, by combining a PCM-.CODEC and a DSP (Digital Signal Processor), and more particularly, to a technology for realizing a practical signal processing in DSP by using equivalently high precision and inexpensive A/D or D/A converters, and to an output signal clock changing apparatus necessary for performing the above signal processing in synchronization with the same clock.

2. Description of the Related Art

The signal processing apparatus performs coding/decoding and other processes, for example, on digital PCM signals.

There are representative apparatuses, an A/D converter for performing a coding between an analog telephone band signal on a subscriber line and a digital PCM signal on a relaying line, and a D/A converter for performing a decoding therebetween.

Generally speaking, when an analog signal is converted to a digital signal on a receiving side, it is first sampled at predetermined intervals by using respective sampling signals, and then quantized with regard to respective sampling signals. Quantizing is executed to predivide the amplitude level of the analog signal into a plurality of ranges so that the analog signals within certain ranges can be represented by a corresponding representative digital value. The resulting quantized signal is transmitted on a transmission line as a digital PCM signal coded. On the receiving side, the digital PCM signal is reconverted to an analog signal and reproduced as a telephone signal such as a human voice.

During the quantizing process, a certain range of analog signals can be expressed by the same code, even if sampled values vary to some extent, and on the receiving side the sampled value within the range can be decoded as an analog signal of the same amplitude. Therefore, there may be a substantial difference, between an analog signal before coding and an analog signal after decoding. This difference is called quantization noise.

The signal to quantizing noise ratio (S/N) is used to evaluate the quality of the communicated signal. The range presented by one code is called a quantizing step. When the quantizing step is uniform, quantizing noise is constant. Therefore, if the signal, namely, the amplitude of the analog input is large, S/N is high. If it is small, S/N is low. However, for good communication quality, S/N should be maintained constant regardless of the above amplitude. A nonlinear quantization in which the quantizing step is made small for an analog input with a small amplitude, and large for an analog input with a large amplitude, is generally adopted. This is called companding. To produce good companding characteristics for a nonlinear quantization of a telephone signal, a companding rule called μ-law is adopted in Japan and the United States, and a companding rule called A-law is adopted in other areas, including Europe and parts of Asia.

Recently, 8 bit companding A/D or D/A converters for performing a signal conversion based on the above companding rule have been produced by many makers. Although their structures are complicated, they are relatively inexpensive. The ICs are generally called "PCM.CODEC." (PCM coder/decoder).

On the other hand, when data transmission other than voice signals is conducted by using a telephone band signal, a signal processing circuit such as an equalizer, an attenuator or a balancing network is redundant when combined with a converter such as a PCM.CODEC. These circuits are conventionally constructed as analog circuits. On a coding side they are provided in a stage before an A/D converter, and on a decoding side in a stage after a D/A converter.

FIG. 1 shows a conventional digital PCM channel apparatus which can be realized as a combination of the above circuits and a PCM.CODEC.

PCM.CODEC 1 comprises an A/D converting unit including a low-pass filter (LPF) 7 and an A/D converter 8, and a D/A converting unit including a D/A converter 10 and a LPF 11. A/D converter 8 and D/A converter 10 conduct data conversion based on 8-bit μ-law companding. LPFs 7 and 11 limit the frequency range of the analog signals which are respective input/output signals, to a frequency band which can be expressed by a sampling frequency, namely they are law pass filters for limiting a frequency band up to ½ the sampling frequency. As described above, PCM.CODEC 1 integrally forms a low-pass filter in a chip. As a result the cost of coding/decoding portions can be reduced.

Hybrid transformer 3 divides an analog telephone band signal (analog data) transmitted on a 2-wire subscriber line 2 into a transmitting signal and a receiving signal. Equalizers 4 and 13 correct the loss of frequency characteristics of signals in 2-wire subscriber line 2 or 4-wire tansmission path 9 within a telephone band. Attenuaters 6 and 12 correct the signal level loss caused during propagation along a line. Balancing network 15 adjusts the impedance of hybrid transformer 3 in order to reduce leak (echo-back) of signals from the receiving side to the transmitting side, the leak being caused by an impedance mismatching in hybrid transformer 3. Amplifiers 5 and 14 adjust the signal levels. Setting and controlling of the above circuits is conducted electrically by a remote control of a center (station) not shown, as designated by the dotted line in FIG. 1. This control is generally called a remote provision.

The above circuits 4,6,12,13 and 15 are important circuits which are necessary for increasing the communication quality. However, when they are analog circuits, they are large and the cost of the apparatus as a whole becomes high. Provision for remotely setting a plurality of analog circuits becomes complicated.

However, DSPs (Digital Signal Processor) have started to become widely used in various fields, and LSIs of DSPs can be obtained at a low price. The performance of DSPs has increased annually, and a circuit portion subjected to a conventional analog process is replaced by a DSP process. This is also because the scale of the hardware can be reduced by a DSP process. Use of a DSP suppresses the effect of deviations caused among various kinds of products and in the manufacturing process, to a minimum value, although the deviations in the manufacturing process have a large effect on products in an analog circuit. Further, only a modification of installed firmware can facilitate a change in a process operation. Based on this technology, units conventionally subjected to an analog process are replaced by a DSP in the field of telephone band signal processing. It is desired that the aforementioned equalizer, attenuator, and balancing network be replaced by a DSP.

FIG. 2 shows the structure of a digital PCM channel apparatus, in which the process of the above respective circuit is conducted by a DSP. In FIG. 2, portions designated by the same reference numbers as in FIG. 1 perform the same function as the portions in FIG. 1. As shown in FIG. 2, DSP 16 is provided on the digital signal side of PCM-.CODEC 1, and the same function as the impedance control of hybrid transformer 3, which is conducted in balancing network 15 in FIG. 1, can be realized by DSP16. Therefore, the impedance of hybrid transformer 3 is fixed at a constant value as is conceptually represented by resistance value R in FIG. 2 and an occurrence of signal leakage is allowed. Coarse attenuators 17 and 18 perform a rough adjustment of signal level in the 3dB range of analog signal, and also have a preprocessing function.

As shown in FIG. 2, DSP 16 is preferably combined with PCM.CODEC1 which is available at a low cost. However, mere combination of DSP16 and PCM.CODEC 1 cannot realize a coder and decoder apparatus with a desired performance. This is because of the recited S/N ratio. According to a μ-law companding by PCM.CODEC, a digital signal coded on a transmitting side is transmitted to a receiving side through a transmission path without suffering any modification, and is decoded on the receiving side following the same companding rule as on the transmitting side and the μ-law companding is a kind of code conversion rule determined based on the above condition. Therefore, when DSP processing is applied to a digital signal after an A/D conversion, a quantizing noise instinctively occurring only upon coding is also produced upon decoding. Thus, in order to raise the communication quality the number of quantizing bits must be made as large as possible, and the respective quantizing steps made as small as possible, thereby suppressing quantizing noise to a minimum value. Most currently available PCM.CODECs perform an eight bit quantization, and the accuracy of this quantization is relatively low. Therefore, there is a problem that deterioration of communication signal S/N cannot be avoided if a PCM.CODEC currently on the market is merely combined with a DSP.

In order to solve the above problem of S/N deterioration, consideration is given to use of a quantization apparatus with a smaller quantizing step than an 8-bit quantizing apparatus, which can maintain the same step size up to a high level, as a converter corresponding to A/D converter 8 and D/A converter 10 in FIG. 2. For example, use of a linear converter performing 16 bit linear quantization may be considered. A linear converter for about 15 bits may be sufficient, depending on the degree of signal processing performed by the DSP but, considering that PCM.CODEC based on the 8 bit μ-law companding has a resolution which is similar to that of a 14-bit linear converter, a resolution of about 16 bits may be necessary.

Either an A/D or D/A converter having high resolution such as 15 or 16 bits has a more complicated circuit and a larger scale than PCM.CODECs currently on the market. Therefore 16 or 15 bit A/D or D/A converters are extremely disadvantageous in terms of cost. Further, a PCM.CODEC is installed with a low-pass filter and the above-recited linear converter with a high resolution does not have such filter. Thus, it has to be provided with a new low pass filter, causing a great cost increase and increasing the chip area.

In another example where a digital PCM channel apparatus is constructed by combining the A/D and D/A converter with the DSP, a technology considered to enable a DSP to perform processing similar to the aforerecited equalizer, attenuator and balancing network, as explained below.

A general structure considered as a digital PCM channel apparatus based on the above structure will again be shown in FIG. 3. Here, hybrid transformer 21, A/D converter 23 and D/A converter 24 perform the same functions as those represented by the reference numbers 3, 8 and 10, respectively, in FIG. 2. The impedance of hybrid transformer 21 can be maintained constant, as in FIG. 2. Two-wire subscriber 20 and 4-wire transmission path 30 are also similar to those represented by the reference numbers 2 and 9 in FIG. 2. Preprocessing circuit 22 is shown by including amplifier 5, coarse attenuator 17 and LPF 7 in FIG. 2 Post-processing circuit 25 is represented by combining LPF 11, coarse attenuator 18 and amplifier 14 of FIG. 2. Although it is abbreviated in FIG. 2, it sometimes performs the process of emphasizing a high frequency component of an analog signal in order to raise the quality of a communication signal. In contrast, post-processing circuit 25, in some cases, performs a process in which characteristics of signals emphasized on the transmitting side return to the appropriate process.

In FIG. 3, input signal SIN converted to digital data by A/D converter 23 and receiving PCM signal RIN from 4-wire transmission path 30, is input to DSP 19. In DSP 19, transmission level setting equalizer 27 and receiving level setting equalizer 28 are realized as firmware and perform the same operation as equalizers 4 and 13, and attenuators 6 and 12 in FIG. 1. Namely, with regard to the above input signal SIN and receiving PCM signal RIN, a loss of frequency characteristics of signals on 2-wire subscriber line 20 or 4-wire transmission path 30 is accurately corrected within a telephone band, and a loss of signal level caused by a line is accurately corrected.

At this time a part of a signal advanced from post-processing circuit 25 to subscriber line 20, is turned to input DSP 19 through hybrid transformer 21 such that it is included in input signal SIN making it necessary for the component entered into DSP 19 to be cancelled. Therefore, the above component is produced from receiving output signal ROUT in precise balance circuit 29, and this is added to input signal SIN at adder 26 (actually, this is substraction) thereby cancelling the above component.

This process is performed to obtain a difference between received output signal ROUT i.e. a receiving system signal, and input signal SIN i.e. a transmitting system signal, and to bridge a receiving system and a transmitting system.

A digital transmission system including the digital PCM channel apparatus of FIG. 3 has a transmission speed of, for example, 64 Kbit/sec and operates in synchronization with an 8 KHz clock. As far as it is not a complete dependent synchronization network, in FIG. 3 a receiving system circuit such as D/A converter 24 operates in synchronization with a receiving clock extracted from received PCM signal RIN and a transmitting system circuit such as A/D converter 23 operates in synchronization with a transmitting clock produced within a channel apparatus not shown. In this case, a receiving clock is obtained by dividing a master clock of the other terminal station, and a transmitting clock is formed by dividing a master clock of the own station. Therefore, both transmitting and receiving clocks have an indicated frequency of 8 KHz but, as they do not use the same master clock, their frequencies are slightly different in practice, and this difference is around $10^{-4}$ at the maximum.

The difference of $10^{-4}$ means that, when transmitting system data is input 10000 times, the receiving system data becomes 10001.

This results in sampling timings of received PCM signal RIN and input signal SIN, which are input to DSP119, always differing slightly. Therefore, even if a receiving signal component included in input signal SIN is intended to be cancelled by an output from precise balance circuit 29 to which a receiving PCM signal RIN is input into adder 26, the signals at different times are subjected to the addition and thus, the desired result is not obtained.

Moreover, when the difference is $10^{-4}$ at 8 KHz clock, data out running phenomenon occur at a rate of 1 timing per 1.25 seconds. Thus, the data at the time is lost.

Therefore, it is necessary to match one clock with the other clock. In this case, receiving PCM signal RIN is a signal which has already been sampled on the transmitting side and the receiving clock thereof already exists on the transmitting side. In order to receive received PCM signal RIN, the receiving clock is needed. Thus, the receiving clock is used as a transmitting clock.

Received PCM signal RIN comes from a transmitting terminal station through a plurality of repeater or relay stations. Thus, some jitter is added to the receiving PCM signal RIN through respective stations. Therefore, received PCM signal RIN already includes large jitter. Thus, if it is used as a transmitting clock it is transmitted through many relays before it reaches the other terminal station. Thereby the amount of jitter is increased, greatly deteriorating the communication quality. Therefore, when a clock generator is provided in both terminal stations and is intended to maintain the same communication quality, as in the case where these clock generators are designed to synchronize accurately with each other, the distance which causes jitter becomes the distance of going and returning or twice the one-way distance. Therefore, the relay distance is limited to ½ the ordinary relay distance.

An echo canceler cancels echo signals included in transmitted signals, the echo signals being formed by signals advancing to a subscriber through hybrid transformer 21 being turned back. The echo canceler produces suitable replica echo signals, based on received signals, and subtracts them from the signal being transmitted. This performs a process of bridging a transmitted signal and a received signal, thereby causing a problem similar to the above case.

To solve the above problems, a digital-signal clock-changing method is necessary. In this method, a digital PCM channel apparatus as shown in FIG. 3 operates a D/A converter 24, an A/D converter 23 and a precise balance circuit 29, in synchronization with a receiving clock. This enables a transmitting signal obtained from these signals to again be synchronized with a transmitting clock generated by the clock generator of the own station. The transmitting signal is thereby produced as output signal SOUT.

In this case, it is preferable to achieve good communication quality and to be able to miniaturize the apparatus.

FIG. 4 shows a block diagram of a conventional clock changing method. In FIG. 4, the first clock system digital data 34 are converted to analog data by a D/A converter 31 which operates in accordance with the first clock 35. Then, after the analog data is converted to data which is continuous with time, through analog low pass filter 32, the output from low pass filter 32 is converted to the second clock system digital data 37 by an A/D converter 33 which operates at the second clock 36, thereby achieving a clock changing.

However, in the apparatus shown in FIG. 4, input digital data is reconverted to analog data by D/A converter 31 and the analog data is again converted to digital data by A/D converter 33. This results in a production of a quantizing noise and deterioration of the communication quality. A further problem is that the apparatus shown in FIG. 4 needs an analog low pass filter 32 which, unlike a digital circuit, cannot be miniaturized even if it is integrated.

SUMMARY OF THE INVENTION

The present invention is made in consideration of the above situation and its first object is to provide a high precision A/D and D/A converter by combining a PCM.CODEC of a low conversion precision and an inexpensive A/D and D/A, thereby providing a high precision A/D and D/A converter and realizing a practical signal processing within the DSP. The second object of the present invention is to perform a clock change in a digital signal without using an analog signal when the clock change of the digital output signal is necessary, as a result of performing a signal processing realized by the high precision A/D and D/A converter both on the receiving and transmitting sides and performing a signal processing synchronized with the same clock.

To achieve the above object, the present invention provides an A/D converting unit for shifting an amplitude value of an analog input signal and individually performing a conversion of the analog input signal. This is done by using respective first and second A/D converters and arithmetically operating an average value of respective conversion results. Thus, it provides higher conversion precision digital output signal than a single A/D converter. The first A/D converter system of the A/D converter means comprises, for example, first amplifier 38, first companding A/D converter 39, and first linear converter 42, as shown in FIG. 5. The second A/D converter system comprises, for example, a second amplifier 40, second companding A/D converter 41, and second linear converting unit 43, as shown in FIG. 5. The above arithmetic operation of the average value can be conducted by an arithmetic operation unit 44, for example, as shown in FIG. 5.

Next, the present invention individually converts digital input signals by first and second D/A converter systems, detects a quantizing error caused by the first D/A converter system, adds the quantizing error to a digital input signal input to the second D/A converter system and mixes the respective conversion results of the first and second D/A converter systems in a predetermined ratio. Thus, it provides a higher conversion precision analog output signal than a single D/A converter system. The first D/A converter system in the D/A converter unit comprises a first companding converting unit 45 and first companding D/A converter 49, for example, as shown in FIG. 6, and the second D/A converting system comprises second companding converting unit 46 and second companding D/A converter 50, for example, as shown in FIG. 6. Quantizing error from the first D/A converting system is detected by detecting unit 49, for example, as shown in FIG. 6 and is added to the second D/A converter system by using noise adding unit 48. The respective conversion results of the first and second D/A converter systems are mixed in a predetermined ratio by the first and second amplifier 51 and 52 and adder 53, for example, as shown in FIG. 6.

Further, the present invention provides a digital-signal-clock changing or transferring unit by performing a high sampling of the first digital data system trains, detecting a timing difference between the first clock and the second clock, and producing second digital data synchronized with the second clock to an interpolation processing from data subjected to high sampling based on the timing difference. In the digital signal clock changing unit, means for performing a high-sampling of the first digital data system train comprises data conversion circuit 63 and high sampling digital low-pass filter 64, for example, as shown in FIG. 13A. The means for detecting timing difference between the first clock and the second clock comprises timing difference detecting circuit 66, for example, as shown in FIG. 13A. Further, this unit is disclosed in the circuit shown in FIGS. 19, 24 and 25, for example. In addition, a unit for performing the above interpolation processing comprises interpolation processing unit 65, for example, as shown in FIG. 13A, and more concretely, is disclosed as processes shown in FIGS. 18 and 26

Further, the present invention discloses that the above recited high-sampling digital low-pass filter 64 is divided into a plurality of blocks as shown in FIG. 13B and an output timing adjusting circuit relating to timing difference detecting circuit 66 as disclosed in FIG. 28.

The structure of the above invention is realized, for example, by two PCM.CODECs and one DSP as a coding/decoding apparatus for a digital PCM signal. Namely, the A/D converting unit and the D/A converting unit can be realized by using a portion of a function of two PCM.CO-DECs and one DSP which perform 8-bit companding coding and decoding, and the digital signal clock changing unit can be realized by using a function of the DSP (digital Signal Processor).

Therefore a small inexpensive structure comprising two PCM.CODECs and one DSP can realize high-precision A/D and D/A converting processing. Therefore, signal processing devices such as an attenuator, an equalizer and a balancing network, which are conventionally realized by an analog circuit, can be realized by digital signal processing using one DSP. In this case, to prevent a timing deviation between signals processed on the transmitting side and those processed on the receiving side, the above signal processing is conducted in synchronization with a receiving clock of a digital receiving signal received from an external line. Therefore, it becomes necessary on the transmitting side connected to a line, to enable a transmission digital output signals, synchronized with the receiving clock to be changed, to be synchronized with a transmitting clock. This processing is more easily realized by a digital signal clock changing unit in the DSP.

As shown above, the present invention can perform high precision A/D and D/A conversion with ease by using a signal processing apparatus formed by an inexpensive PCM-.CODEC and a DSP. It can therefore perform with one DSP a signal processing, which conventionally necessitates a large scale analog circuit. In addition, it can realize a digital-signal clock-changing means necessary for signal processing by using a signal processing in the same DSP. In this case, the present invention realizes a timing difference detecting unit within a digital signal clock changing unit in an extremely simple circuit, by extremely simple processing.

Therefore, the present invention can integrate an apparatus while maintaining a high communication quality, thereby miniaturizing greatly the whole apparatus. Moreover, it and can realize an inexpensive, low-energy consuming, highly reliabile signal-processing apparatus.

BRIEF DESCRIPTION OF THE DRAWINGS

FIG. 7 is a table which details the relationship between various numerical values under general μ-law;

FIG. 8 is a table which details the relationship between values of various portions in an A/D conversion apparatus;

FIGS. 11A and 11B are tables which detail the relationship between values of various portions of a D/A conversion apparatus;

FIGS. 14A, 14B and 14C show timing charts of waveforms for various portions of the second embodiment;

FIGS. 27A and 27B are operation timing charts of the fourth embodiment;

DETAILED DESCRIPTION OF THE PREFERRED EMBODIMENTS

Firstly, the first embodiment will be explained. This embodiment is characterized in that the accuracy of A/D and D/A conversion are improved by using two sets of PCM-CODECs based on 8-bit μ-law companding.

Figure 5:
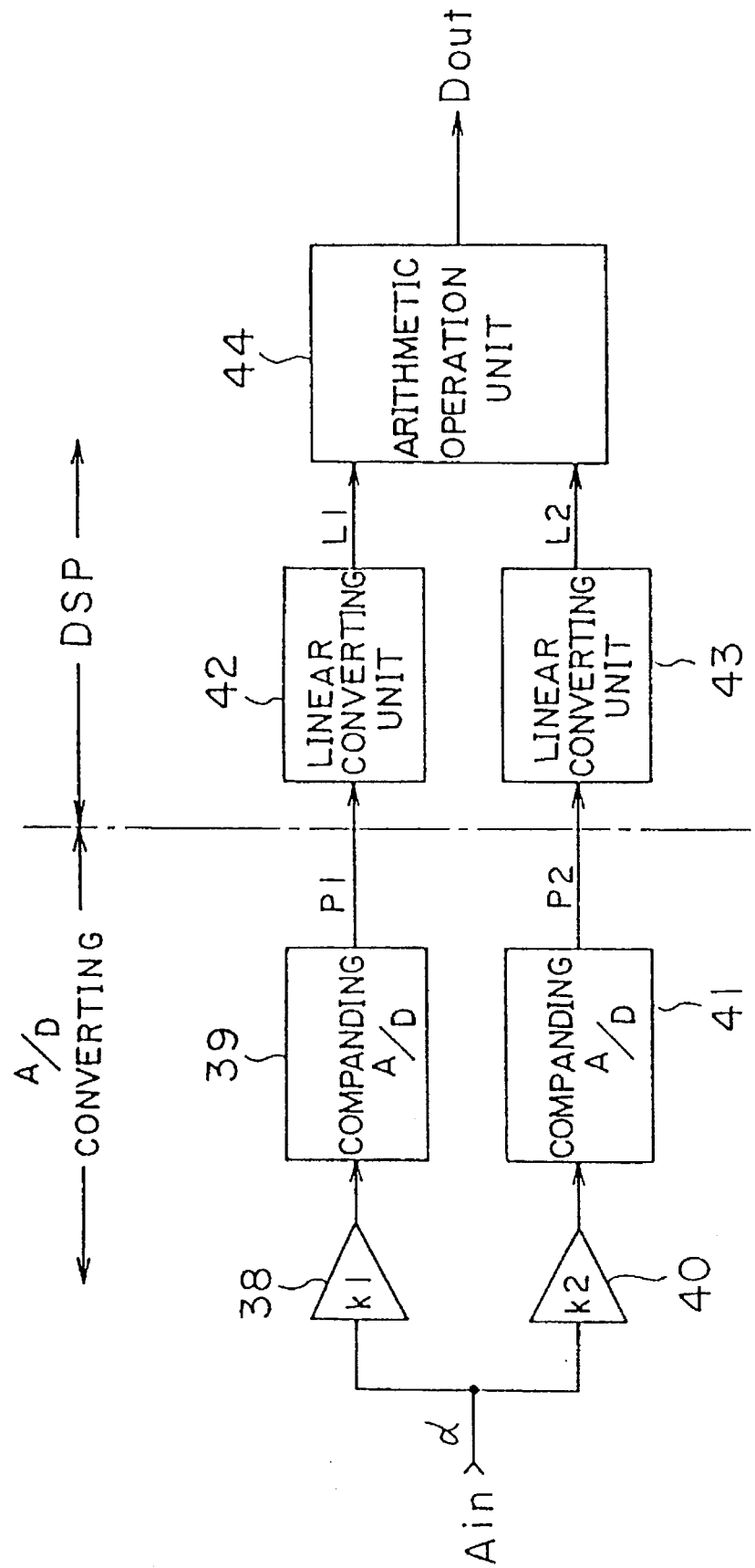
FIG. 5 shows a basic structural view of an A/D conversion apparatus according to the first embodiment.

FIG. 5 shows the basic structure of an A/D converting apparatus according to the first embodiment of the present invention. In FIG. 5, analog signal $A_{in}$ is commonly applied to the first and second A/D converting systems. In the first A/D converting system, the signal $A_{in}$ is amplified k1 times in first amplifier 38 and is converted to the first PCM code P1 by the first companding A/D converter 39. In the second A/D converting system, signal $A_{in}$ is amplified k2 times in the second amplifier 40, and is further converted to the second PCM code P2 by the second companding A/D converter 41. k1 and k2 are real numbers satisfying the relationship k1×k2=1.

At least first linear converting unit 42, second linear converting unit 43 and arithmetic operation unit 44 are formed in the DSP. First and second linear converting units 42 and 43 convert respective first and second PCM codes P1 and P2 into first and second linear codes L1 and L2. Arithmetic operation unit 44 performs an arithmetic operation on these linear codes L1 and L2 to derive an average value (L1+L2)/2, and this average value becomes digital conversion output $D_{OUT}$. As will be recited later by referring to FIG. 12, processes based on functions of the precise balance circuit, equalizer, and attenuator are applied to the digital conversion output.

Figure 6:
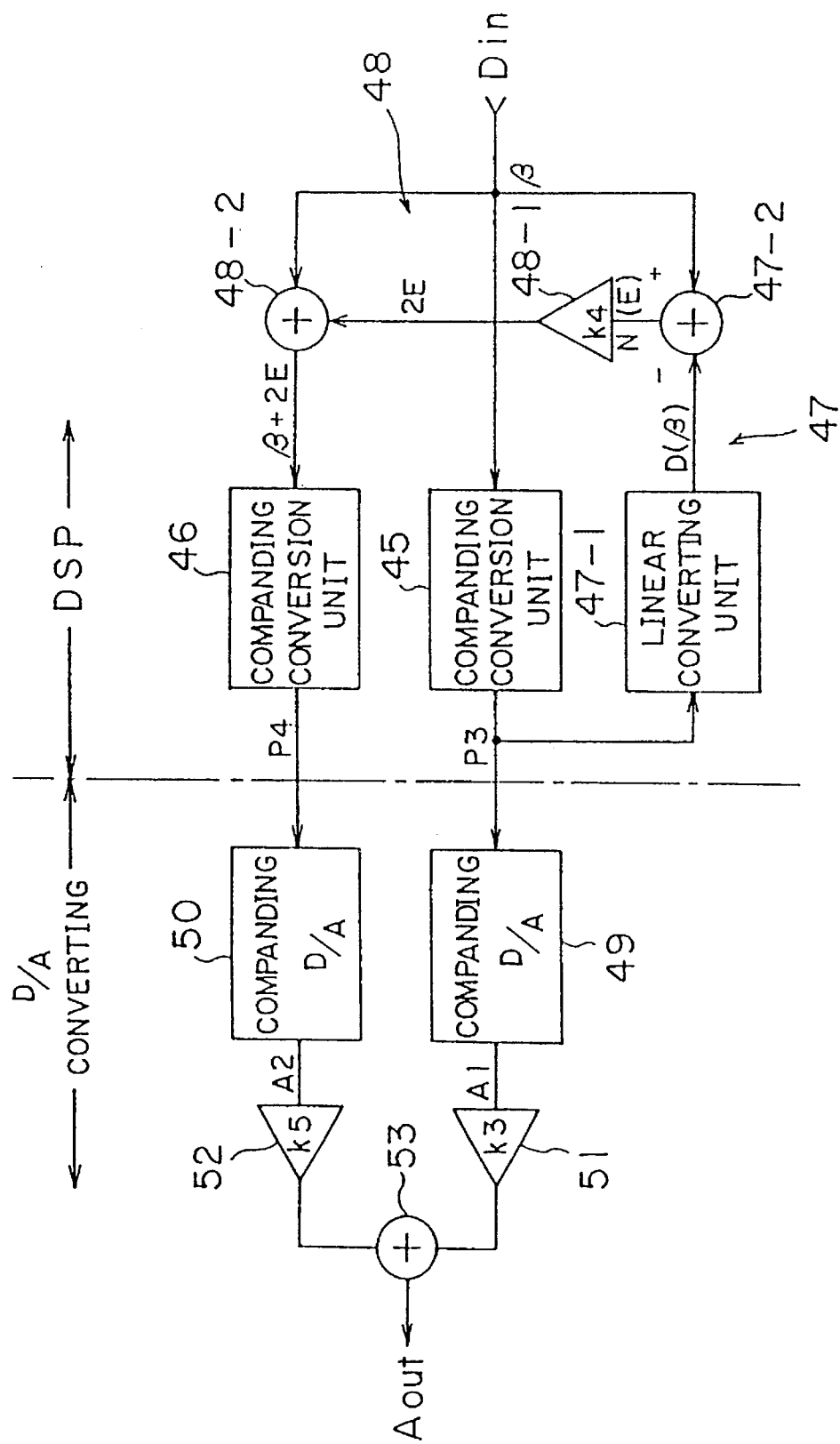
FIG. 6 shows the basic structure of a D/A conversion apparatus according to the first embodiment.

FIG. 6 shows the basic structure of the D/A converting apparatus relating to the first embodiment of this invention. In FIG. 6, after the above respective processes are performed in the DSP (later recited in FIG. 12) digital signal $D_{in}$, input as a linear PCM code, is applied to first companding conversion unit 45 and is converted to the first companding PCM code P3. The first companding PCM code P3 is input to the first D/A converting system. This system comprises first companding D/A converter 49 for converting code P3 to the first analog signal A1, and first amplifier 51 for amplifying the signal A1 k3 times.

At least second companding converting unit 46, detecting unit 47 and noise adding unit 48 are formed in the DSP in addition to converting unit 45. Detecting unit 47 detects a quantizing noise N in the first companding PCM code P3. Detecting unit 47 comprises linear converting unit 47-1 and subtracting unit 47-2 in FIG. 6.

Quantizing noise N is applied to noise adding unit 48. It is then multiplied by k4 and added to digital signal $D_{in}$. In FIG. 6, noise adding unit 48 comprises amplifying unit (gain k4) 48-1 and adding unit 48-2. The output of noise adding unit 48 is converted to the second companding PCM code P4 by second companding converting unit 46. The code P4 is input to the second D/A converting system. This system comprises the second companding D/A converter 50 which converts code P4 to the second analog signal A2, and second amplifier 52 which amplifies the signal A2 k5 times. The relations between k3, k4 and k5 are determined to satisfy the conditions k3+k5=1, and k4=k3/(1−k3), where k3, k4 and k5 are all positive real numbers.

Respective amplification outputs of the first and second analog signals, A1 and A2, obtained by the above process are added at adder 53, thereby producing analog conversion output $A_{out}$.

An operation of the first embodiment shown in FIGS. 5 and 6 will now be explained.

Firstly, the A/D converting apparatus of FIG. 5 is explained. Supposing that the amplification ratio k1 of the first amplifier 38 satisfies k1=k (therefore, the amplification ratio k2 of the second amplifier 40 satisfies k2=1/k) and that the amplitude of analog signal $A_{in}$ is α. The signal $A_{in}$ is amplified to provide αk and α/k, which are applied as input to corresponding companding A/D converters 39 and 41, thereby providing the first and second PCM codes P1 and P2 of digital values. These PCM codes are subjected to companding and are not real numerical values. Therefore, the PCM codes cannot be a subject of a computation and they are modified. Therefore these codes are returned to linear codes L1 and L2 representing the real numerical value by linear converting units 42 and 43. In this state, arithmetic operation unit 44 performs an arithmetic operation to obtain an average value (L1+L2)/2. As described in detail later, in addition to a group of 255 or 256 output values which may be output as 8 bit companding CODEC, an intermediate value within two adjacent output values may be produced from the average value, thereby resulting in an increase in the kinds of output values. This means an increase in the resolution of the A/D converter. The reason is that the linear codes L1 and L2 differ from each other because of the multiplication ratio of k and 1/k. If L1 is the same value L as L2, then the value L is the output value and, if L1 deviates from L2, the intermediate value between L1 and L2 appears as the output value.

The above operation will be explained in more detail by referring to an example.

In the A/D converter of FIG. 5, the amplification ratio k1 of the first amplifier 38 is set at K (=1.01), and the amplification ratio k2 of the second amplifier 40 is set at 1/k(=1/1.01). An explanation of this embodiment adopts a μ-law as an example of a companding rule. Even in case of an A-law, the effect of the present invention does not differ.

FIG. 7 shows a relation between respective values under a general μ-law. In FIG. 7, the voltage range of the analog input (a column of linear input in the drawing) added to companding A/D converters 39 and 41 of FIG. 5 is set, for example, −8158 to +8158 and $2^8$ (=256) times the output value (OUTPUT VALUE) are set within the input analog voltage range. The unit of the analog input voltage is, for example, milli-volts. In accordance with the respective value of the analog inputs (linear inputs in the drawing), an 8-bit digital code is determined as a μ-law PCM output, and it outputs from the A/D converter. In FIG. 7, to simply recite an explanation, only positive linear input is shown, only the complete fourth segment is recited and intermediate values in the other segments are omitted. The segment means a range of respective bent lines when a μ-law characteristic is expressed by a plurality of bent lines and quantizing steps are constant in respective ranges.

An 8-bit digital code of the above μ-law PCM output is simply a symbol used for a classification and does not mean an actual amplitude value. Therefore, the above μ-law PCM output is converted to the corresponding digital value of 0 to 8031 (which corresponds to the output value (OUTPUT VALUE) in FIG. 7) by first and second linear converting units (μ/L converting units ) 42 and 43 in the DSP of FIG. 5. Thus, the digital value has 14-bit accuracy.

As the first and second linear codes L1 and L2 of FIG. 5, numerical data corresponding to αk and α/k appear, as explained above. For an 8-bit companding A/D converter, the kind of respective output level of the linear codes L1 and L2 are respectively merely of 255 or 256 types. However, the actual analog inputs are a continuous value within the range of −8158 to +8158, and the number of kinds of analog inputs is 16316 even when only the integer portion is considered. Because of the difference between the kinds of output levels of first and second linear codes L1 and L2 and the continuous value of analog input, a quantizing noise as described above occurs. Generally speaking, as an evaluation item of an A/D converter and a D/A converter, the above recited S/N (in units of dB) is used. For example, for an 8-bit companding A/D (D/A) converter for a telephone signal, the output obtained by inputting a sine wave signal of 1010 Hz to the A/D converter is input to the D/A converter. The D/A converter provides output including a signal component, namely, a signal of 1010 Hz. This signal component, represented by an "S" frequency component other than the 1010 Hz included in the output from the D/A converter, is represented by N (noise). A large part of the noise comprises quantizing noise caused by representing a certain range of analog input by an output value formed by the central value of the analog input.

Therefore, a large S/N means a small quantizing noise and a small waveform distortion. Specifically, to increase S/N it is necessary to decrease quantizing noise, and to decrease quantizing noise it is necessary to increase the output value from the A/D (D/A) converter and to thereby decrease the length of the quantizing steps.

According to the embodiment shown in FIG. 5, use of two sets of 8-bit companding A/D converters 39 and 41 enables the above output value to increase as shown below. Further, use of a commercially available PCM.CODEC enables a signal processing apparatus to be realized at a lower cost than with one set of higher quantizing precision (or more than 8-bit) A/D converters, even if two sets of 8-bit companding A/D converters 39 and 41, are utilized.

In FIG. 5, the output value of the first and second linear codes L1 and L2 are respectively $D(\alpha \cdot k)$ and $D(\alpha/k)$. If k is not determined as k=1.01, but as k=1, the linear codes L1 and L2 naturally have the same output value. As is shown in the preferred embodiment, if k=1.01, the first amplification ratio 1.01 is slightly different from the second amplification ratio 1/1.01. Thus, $\alpha k$ becomes different from $\alpha/k$. If the difference between $\alpha k$ and $\alpha/k$ is small and $\alpha k$ and $\alpha/k$ is within a range of respective rows shown in a column of a linear input shown in FIG. 7, the output value $D(\alpha \cdot k)$ is coincident with that of $D(\alpha/k)$. In contrast, if the difference between $\alpha k$ and $\alpha/k$ is outside the range of repsective rows, the output $D(\alpha \cdot k)$ is different from that of $D(\alpha/k)$. More specifically, where k≠1 but is a value near 1, or where one of them is entered into the adjacent range, the output value corresponding to the adjacent range is produced and $D(\alpha \cdot k) \neq D(\alpha/k)$. In the former (coincidence) an average value of $\alpha k$ and $\alpha/k$, namely, $\frac{1}{2} \times \alpha \{(k+1/k)\}$ is positioned near the center of the range of respective rows of the linear input shown in FIG. 7. In the latter (non-coincidence) the above average value appears near the boundary between adjacent ranges of respective rows.

In the arithmetic operation unit 44 in FIG. 5, the average value of the first and second linear codes L1 and L2 is set at $D_{out} = \frac{1}{2}\{(D(\alpha \cdot k) + D(\alpha/k)\}$ through an arithmetic operation, and in the latter case explained above, the output $D_{out}$ becomes an intermediate value between the output value of one row and that of its adjacent row. In the former case, namely, when $\alpha \cdot k$ and $\alpha \cdot /k$ are within the same range, L1 and L2 become the same, thereby enabling the average value of L1 and L2, or the output $D_{out}$ to become the same value as the respective output value. The output value shown in the column of the output value (OUTPUT VALUE) in FIG. 7 and a new output value mid-way between adjacent output values are obtained, thereby achieving the same result as a high resolution A/D converter.

FIG. 8 shows the relationship among respective values in an A/D converter and shows concrete numerical values of an amplitude $\alpha$ of analog signal $A_{in}$, output value $\alpha k$ of the first amplifier 38, output value $\alpha/k$ of the second amplifier 40, $D(\alpha k)$ which is the value of the first linear code L1, $D(\alpha/k)$ (the value of the second linear code L2), and $\frac{1}{2}\{D(\alpha \cdot k)+D(\alpha/k)\}$ which is digital conversion output $D_{out}$ with regard to the apparatus shown in FIG. 5. It should be noted in FIG. 8 that, as shown on the right side, the output values shown by Q1, Q2, Q3 and Q4 appear as new output values in addition to ordinary quantizing output values Q2', Q3' and Q4' of companding A/D converters 39 and 41. Their relationship is shown more comprehensively in FIG. 9. Respective ones of Q2', Q3' and Q4', for example, in FIG. 9 correspond to those in FIG. 7. With regard to $D(\alpha \cdot k)$ and $D(\alpha/k)$, if $\alpha$ is positioned within a region A, quantizing output of the above two values is commonly Q3'. Thus, the digital conversion output $D_{out}$ is also Q3', and if $\alpha$ is positioned in a region B, the respective quantizing outputs are divided into two parts Q4' and Q3'. Thus, the digital conversion output $D_{out}$ becomes an intermediate value, Q3. In a case where $\alpha$ is positioned in the region C, respective quantizing outputs are divided into Q3' and Q2'. Thus, the digital conversion output $D_{out}$ becomes an intermediate value Q2.

As described above, conventionally, there are 255 kinds of output values, and in this embodiment the number of kinds of the output values doubles and the size of the quantizing steps (Δ) halves. Then, quantizing noise power ($\Delta^2/12$) becomes ¼ and S/N increases by 6 dB. When DSP processing is applied to the digital conversion output $D_{out}$, deterioration of S/N is suppressed to a minimum value.

Figure 9:
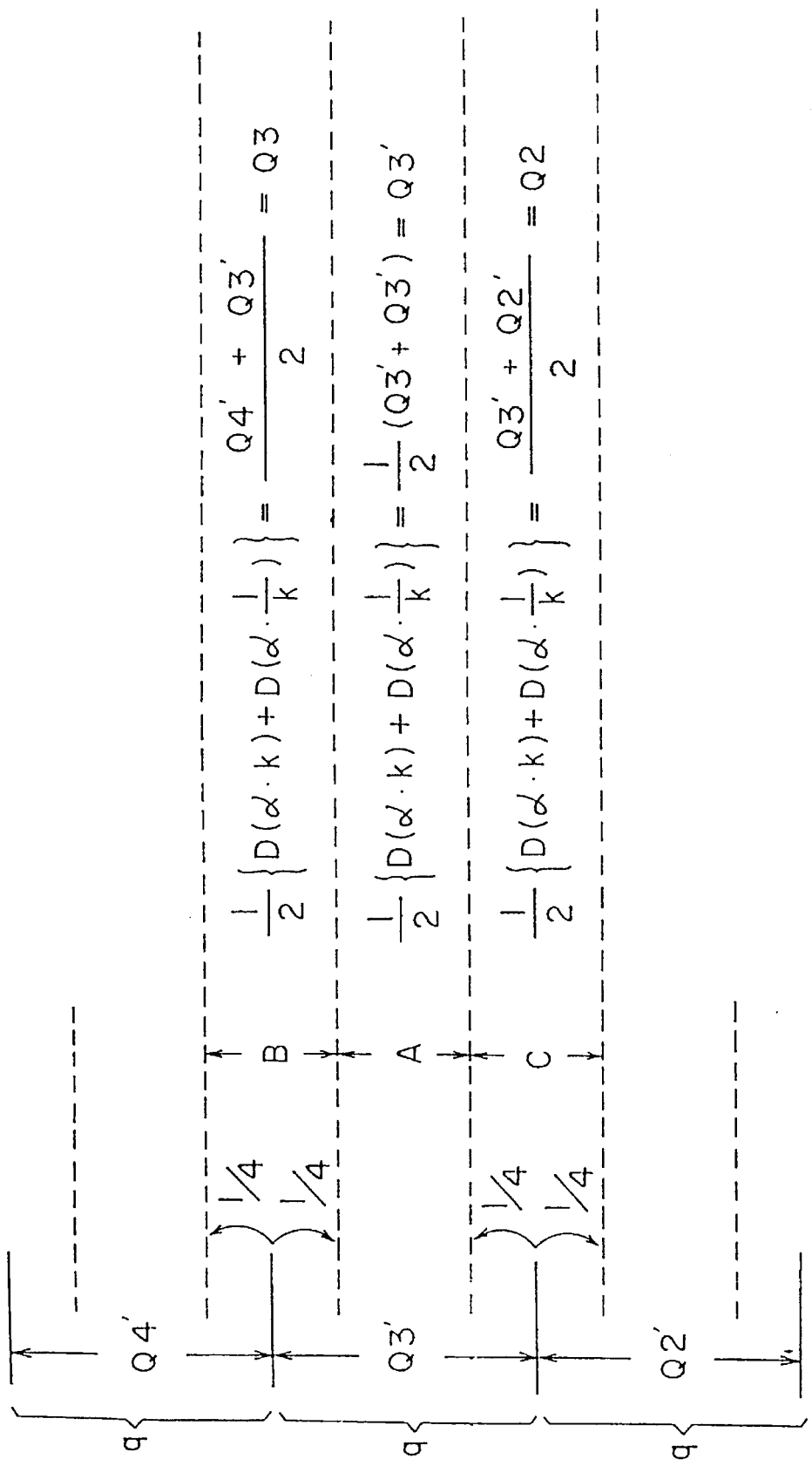
FIG. 9 shows a view for explaining the operation of an A/D conversion apparatus.

In this case, as shown in FIG. 9, suppose that an upper value is obtained by subtracting ¼ of a quantizing step value q from the value of the upper boundary (shown by a solid line) between two adjacent quantizing output values q of companding A/D converters 39 and 41 (FIG. 5), and that a lower value is obtained by adding ¼ of a quantizing step value q to the value of the lower boundary. These values then constitute new boundary values (i.e. decision values shown by the dotted line), and the width of a possible range of respective newly formed output values become the same, which is the most preferable. Thereby, an amplification ratio k can be calculated as follows.

$$k \approx 1 + (\text{quantizing step})/(4 \times |\text{output value}|).$$

For a companding A/D conversion, the quantizing step is made large in a region where the output value is large (namely, the quantizing noise is large). Thus, the ratio of (quantizing step/|ouput value|) of the companding A/D conversion is generally closer to the constant value than that obtained by the linear A/D converter. If this ratio is constant, then the value of the above k can be determined. However, as is clear from FIG. 7, the ratio of (quantizing step/|ouput value|) is not always constant. A part of the 8th segment has a value of 256/8031(=3.18%) and a part of the second segment has a value of 4/33(=12%), and the difference between these values is large. Therefore, it is necessary to determine the most appropriate value experimentally. Therefore, according to the result of the experiment using μ-law 8 bit companding A/D converter, k=1.025 is the most appropriate value.

Next, an operation of the D/A converter in FIG. 6 will be explained. In order to simplify the explanation, it is supposed that the amplification ratio of the first amplifier 51, is $k3=\frac{2}{3}$. Therefore as described above, $k4=k3/(1-k3)=(\frac{2}{3})/(1\frac{2}{3})=2$, $k5=1-k3=\frac{1}{3}$. Under this condition, if the value of digital signal $D_{in}$ of FIG. 6 is β, $D_{in}$ is input to the first companding D/A converter 49 through the first companding converter 45 and is then converted to the first analog signal A1. Thereafter it is multiplied by ⅔ (=k3) by the first amplifier 51, the output of which is ⅔D (β). Then the first companding PCM code P3 is input to linear converting unit 47-1 and reconverted to a linear signal. Therefore, the output value (OUTPUT VALUE) D (β) corresponding to the digital signal $D_{in}$ (=β) on the input side can be recognized as a digital value. The difference between the value β of the digital signal $D_{in}$ and output value D(β) is arithmetically operated in subtracting unit 47-2. Then a voltage E corresponding to a quantizing noise N produced from companding conversion unit 45 through D/A converter 49 can be obtained. Namely, $$E=\beta-D(\beta) \quad (1)$$

The above E is multiplied by 2(=k4) by amplifying unit 48-1 and is then added to input signal $D_{in}$. Thereafter it is input to the second companding conversion unit 46. Namely, β+2E is input to conversion unit 46 and is rewritten using the above equation (1) as follows.

$$\beta+2E=D(\beta)+3E \quad (2)$$

Where |E| is smaller than ½ a quantizing step (expressed as q) corresponding to or closest to output value D(β) because, if the voltage E of the quantizing noise N is larger than ½ a quantizing step, D(β) becomes an adjacent different output value. As shown in FIG. 7, if D(β) is an output value 359, β of a linear input is 351 to 366, and thus, the quantizing error is less than ±8. This is less than ½ a quantizing step 16 of a segment 4. Therefore 3 |E| in equation (2) is less than 3/2 times the nearest quantizing step q of D(β).

Value D(β+2E) of the second analog signal A2 obtained through a process of the second D/A converter system of $D_{in} \rightarrow$ the second companding conversion unit 46→D/A converter 50 is classified in accordance with the following conditions ①–③.

① where +1.5 q>3E≧0.5 q:

$$D(\beta+2E)=D(\beta)+q \quad (3)$$

② where +0.5 q>3E≧−0.5 q:

$$D(\beta+2E)=D(\beta) \quad (4)$$

③ where −0.5 q>3E≧−1.5 q:

$$D(\beta+2E)=D(\beta)-q \quad (5)$$

D(β)+q is an output value adjacent to the upper side of the output value D (β), and D (β)−q is the output value adjacent to the lower side of the output value D (β). The output value is multiplied by ⅓ (=k5) by the second amplifier 52 in FIG. 6, and is then added to the aforementioned output ⅔ D (β) of the first D/A converter system in adder 53. Based on this output ⅔ D (β) and the result of the above equations (3)–(5), the added output $A_{out}$ is classified in accordance with the following conditions ①–③.

① where +1.5 q>3E≧0.5 q:

$$\tfrac{2}{3}D(\beta)+\tfrac{1}{3}(D(\beta)+q)=D(\beta)+q/3 \quad (6)$$

② where +0.5 q>3E≧−0.5 q:

$$\tfrac{2}{3}D(\beta)+\tfrac{1}{3}D(\beta)=D(\beta) \quad (7)$$

③ where −0.5 q>3E≧−1.5 q:

$$\tfrac{2}{3}D(\beta)+\tfrac{1}{3}(D(\beta)-q)=D(\beta)-q/3 \quad (8)$$

Figure 10:
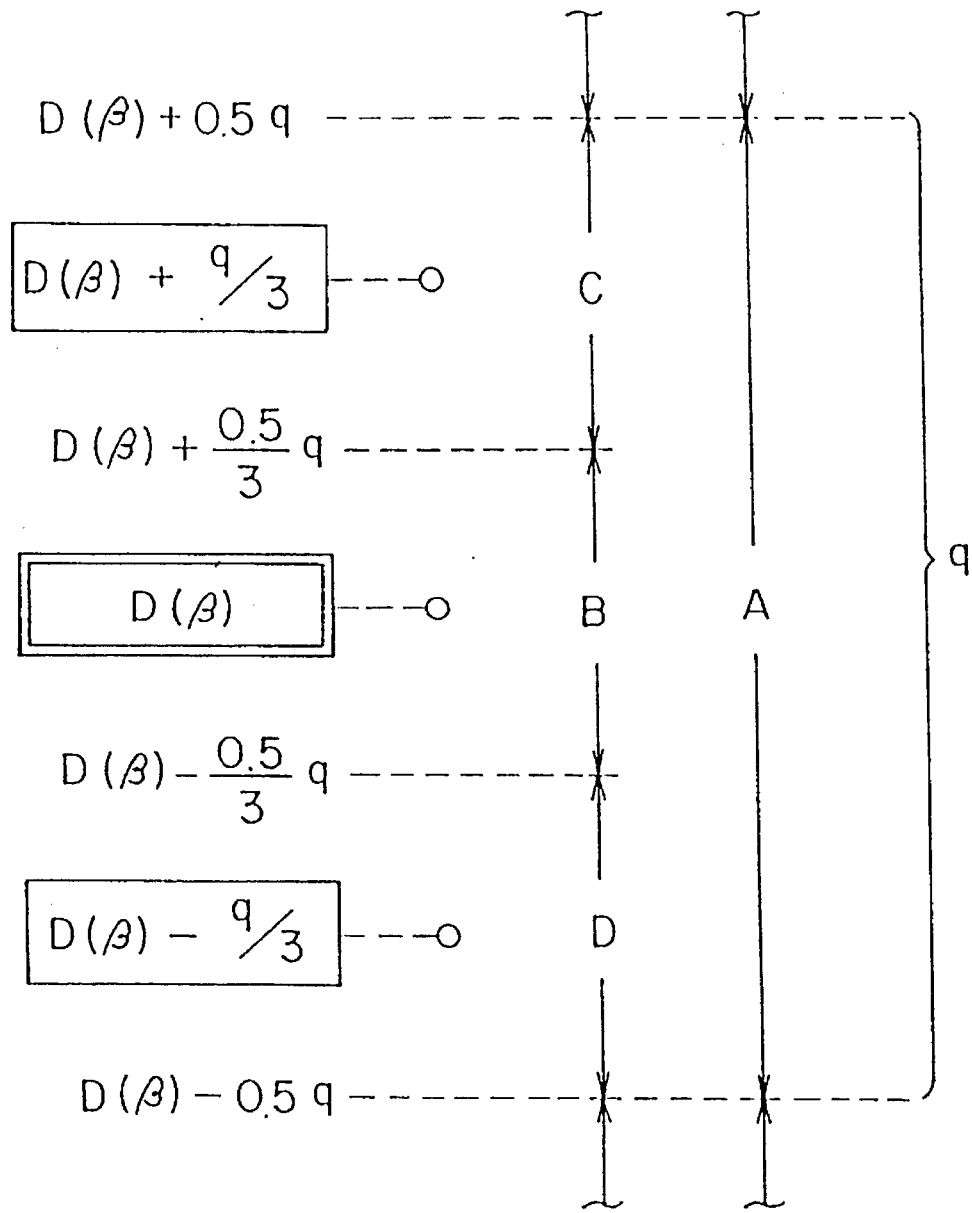
FIG. 10 shows a view for explaining the operation of a D/A conversion apparatus.

The relationships shown in the equations (6)–(8) are shown in FIG. 10. For a conventional structure in which only one set comprising a companding conversion unit and a companding D/A converter is provided, all the values of input digital signal $D_{in}$ within a range designated by region A of FIG. 10 is represented by an analog signal D (β). Therefore, if digital signal $D_{in}$ is positioned within region B, the quantizing error is small, but if it is in region C or D, it becomes large. In contrast, in the above embodiment, the quantizing error can be decreased as described below.

Condition ① in the above equations (3) or (6) is rewritten as 0.5 q>E≧0.5 q/3. Namely, this shows a range of voltage E of a quantizing noise of value β of digital signal $D_{in}$ and representative value D(β) under condition ①. This shows that the value β of digital signal $D_{in}$ in FIG. 6 is within region C in FIG. 10. Namely, deviation of β from the representative value D(β) represents the value within the range is about ⅓ that of quantizing step q. In such a case, as shown in the aforementioned equations (3) and (6) the value of analog signal $A_{out}$ is obtained by adding q/3 to the representative value D(β) and the quantizing error between the analog signal $A_{out}$ and the value β of region C becomes small. Specifically, if the value β of digital signal $D_{in}$ in FIG. 6 falls within a range C of FIG. 10, the output of first companding D/A converter 49 in FIG. 6 is D(β) and the output of second companding D/A converter 50 in FIG. 6 is D(β)+q as expressed in the above-recited equation (3). Therefore, the respective outputs of first and second amplifiers 51 and 52 are ⅔D(β) and ⅓{D(β)+q} and these outputs are added in adder 53. This produces analog signal $A_{out}$ of {D(β)+q/3} as is clear from the equation (6) of FIG. 10. Conventionally, if the value β of digital input signal $D_{in}$ is within a range A in FIG. 10, analog signal $A_{out}$ is expressed merely by D(β). In the present embodiment, if β is positioned within a range C which is included in a range A, $A_{out}$ can be expressed by {D(β)+q/3}, thereby reducing quantizing error included in β and $A_{out}$. As a result, the quantizing error between the analog signal $A_{out}$ and the value β in the range C becomes small.

In condition ③, shown by the aforementioned equations (5) or (8), the relationship is completely opposite to that of the above condition ①. The analog signal $A_{out}$ is obtained by subtracting q/3 from the representative value D (β), and the quantizing error between analog signal $A_{out}$ and the value β of the region D becomes small.

For condition ②, shown by the aforementioned equations (4) or (7), the value β is close to the representative value D (β). This value is produced as analog signal $A_{out}$ without modification.

As described above and shown in FIG. 6, the above quantizing noise produced from the first D/A converting system comprising a route of $D_{in}$→first companding converting unit 45→first companding D/A converting unit 49, is superimposed on an input signal of the second D/A converting system comprising the route of $D_{in}$→second companding converting unit 46→second companding D/A converting unit 50. Therefore, the quantizing noise from the first D/A converting system is almost cancelled and the second D/A converting system produces a maximum quantizing noise of q/2. At the output of adder 53, the output from the second D/A converting system is multiplied by ⅓ (=k5) by second amplifier 52. Thus, the produced quantizing noise becomes q/6 at maximum, namely, ⅓ the conventional quantizing noise.

In the embodiment shown in FIG. 6, the output value becomes 3 times that obtained with only an ordinary companding D/A converter. This embodiment can provide a companding D/A converter of an equivalent high resolution corresponding to, for example, 9.5 bits ($256 \times 3 \approx 2^{9.5}$).

The above operation will be explained in more detail by referring to an example. In an explanation of this embodiment, a μ-law is adopted as a companding rule as in FIG. 5, and the effect of the present invention does not differ from this embodiment even if an A-law companding rule is adopted.

FIGS. 11A and 11B show the value of respective portions of the D/A converting apparatus shown in FIG. 6 and correspond to FIG. 7 regarding the A/D converting apparatus. FIGS. 11A and 11B show amplitude B digital signal $D_{in}$, first companding PCM code P3, value D (β) of analog signal A1 (digital expression), quantizing noise N (digital value), the value of two times voltage E of quantizing noise N (digital value), a digital output from adder 48-2 (β+2E), second companding PCM code P4, second analog signal A2 and analog converting output $A_{out}$ {=(⅔×A1)+(⅓×A2)}, respectively, in FIG. 6. As shown in FIGS. 11A and 11B, respective analog converting outputs $A_{out}$ appear at equal intervals of 5.333 between respective analog converting outputs. Companding D/A converters 49 and 50 in FIG. 6 completely correspond to companding A/D converters 39 and 41, and respective quantizing outputs appear at equal intervals of 16 between respective outputs for segment 4, for example, as shown in the output value (OUTPUT VALUE) in FIG. 7. Therefore, according to FIGS. 11A and 11 B, the output intervals of analog converting output $A_{out}$ can be divided into small steps which are ⅓ those of an ordinary D/A converter, and the number of output values thus becomes 3 times that of an ordinary D/A converter, by combining D/A converters 49 and 50.

In the above embodiment, the case of k3=⅔ is shown. However, for k3=½, calculations similar to those of aforementioned equations (3)–(8) are conducted, and the number of output values from analog converting output $A_{out}$ are double and are equal to those of a 9-bit companding D/A converter, although an 8-bit companding D/A converter is adopted.

For k3=¾, the number of output values becomes 4 times, and is equivalent to a 10-bit companding D/A converter, although an 8-bit companding D/A converter is adopted.

Figure 2:
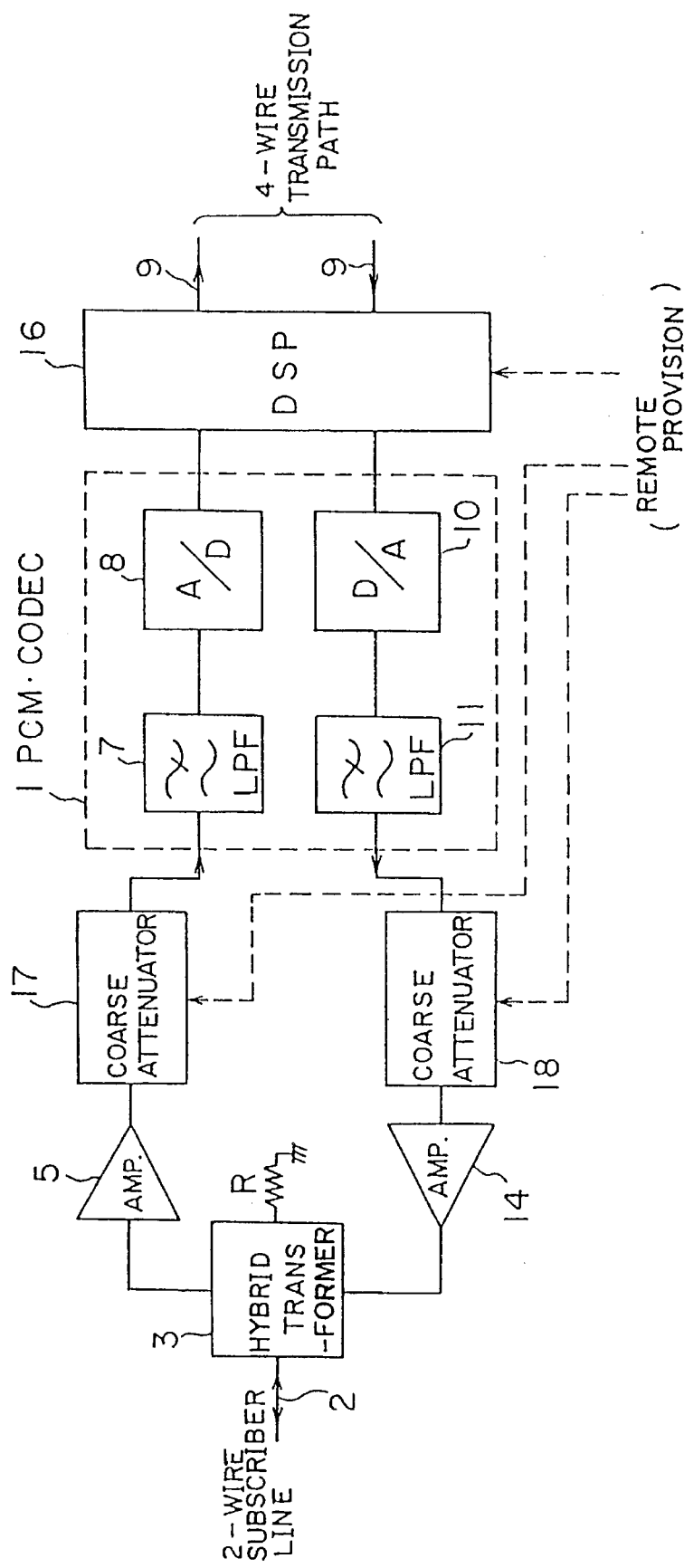
FIG. 2 shows a structural view of the example which is generally used for a digital PCM channel apparatus.
Figure 12:
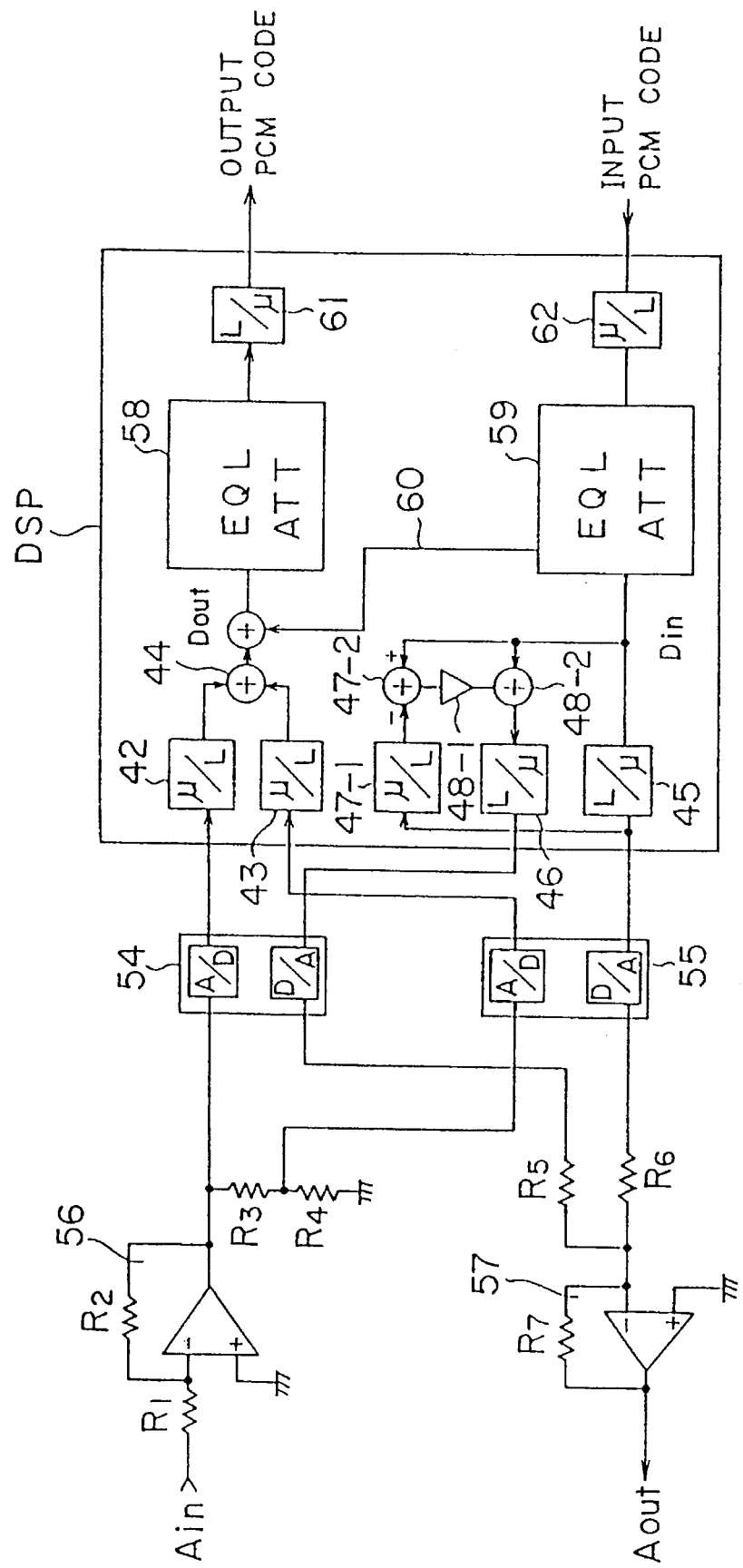
FIG. 12 is a detailed block diagram of a preferred structure of an A/D and D/A conversion apparatus according to the first embodiment.

FIG. 12 shows a detailed circuit diagram of the preferred structure of the A/D and D/A converting apparatuses according to the present invention. The preferred structure can be constructed by using two sets comprising a commercially available DSP, a commercially available PCM.CODEC, and a few other elements. According to this structure, a practical, high-resolution A/D and D/A converter apparatus can be realized by merely adding an inexpensive and commercially available PCM.CODEC. This can be done more efficiently than when a high resolution A/D and D/A converting apparatus is constructed using the aforementioned FIG. 2 structure. A hybridtrans, amplifier and coarse attenuator are omitted as shown in FIG. 12.

In FIG. 12, two companding A/D converters 39 and 41, as in FIG. 5, and two companding D/A converters 49 and 50, as in FIG. 6, are provided by two companding A/D converters and two companding D/A converters being installed in first PCM.CODEC 54 and second PCM.CODEC 55 in which a pair of A/D and D/A converters is integrated. In FIG. 12, arithmetic operation amplifier 56 provides an amplification ratio k1 (FIG. 5) by using resistors $R_1$ and $R_2$ (k1=$R_2/R_1$) and resistors $R_3$ and $R_4$ in the next stage form an amplifier ratio k2 (FIG. 5). If k1 and k2 are k and 1/k, respectively, as described above, $k \cdot R_3/(R_3+R_4)=1k$, thereby determining the values of $R_3$ and $R_4$.

A similar analysis will be applied to an arithmetic operation amplifier 57 of a D/A converting system and an amplification ratio k3 (FIG. 6) is determined as $R_7/R_6$, and k5 is determined as $R_7/R_5$. Thus, analog conversion output $A_{out}$ is obtained from {($R_7/R_6$)×A1}+{($R_7/R_5$)×A2} (A1 and A2 are recited in FIG. 6). In the previous example, it is assumed that k3=⅔ and k5=⅓, and in this example, it is determined that $R_6=1.5R_7$ and $R_5=3R_7$.

The DSP comprises the above recited first and second linear converting units 42 and 43, an arithmetic operation unit 44 (which calculates the average level) in FIG. 5, tile first and second companding converting units 45 and 46, linear converting unit 47-1 , subtracting unit 47-2, amplifying unit 48-1 and adding unit 48-2 as shown in FIG. 6. Line 60 in FIG. 12 is a leak cancelling line for preventing signals from leaking into a line in a 2-wire–4-wire converter (hybrid trans), not shown in FIG. 12. DSP function units 58 and 59 respectively comprise a function of an equalizer (EQL) and a function of an attenuator (ATT), for example. These lines, connected to DSP function units 58 and 59, are respectively connected to linear/μ converting unit (L/μ) 61 and μ/linear converting unit (μ/L) 62, and are thus, connected to a transmission path.

As explained above, the first embodiment provides A/D and D/A conversion apparatuses which combine an A/D and a D/A converter with a DSP, and the high resolution input and output of an A/D and D/A converter which is required by a DSP can be achieved by merely adding inexpensive amplifiers (amplifiers 38 and 40 in FIG. 5 and amplifiers 51 and 52 in FIG. 6) by utilizing an arithmetic operation function of the DSP without modifying the A/D and D/A converters.

The Second Embodiment

Next, the second embodiment of this invention will be explained. The present embodiment is characterized as a clock of a digital signal processed within a DSP changed, for example, from the first clock (receiving clock) to the second clock (transmitting clock) with signals kept in digital form.

Figure 13A:
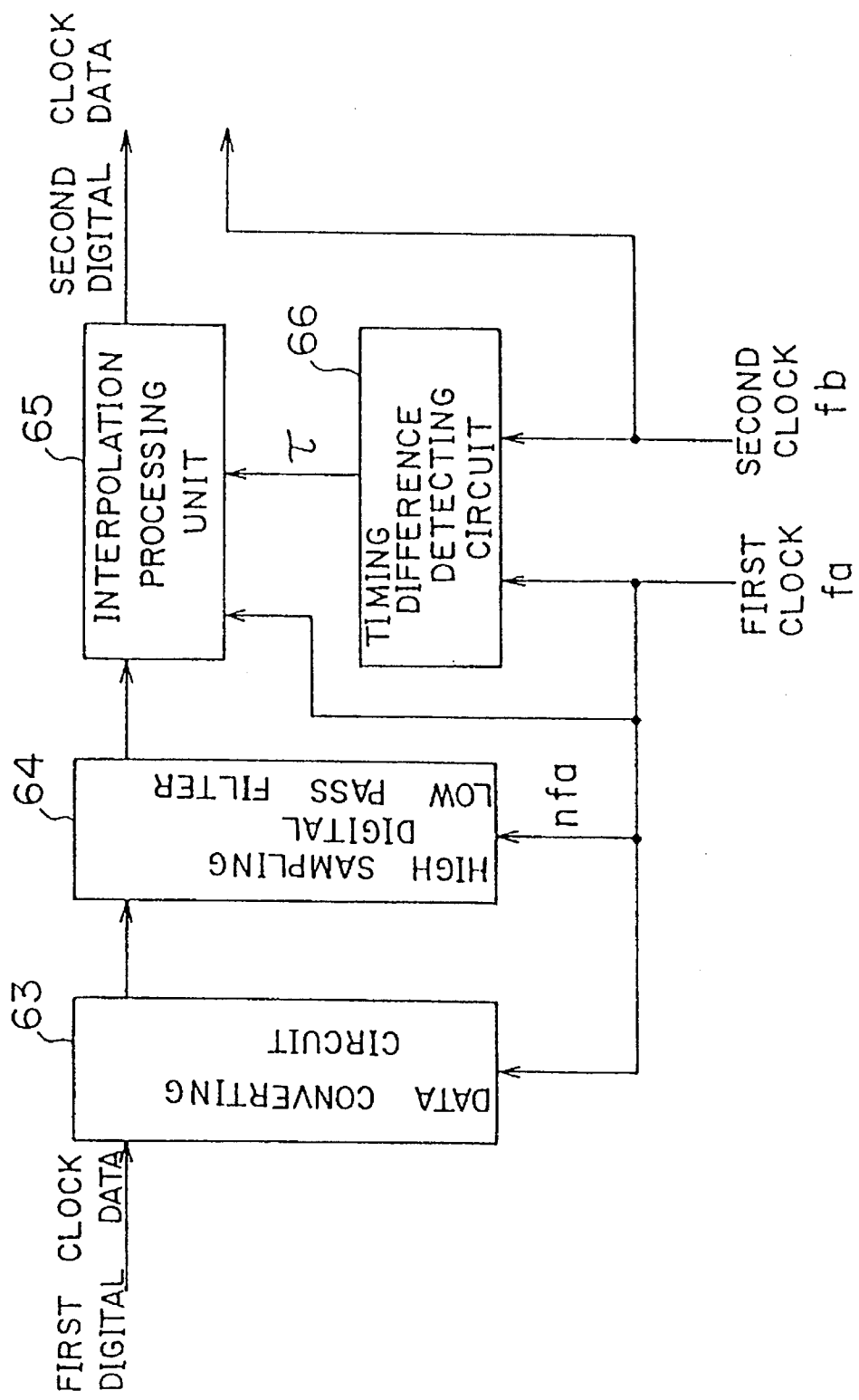
FIGS. 13A and 13B show views of basic structures of clock changing apparatuses according to the second embodiment.
Figure 13B:
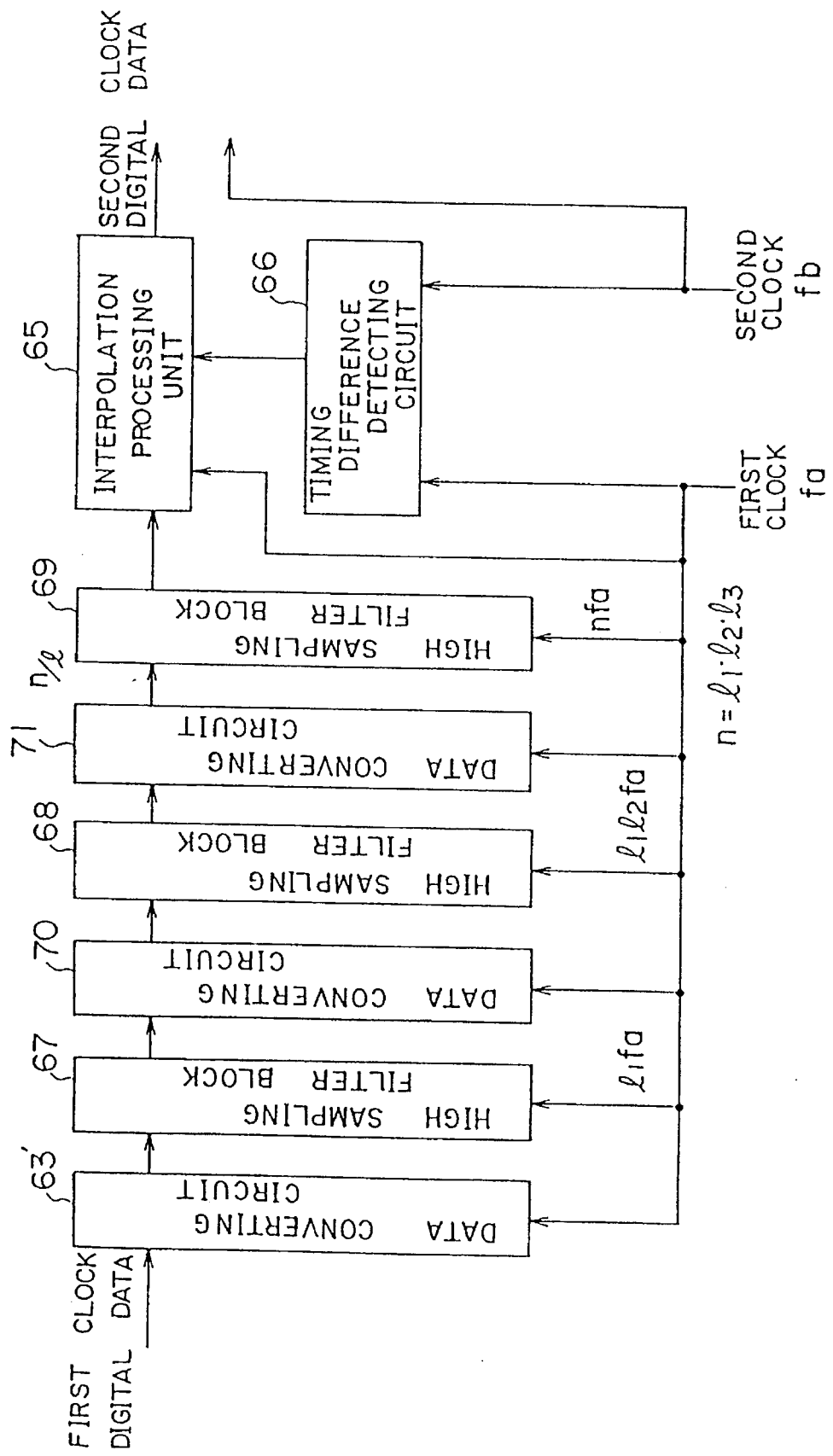

FIGS. 13A and 13B are basic block diagrams of the second embodiment of the present invention. FIG. 13A uses a high-sampling digital low pass filter and FIG. 13B uses a high-sampling digital low pass filter which is divided into a plurality of blocks.

As shown in FIG. 13A, data strings of the first clock pass data converting circuit 63, and the number of data per unit time is n (n>1, and is an integer) times the original data. The output of converting circuit 63 is input to interpolation processing unit 65 through high-sampling digital low pass filter 64 which operates at a sampling rate or speed n times that of the first clock.

Interpolation processing unit 65 forms and outputs conversion data synchronized with the second clock by using an interpolation method, based on timing difference τ between the first and second clocks. The timing difference is detected by timing difference detection circuit 66.

As shown in FIG. 13B, high-sampling digital low pass filter 64 (FIG. 13A), which operates at a sampling speed n times that of the first clock, is divided into a plurality of blocks 67, 68 and 69. The ratio of the sampling speed between adjacent blocks is made an integer, and the last stage block 69 operates at a sampling speed n times that of the first clock, and the sum of the loss characteristics of respective blocks 67, 68 and 69 is made the same as that of the original filter 64 of FIG. 13A.

Data conversion circuits 70 and 71 for outputting the same amplitude data whose number is equal to the ratio ($l_2, l_3$) of the sampling speed between adjacent blocks with regard to one item of input data are provided between respective blocks of a high-sampling filter. Data conversion circuit 63' to which the first clock data trains are input, is set to produce the same amplitude data whose number is equal to the ratio $l_1=n/l_2/l_3$ of the sampling speed of the first stage block 67 to that of the first clock per unit time, as compared with the number of original data. This will be explained later.

In FIG. 13B, where the sampling rate of the first stage block 67 is the same as the rate of the first clock, namely, fa ($l_1=1$), then data conversion circuit 63' is not necessary.

Figure 14C:
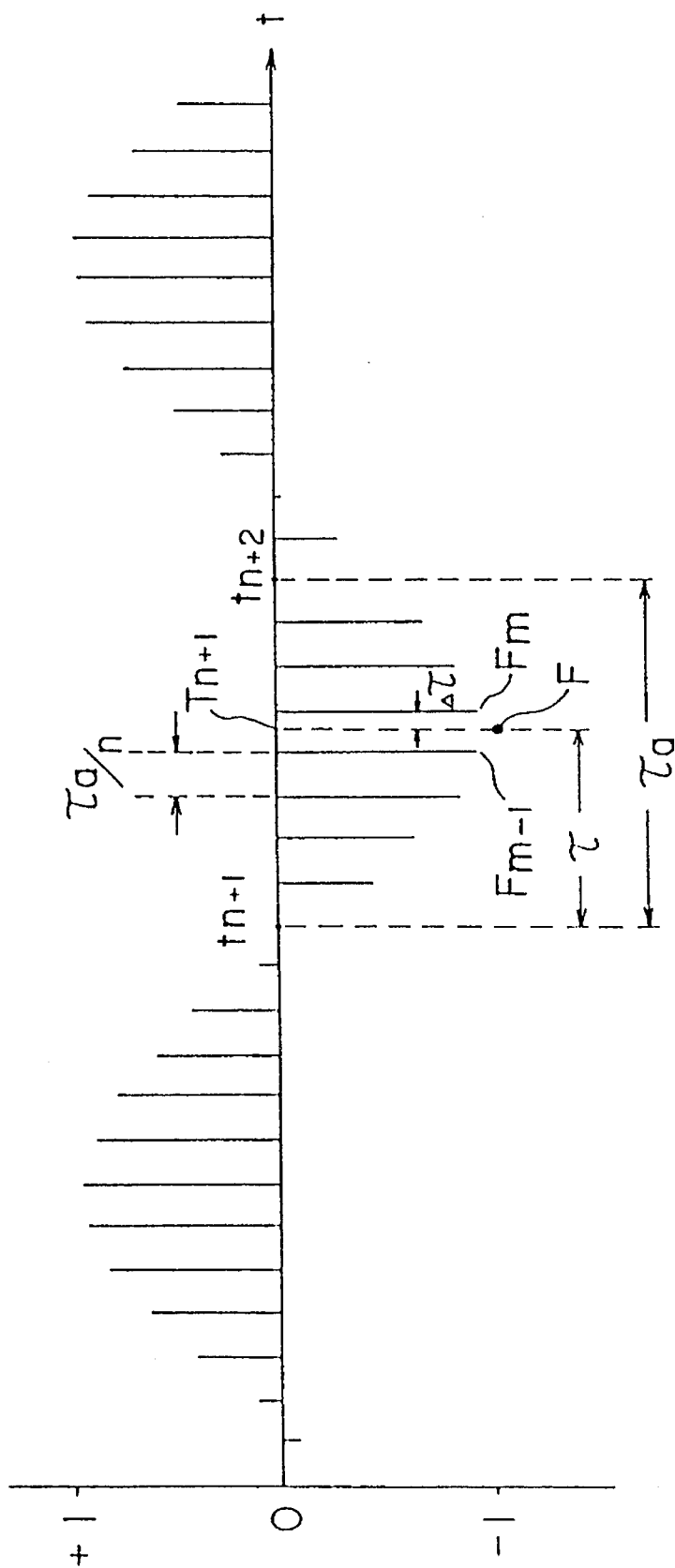

The general operation of the above basic structure will be explained. FIGS. 14A to 14C are time charts of a waveform of various portions of FIG. 13A.

Hereinafter, the frequencies of the first clock and the second clock will be designated as 8 KHz.

In FIG. 13A, data conversion circuit 63 receives data values $S_n$, $S_{n+2}$, $S_{n+1}$, $S_{n+3}$, ... of a sine wave of, 3.004 KHz ,for example, at time of the first clock $t_n$, $t_{n+1}$, $t_{n+2}$, $t_{n+3}$, ... as shown in FIG. 14A. The number of data per unit time is n times, for example, 8 times, that of the original data as shown in FIG. 14B. Then, the output of data conversion circuit 63 is applied to high-sampling digital low pass filter 64 which operates at a sampling speed of 64 KHz, which is 8 times faster than the first clock. A cut frequency of the filter 64 is the same as that allowed for the data system train of the first clock and is (8/2)KHz=4 KHz for voice signals. Therefore, the above filter 64 produces such a signal as shown in FIG. 14C.

The time interval of these signal trains becomes ⅛ those of the signal synchronized with the first clock.

Even if we try to obtain the data values at the time of the second clock $T_{n-1}$, $T_n$, $T_{n+1}$, $T_{n+2}$, $T_{n+3}$, ... by using respective data values $S_n$, $S_{n+1}$, $S_{n+2}$, $S_{n+3}$, ... at the times of the first clock $t_n$, $t_{n+1}$, $t_{n+2}$, $t_{n+3}$, ... by Lagrange's interpolation method, the time intervals between respective data are wide and the variations of the data values are large. Thus, the data values at the time of the second clock $T_{n-1}$, $T_n$ ... are difficult to obtain. If the time interval of the first clock is made ⅛, that of the signal synchronized with the first clock, as shown in this embodiment, the time interval between respective data becomes narrow. This decreases the variation in data values within a time interval between two timings, for example, between adjacent timings, and enables the data values at the time of the second clock, $T_{n-1}$, $T_n$, $T_{n+1}$, $T_{n+2}$, $T_{n+3}$, ... to be obtained.

As shown in FIG. 14C, the timing difference τ between the first and second clocks is obtained by timing difference detection circuit 66, and is input to interpolation processing unit 65. Interpolation processing unit 65 can obtain the data value F at a time of the second clock $T_{n+1}$ by using a period $\tau_a$ of the first clock, the difference Δτ between the time of the second clock $T_{n+1}$ and the ⅛ time interval which exceeds the time $T_{n+1}$, and the data values $F_{m-1}$ and $F_m$ of the ⅛ time intervals at both sides of the time of the second clock $T_{n+1}$, and also using the following Lagrange's interpolation formula, $$F=[F_m\{(\tau_a/n-\Delta\tau)+F_{m-1}\cdot\Delta\tau\}\div(\tau_a n)].$$

As described above, the data values F at times of the second clock $T_{n-1}$, $T_n$, $T_{n+1}$, $T_{n+2}$, $T_{n+3}$, ... are produced as digital data values at the second clock.

According to the above approach, a digital signal is not converted to an analog signal. Thus, a quantizing noise is not produced and the apparatus is subject to all digital processings, thereby being miniaturized as an integral circuit.

A high sampling digital low pass filter 64 of FIG. 13A operates at a repetition frequency of 8 times the sampling frequency of the original data. More specifically, as 8 data are input and 8 data are output during a repetition period of a sampling frequency of the original data, the amount of processing becomes 8 times that achieved when it operates at the sampling frequency of the original data.

If the order or degree of the high-sampling digital low pass filter 64 is 6 and the order of the delay equalizer for suppressing the group delay distortion occurring in the filter is 2, thereby totally providing the 8 order filter, the equivalent order number in respect of a processing amount is 64.

A digital filter performs one calculation of a following difference equation with regard to every second order.

$$y_n=a\cdot x_n+b\cdot x_{n-1}+c\cdot x_{n-2}-d\cdot y_{n-1}-e\cdot y_{n-2}$$

Thus, the number of a multiplication is 5 per period and 160 per period in the 64th order. Therefore, other programs are performed by the digital signal processor (DSP) in processes of more than 220 steps including a data conversion processing.

Even if a high speed digital signal processing unit in which the processing time per step is 100 ns, only 1250 steps at maximum can be used when the period is 125 μs (8 KHz). If 220 steps selected from among these 1250 steps are assigned to a filter calculation in the clock changing method, a distribution of time to other processings decreases. Thus, it is not preferred.

Therefore, as shown in FIG. 13B, the filter is divided into a plurality of blocks and a process which can be performed at a relatively low sampling speed is processed by a filter of a low sampling speed, and the amount of processing may be greatly reduced.

A process in a delay equalizer is related to a pass band, and a frequency delay of more than the cutoff frequency region, for example 4 KHz, need not be considered. It can be conducted by filter block 67 which operates at the sampling speed of the original data 8 KHz.

Next, the cutoff of frequency component from 4 KHz to 8 KHz is performed by filter block 68 which operates at a sampling speed of 16 KHz. A cutoff of a frequency component from 8 KHz to 32 KHz is performed by filter block 69 in the last stage which operates at the same sampling speed, 64 KHz, as that of the high-sampling digital low pass filter 64 of FIG. 13A.

In this example, the sampling speed of the first stage block 67 is the same as that of the first clock, and data conversion circuit 63' is not necessary.

Data conversion circuit 70 is for outputting two data of the same amplitude regarding input data on the input side of filter block 68. Data conversion circuit 71 is for outputting four data of the same amplitude regarding one item of input data on the input side of filter block 69.

As constructed in the manner described above, respective blocks 67 and 69, having sampling frequencies of 8 KHz and 64 KHz, are formed of a filter of the second order, and block 68, having a sampling frequency of 16 KHz, is constructed of a filter of the fourth order. Then, the total number of multiplications per period becomes 5×1+5×2×2+5×2×4=65. From the relationship of the order ratio with the sampling ratio, the number of multiplications for each second order is 5. This greatly reduces the amount of calculation.

In the apparatus constructed as shown in FIG. 13B, described above, the number of output data from filter block 69 is 8 times the original data and is the same as that of the filter of FIG. 13A. The interpolation processing unit 65 can perform a change from the first clock to the second clock in the manner shown in FIG. 13A.

The structure and operation of respective parts of FIGS. 13A and 13B will now be explained in detail.

Figure 15:
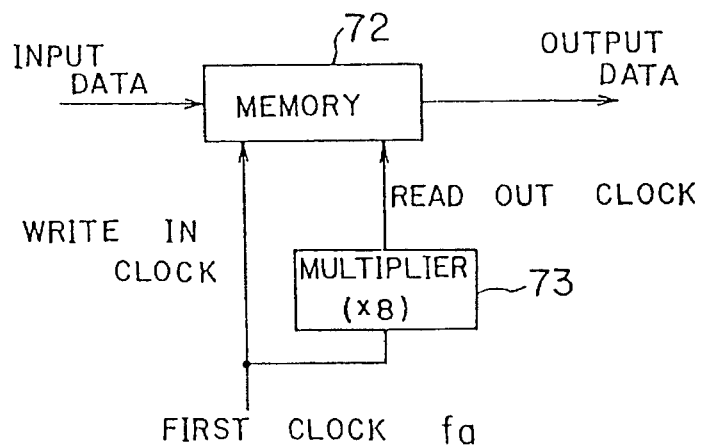
FIG. 15 is a block diagram of a digital conversion circuit.
Figure 16:
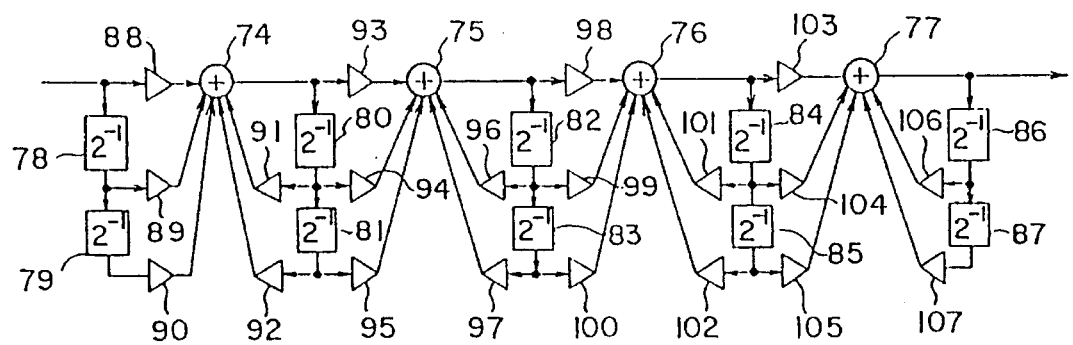
FIG. 16 is a block diagram of a high-sampling digital low pass filter.
Figure 17:
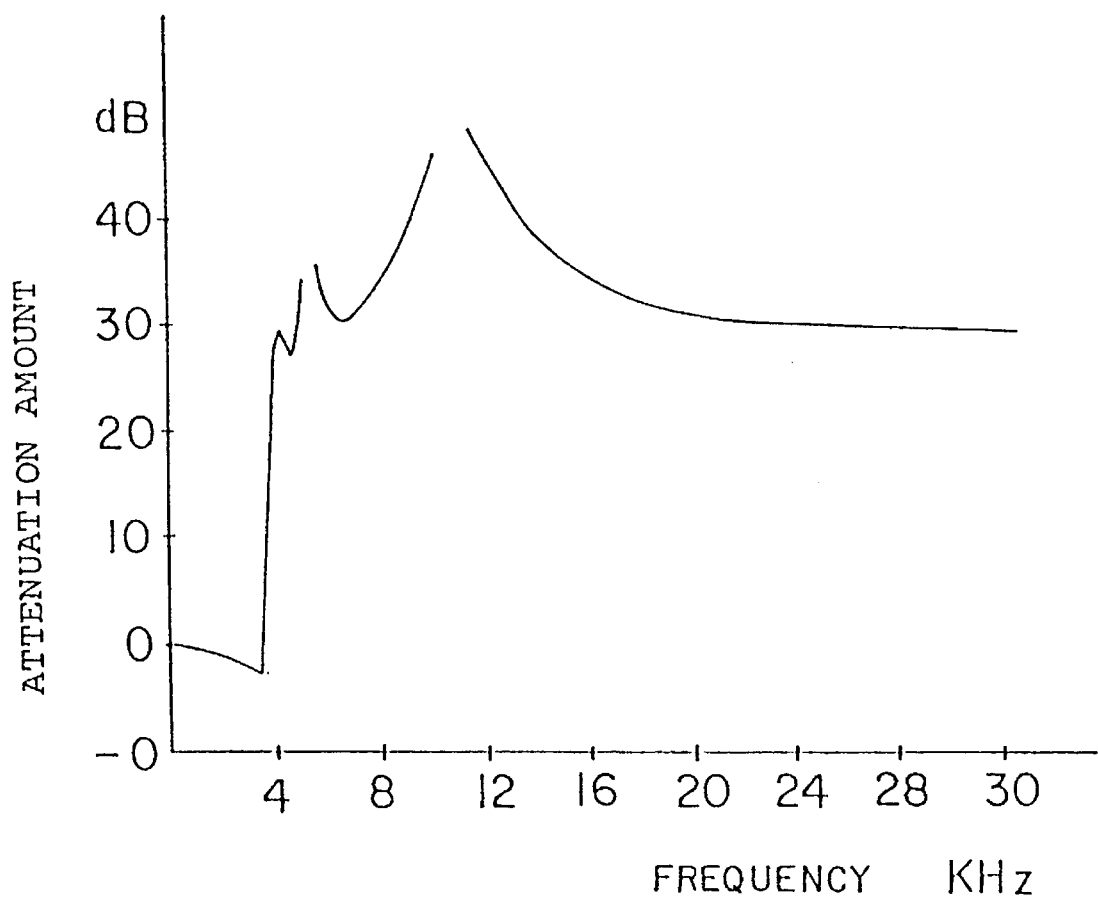
FIG. 17 shows the characteristics of an attenuation amount of the filter shown in FIG. 16.
Figure 18:
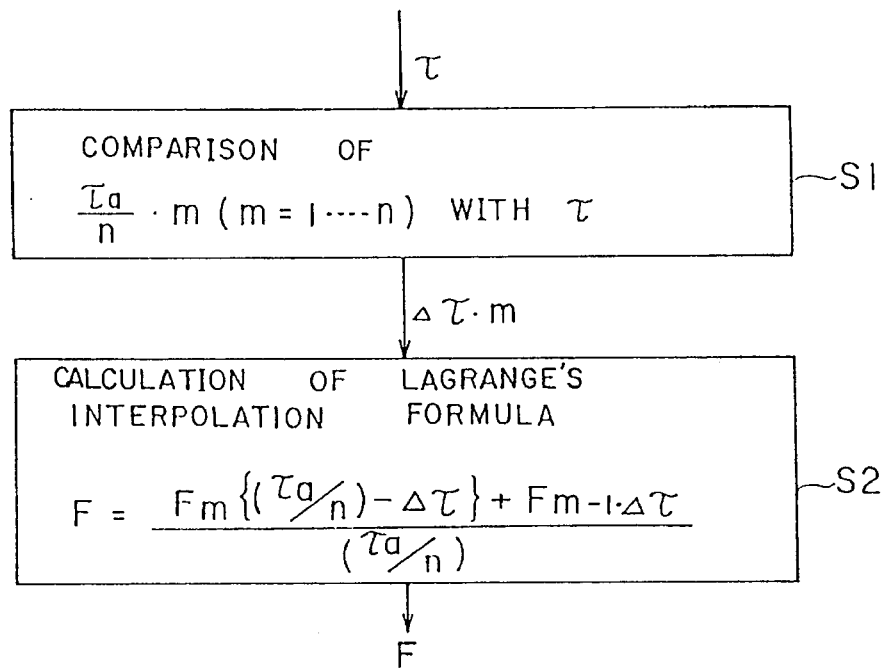
FIG. 18 is an operational flowchart of an interpolation processing unit.
Figure 19:
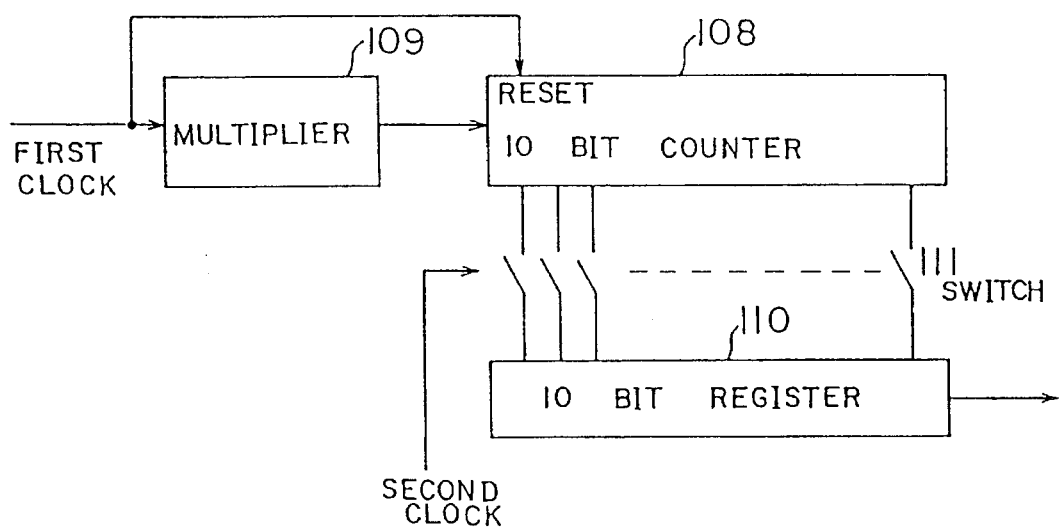
FIG. 19 is a block diagram of a timing difference detecting circuit.

FIG. 15 shows a block diagram of data conversion circuit 63 of FIG. 13A, FIG. 16 shows a block diagram of high-sampling digital low pass filter 64, FIG. 17 shows the amount of attenuation of the filter in FIG. 16, FIG. 18 shows a flow chart of a program of interpolation processing unit 65 shown in FIG. 13A, and FIG. 19 shows a principle block diagram of timing difference detection circuit 66.

In the respective figures, 72 is a memory, 73 and 109 multipliers, 108 a 10-bit counter, 110 a 10-bit register, 111 a switch, 74 to 77 adders, 78 to 87 data delay memories, and 88 to 107 coefficient multipliers.

The data conversion circuit in FIG. 15 produces the same data 8 times per period. It receives, for example, 16-bit amplitude data at intervals of, for example, 8 KHz, and writes them in memory 72 in synchronization with the first clock, and produces the data 8 times per period by using a read clock obtained by modifying the first clock 8 times, using multiplier 73.

FIG. 16 shows an example of a high-sampling digital low-pass filter having a cut-off frequency of 3.8 KHz and comprising four sections, each containing a two-order digital filter. Six orders of the above filter construction cut off the frequency in the 4 to 60 KHz band. The other 2 orders form a delay equalizer for equalizing group delay time distortion. The whole filter operates at a sampling speed of 64 KHz and performs 8 filter calculations per period of 8 KHz.

The attenuation characteristic is shown in FIG. 17. The gain at around 3.4 KHz is 2–3 dB because the RZ/NRZ correction is performed at this point, as an input signal is subjected to NRZ processing.

The filter may be a large scale transversal filter.

An interpolation processing is shown in the operation flow chart of FIG. 18. When, for example, the same data is input 8 times for $\tau_a$ (as shown in FIG. 14C) at a period of first clock, m of $\tau_a \cdot m/8$ (m=1 to 8) is sequentially increased from 1 at step S1 by comparing time difference $\tau$ between the first clock and the second clock. When the sign of $\Delta\tau=\tau_a \cdot m/8-\tau$ becomes positive, the comparison processing is stopped, and the difference $\Delta\tau$ between time $T_{n+1}$ of the second clock and the time of ⅛ time interval which exceeds $T_{n+1}$, and the value of m are obtained. In FIG. 14C, it is understood that m=5.

At step S2, the data value F of time $T_{n+1}$ of the second clock is obtained from data values $F_{m-1}$ and Fm when m=4 and m=5, based on the following Lagrange interpolation formula, $$F=[Fm\{(\tau_a/n)-\Delta\tau\}+F_{m-1}\cdot\Delta\tau]\div(\tau_a/n).$$

As described above, the data value can be obtained at the time of the second clock $T_{n-1}$, $T_n$, $T_{n+1}$, $T_{n+2}$, $T_{n+3}$, . . . as shown in FIG. 14A.

FIG. 19 shows the basic structure of the time difference detecting circuit. The embodiment will be explained in detail by referring to the third and fourth embodiments.

The time difference detecting circuit of FIG. 19 multiplies the first clock by $2^{10}$ using multiplier 109. To provide input data to 10-bit counter 1 08, it is reset at a rise of the first clock. Thus, its count value shows a position in time obtained by equally dividing the period of the first clock by $2^{10}$=1024. Thus if the count value is, for example, 512, the time is shown to be exactly in the middle of the first clock.

Therefore, at a timing of the second clock, switch 111 is turned on to obtain the value of counter 108 into 10-bit register 110, and to thereby obtain time difference $\tau$ between the first clock and the second clock, at a resolution obtained by dividing a period by 1024.

The clock changing method of the present invention applied to the PCM channel apparatus shown in FIG. 12 is now explained.

Figure 3:
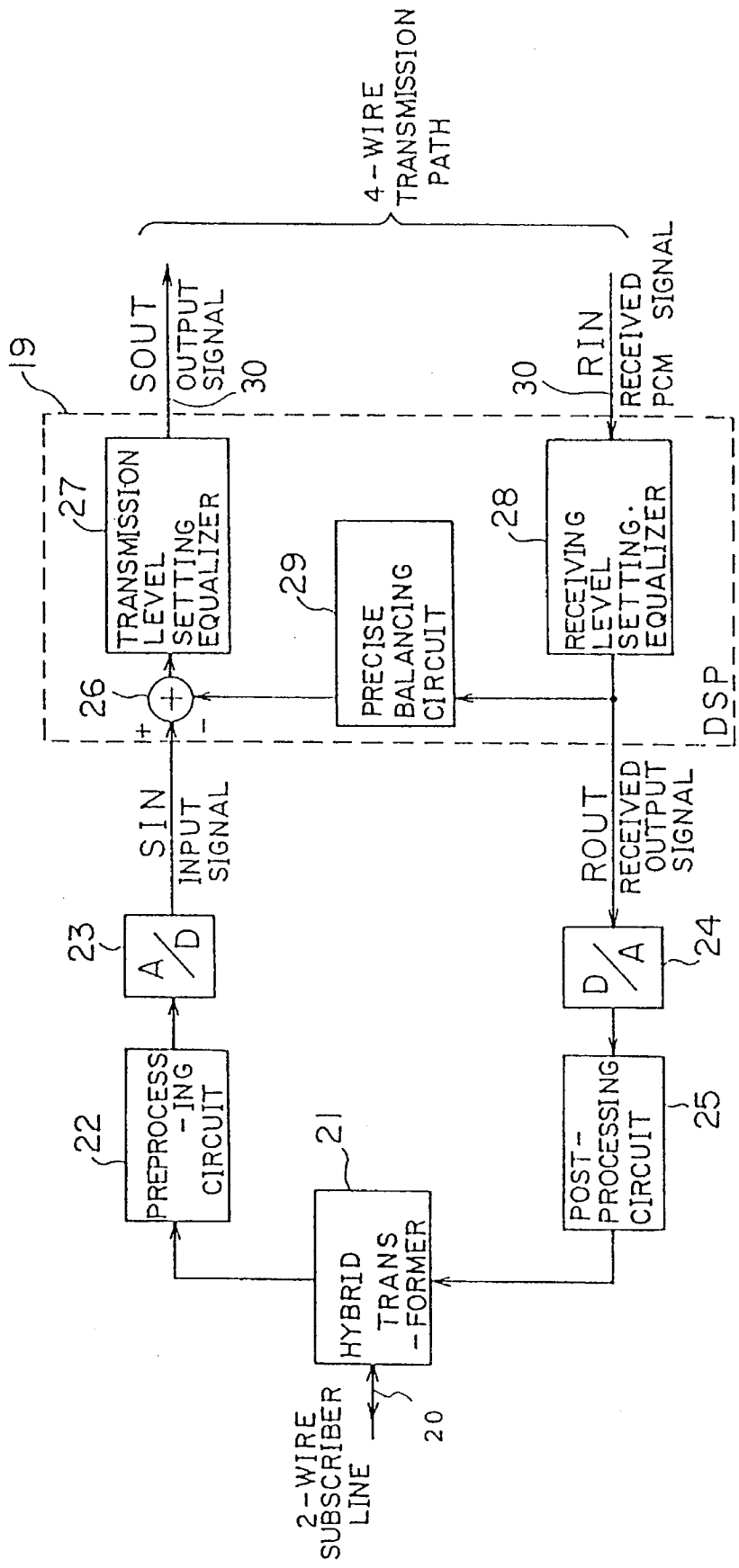
FIG. 3 shows a structural view of the example which is generally used for a digital PCM channel apparatus.
Figure 20:
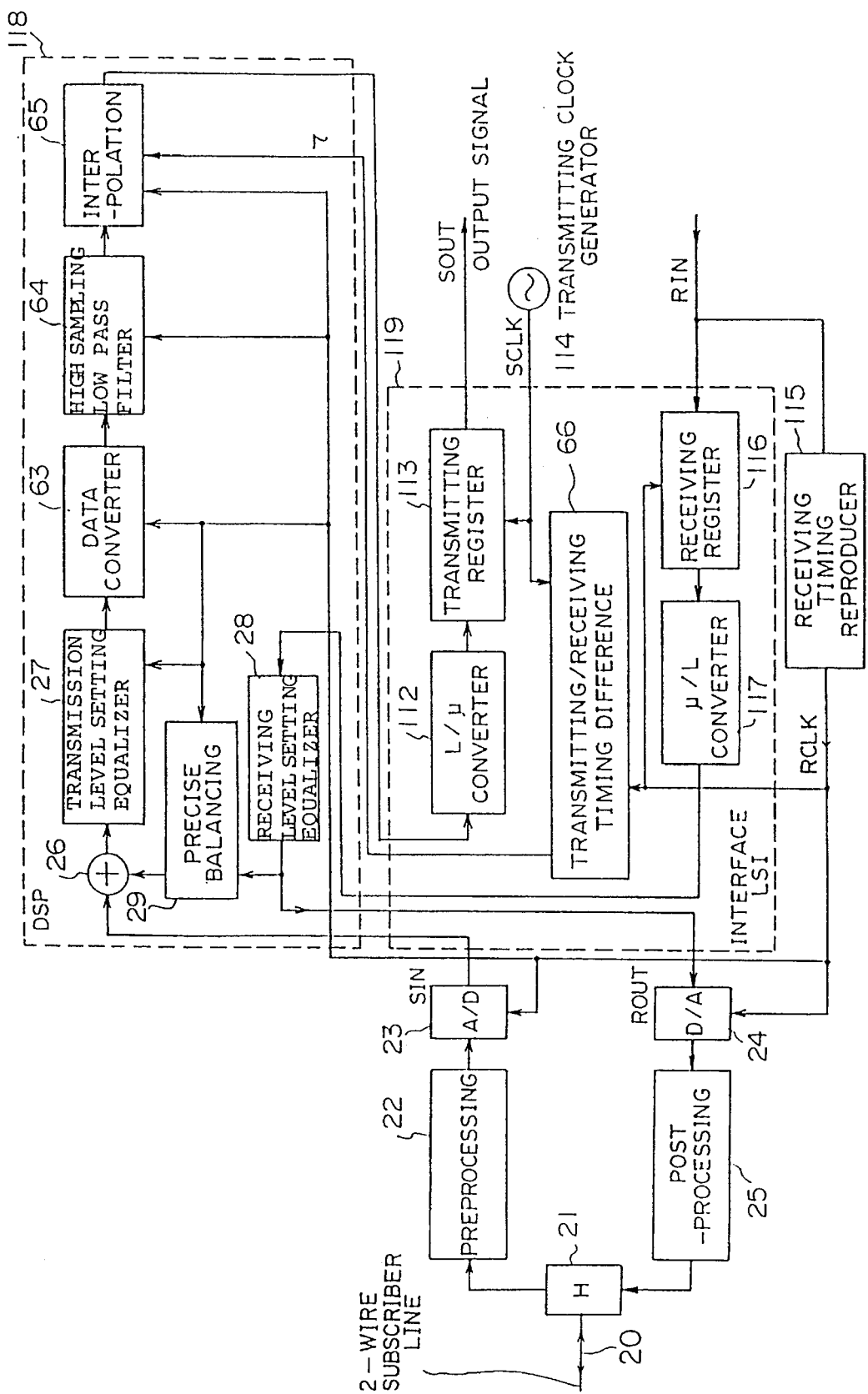
FIG. 20 is a detailed block diagram of a digital PCM channel apparatus according to the second embodiment.

FIG. 20 shows a block diagram of a digital PCM channel apparatus based on the second embodiment. Parts designated by the same reference numbers as those in the prior art device shown in FIG. 3 and the base structure of the second embodiment shown in FIG. 13A perform the same functions.

In FIG. 20, receiving clock RCLK reproduced by receiving timing reproducing circuit 115 from receiving PCM signal RIN, and transmitting clock SCLK produced by transmitting clock generator 114 of its own station, exist as a clock timing. Receiving clock RCLK is input to receiving register 116, D/A converter 24, A/D converter 23, digital signal processor (DSP) 118 and transmitting and receiving timing difference detecting circuit 66, and most of the functions operate based on receiving clock RCLK. On the other hand, transmitting clock SCLK is input to transmitting register 113 and transmitting and receiving timing difference detecting circuit 66.

Therefore, in the circuit of FIG. 20, input signal SIN from a subscriber is picked up by receiving clock RCLK, and receiving PCM signal RIN from the other station is written into receiving register 116. The receiving PCM signal RIN is read out by receiving clock RCLK and is converted from a PCM signal of a μ-law companding rule to 16-bit linear data, for example, by μ/L converter 117, and is input to receiving level setting equalizer 28. Transmitting level setting equalizer 27 on the transmitting side and receiving level setting equalizer 28 on the receiving side perform respective corresponding processes. Precision balancing circuit 29 bridging transmitting and receiving system performs a process on receiving clock RCLK, thereby preventing the aforementioned problem from being produced by a clock shift.

Output signal SOUT should be output at a timing of transmitting clock SCLK. Thus, the above recited clock changing process is conducted by the above recited data conversion circuit 63, high sampling digital low pass filter 64, interpolation processing unit 65 and (transmitting and receiving) timing difference detecting circuit 66 with regard to an output data system of transmitting level setting equalizer 27. The signal is thus converted so that it has an amplitude data whose timing matches that of transmitting clock SCLK. It is then converted from a linear signal to a PCM signal according to a μ-law companding rule by L/μ converter 112, and written into a transmitting register. Data are read out from transmitting clock SCLK, and transmitted in a jitter-free state to a multiplication unit, not shown, as output signal SOUT.

In the above construction, data conversion circuit 63, high sampling digital low pass filter 64, and interpolation processing unit 65 are digital, and can thus be integrated and miniaturized as digital signal processor (DSP) 118 together with other digital circuits. As (transmitting and receiving) timing difference detecting circuit 66 is also digital, it can be integrated and miniaturized as interface LSI119 together with other digital circuits. Obviously other methods may be used for dividing the circuit shown in FIG. 20 for the purpose of an integration. In FIG. 20, A/D converter 23 and D/A converter 24 are constructed normally and if they are constructed as shown in the first embodiment of FIG. 12, they provide a great effect.

Next, the structure of a circuit for dividing a high-sampling digital low pass filter into several sections to decrease the number of arithmetic operations will be explained in detail.

Figure 21:
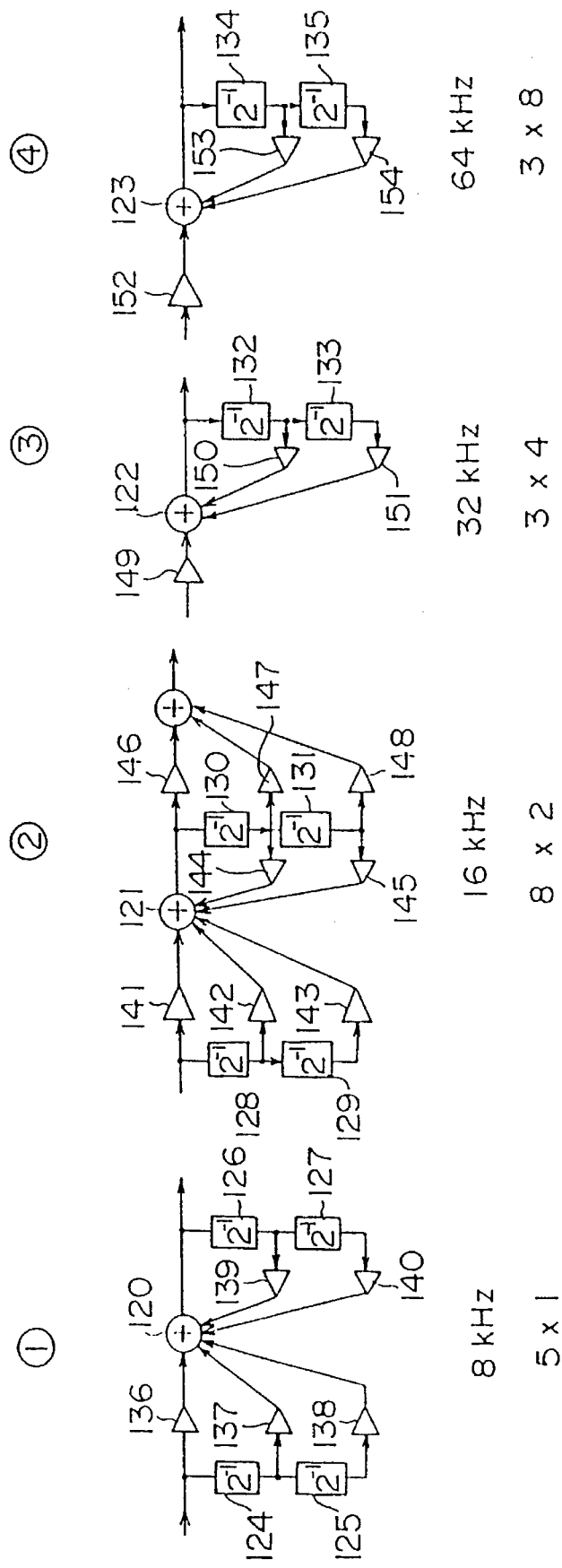
FIG. 21 is a block diagram of a high-sampling digital low-pass filter which is divided into a plurality of blocks.
Figure 22:
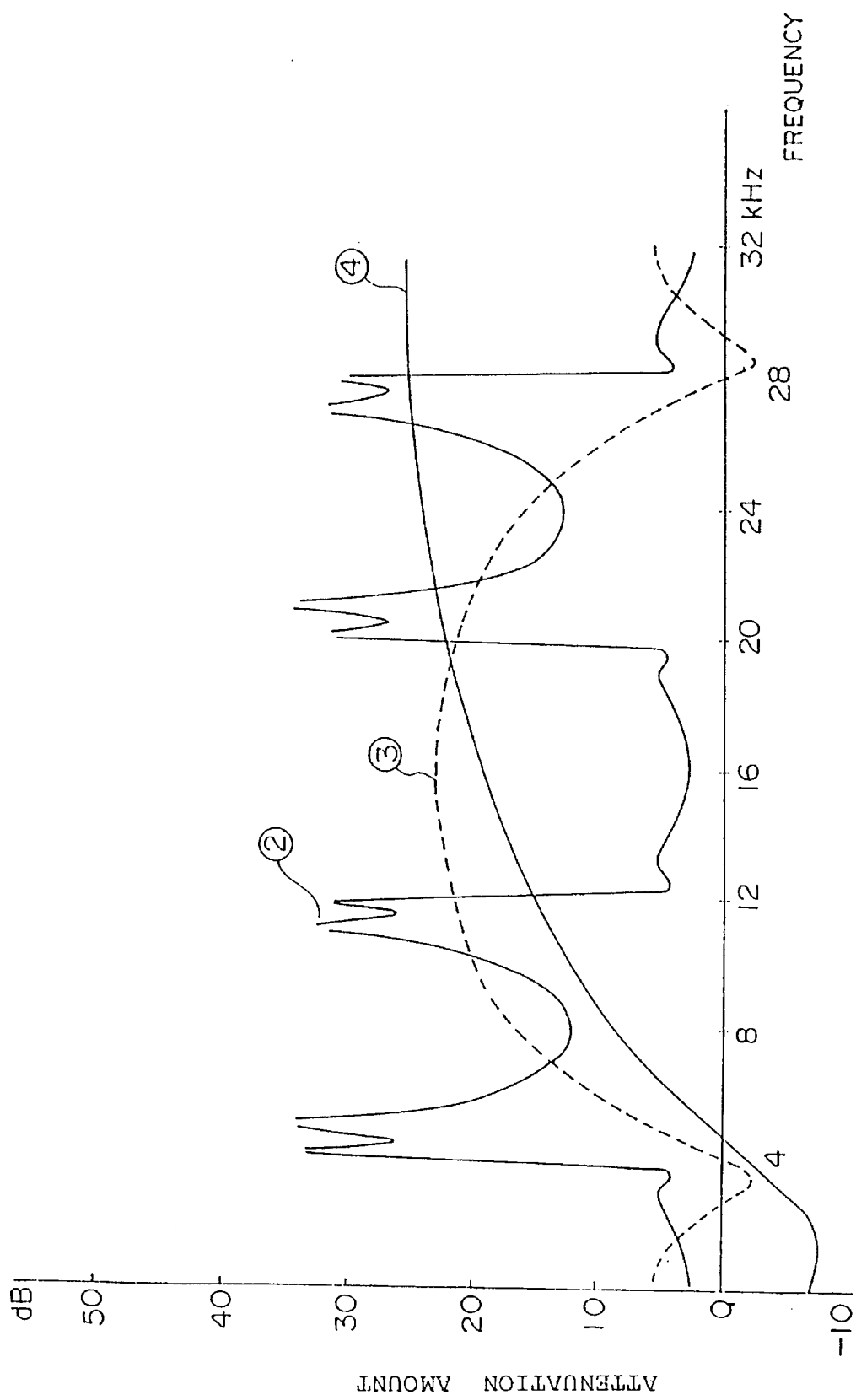
FIG. 22 shows characteristics of an attenuation amount of various sections in FIG. 21.
Figure 23:
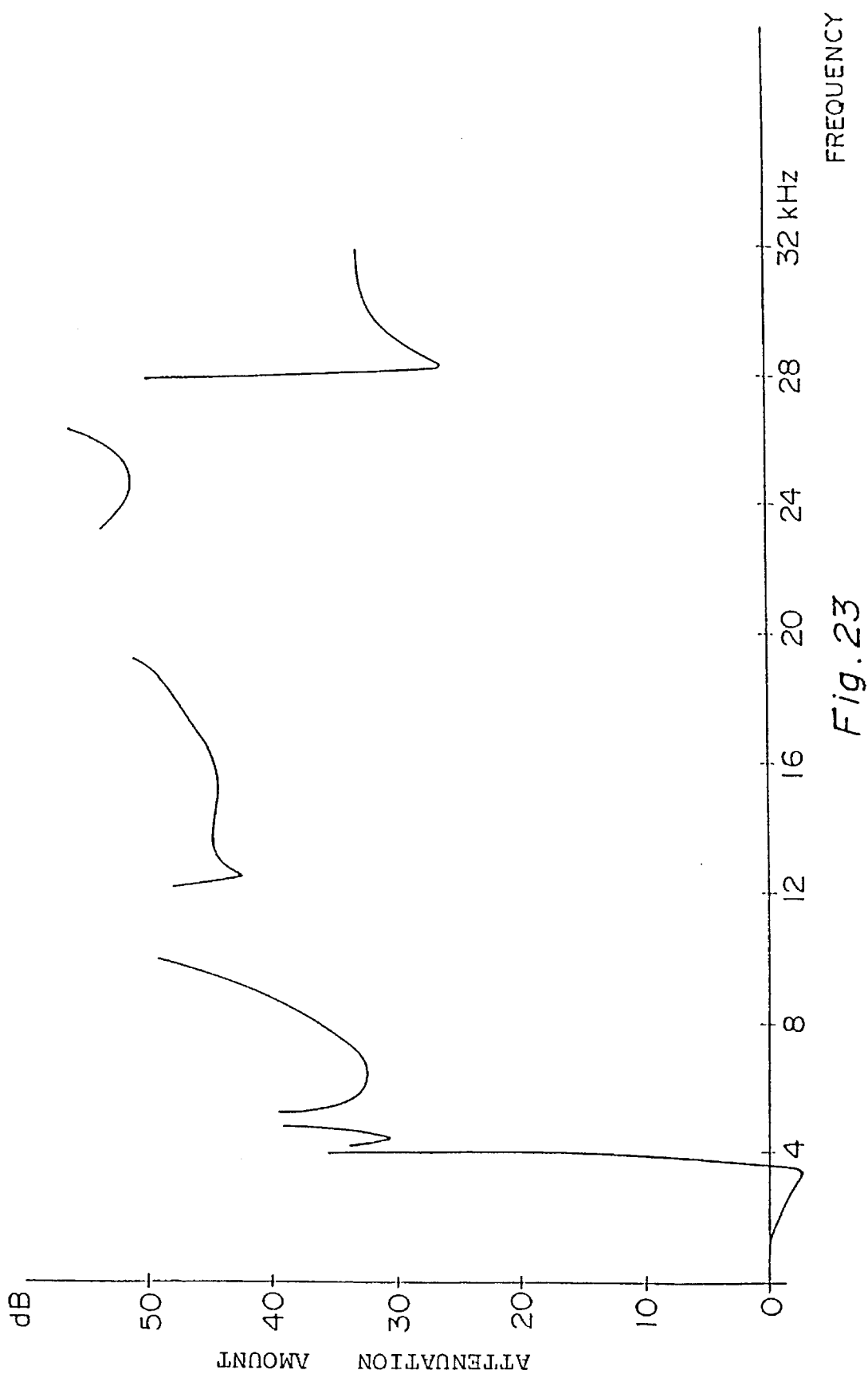
FIG. 23 shows characteristics of an attenuation amount of the whole filter shown in FIG. 21.

FIG. 21 shows the structure of the high-sampling digital blocks of FIG. 13B divided into several sections. FIG. 22 shows the amount of attenuation of respective sections shown in FIG. 21, where ②–④ correspond to filter blocks ②–④ in FIG. 21. FIG. 23 shows the whole attenuation amount of a filter of FIG. 21.

In FIG. 21, 120 to 123 designate adders, 124 to 135 data delay memories, and 136 to 154 coefficient multipliers.

Filter block ① in FIG. 21 is a delay equalizer and is related only to a passing band, and delay characteristics at a frequency higher than 4 KHz in the cutting-off range are not questioned. Thus, it operates at the sampling speed (8 KHz) of the original data, and the data conversion circuit (63' in FIG. 13B) is not required in the initial-stage.

Filter block ② cuts off frequency components from 4 KHz to 8 KHz and operates at a sampling speed of 16 KHz. In this case, the data conversion circuit (as shown in FIG. 13B) for outputting two pieces of the data of the same amplitude in response of one piece of input data, is required on the input side.

Filter block ③ cuts off frequency components from 8 KHz to 16 KHz and operates at a sampling speed of 32 KHz. In this case, the data conversion circuit (shown in FIG. 13B) for outputting two pieces of data of the same amplitude in response to one piece of input data, is also required on the input side.

Filter block ④ cuts off frequency components from 16 KHz to 32 KHz and operates at a sampling speed of 64 KHz. In this case also, the data conversion circuit for outputting two pieces of data of the same amplitude in response to one piece of input data is required on the input side.

The number of data output from filter block ④ is 8 times that of the original data for the filter shown in FIG. 16. Filter block ④ thereby performs a change from first clock to second clock using the interpolation processing unit (65 in FIG. 13B).

In this case, the number of multiplications per period in filter block ① is 5×1, as the number of coefficient multipliers is 5. The number of multiplications per period in filter block ② is 8×2 as the number of coefficient multipliers is 8 and the sampling speed is 16 KHz. The number of multiplications per period in filter block Q is 3×4, as the number of coefficient multipliers is 3 and the sampling speed is 32 KHz. The number of multiplications per period in filter block ④ is 3×8, as the number of coefficient multipliers is 3 and the sampling speed is 64 KHz. Thus the total number of multiplications per period is 57. It will be understood that this is much less than 160 in case of the filter shown in FIG. 16.

Figure 4:
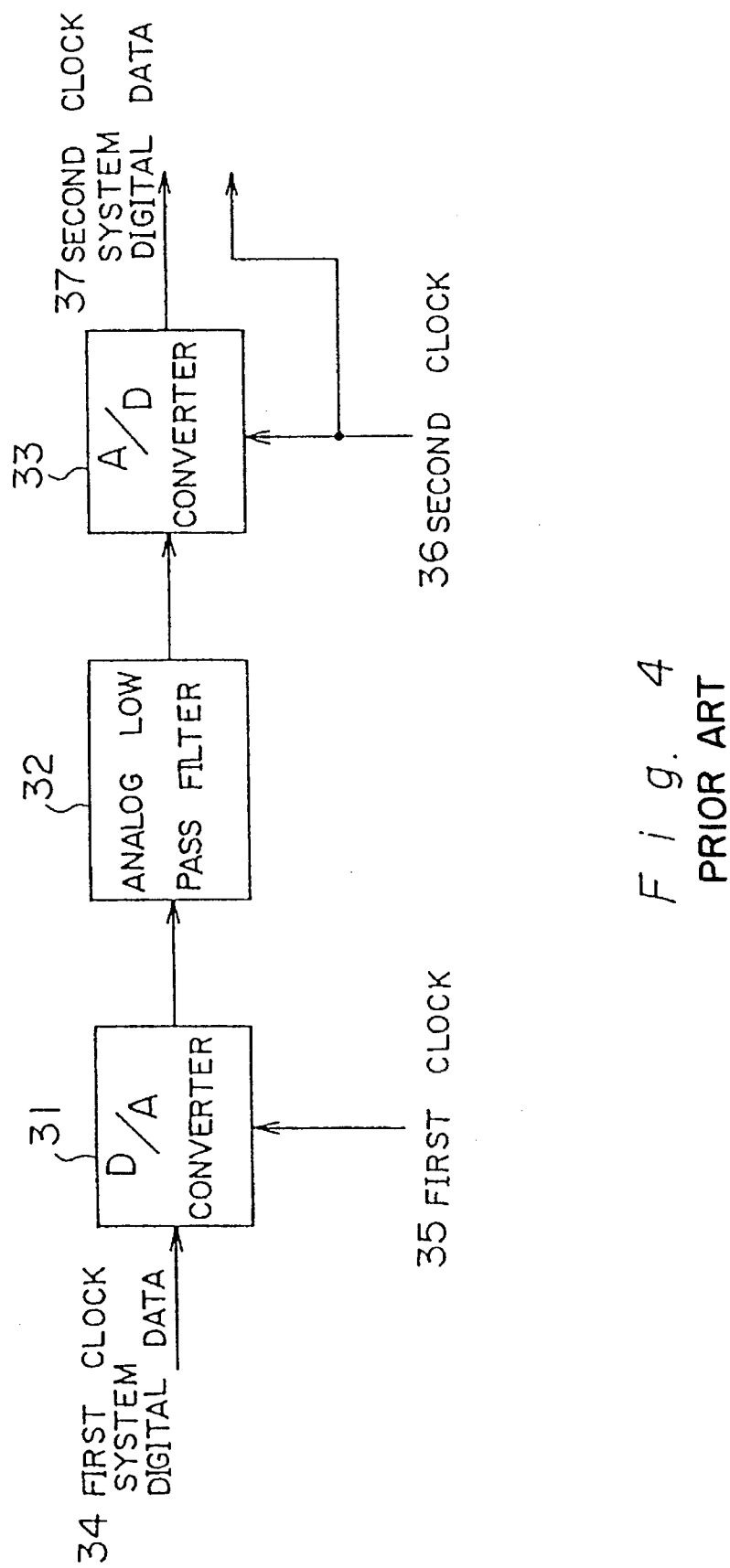
FIG. 4 shows a structural view of the conventional example of the clock changing apparatus.

As described above, in the second embodiment it is possible to change the data system trains of the first clock to the data system trains of the second clock using the digital form of data kept, thereby eliminating the quantizing noise which causes a problem in the prior art example shown in FIG. 4. In the present invention, communication quality is not lowered and this embodiment can be greatly miniaturized by integration.

This embodiment can be integrated and miniaturized together with other digital circuits, and is made inexpensive.

The Third Embodiment

The third embodiment will now be explained. This embodiment describes in detail timing difference detecting circuit 66, shown in FIGS. 13A and 20 in the second embodiment, and also describes the structure of transmitting register 113 shown in FIG. 20.

The present embodiment is based on the basic structure shown in FIG. 19. According to the principle shown in FIG. 19 and described above, a counter is made operative after 10-bit counter 108 is reset by the first clock (called receiving clock RCLK hereinafter). The content of the above counter is latched in 10-bit register 110 at the rising edge of the second clock (called transmitting clock SCLK hereinafter), thereby detecting a timing difference τ.

According to the above principle, when the above latch is conducted at a rising edge of transmitting clock SCLK, for example, a timing difference τ is produced. When τ is input to interpolation processing unit 65 (in FIG. 13A or FIG. 20) in signal processor 118, which operates according to receiving clock RCLK, the time is not constant from the viewpoint of signal processor 118. Specifically, the timing difference τ is input to the beginning or end of the interpolation process (shown in FIG. 18). Therefore, a buffer circuit is required for a time adjustment.

When the period of transmitting clock SCLK is slightly shorter than that of receiving clock RCLK, the timing difference has to be detected twice during a period of RCLK. Conversely, when the period of RCLK is slightly shorter than that of SCLK, the rising edge of SCLK does not occur within the period of RCLK.

When the period of transmitting clock SCLK is slightly shifted from that of receiving clock RCLK, three cases may exist in which the number of input data per period is 0, 1, and 2. In addition, the time of occurrence of the input data is not constant. Therefore, a buffer circuit is required between transmitting and receiving timing difference detecting circuit 66 and signal processor 118. The present embodiment discloses a detailed circuit for transmitting and receiving timing difference detecting circuit 66, including a buffer circuit.

Figure 24:
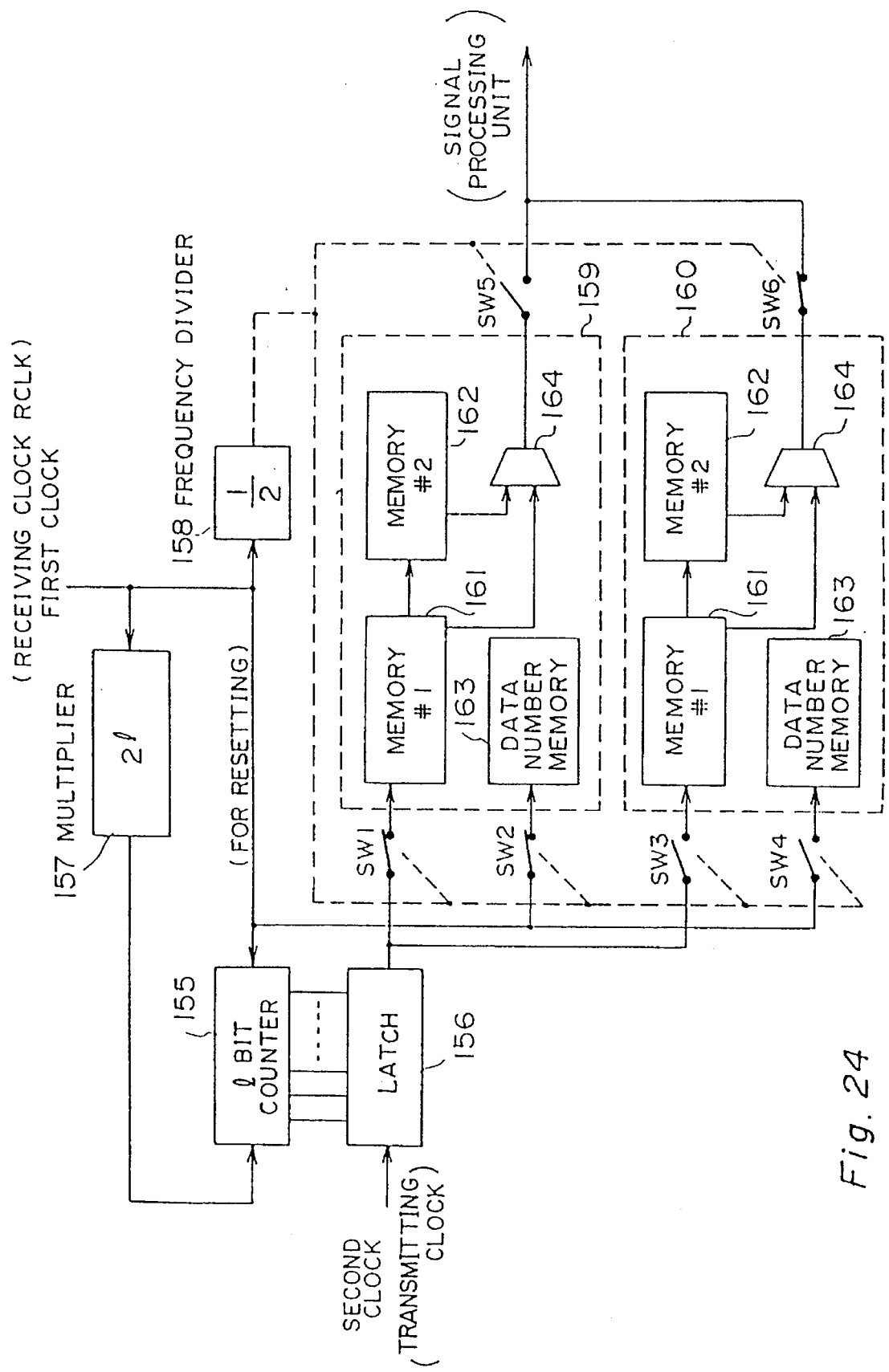
FIG. 24 shows the detailed structure of a timing difference detecting circuit according to the third embodiment.

FIG. 24 shows a detailed circuit structure for transmitting and receiving timing difference detecting circuit 66 within the data PCM channel apparatus in the second embodiment shown in FIG. 20.

Figure 1:
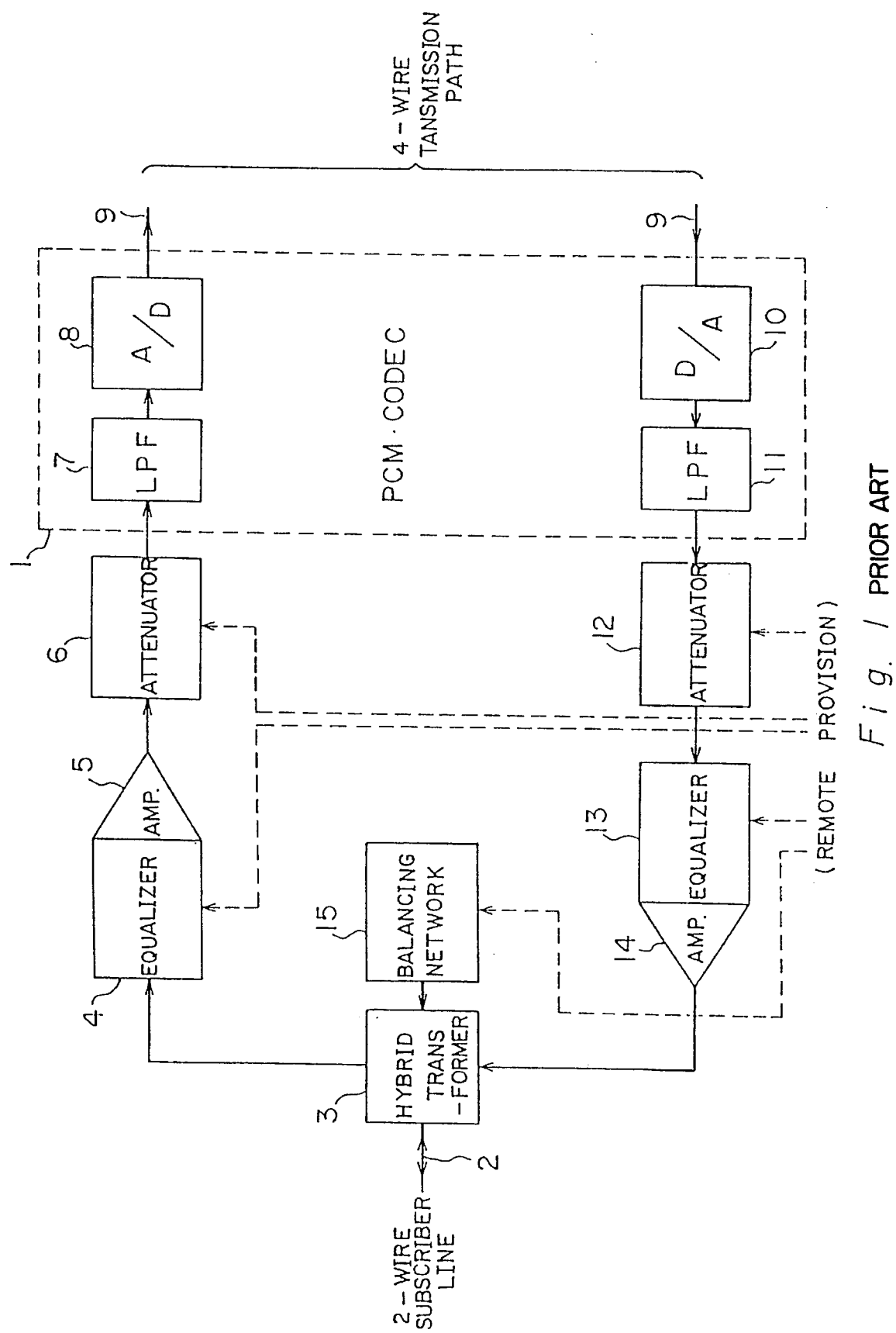
FIG. 1 shows a structural view of a conventional example of a digital PCM channel apparatus.

In FIG. 24 1-bit counter 155, latch 156 and multiplier 157 are respectively the same as 10-bit counter 108 (l=10), 10-bit latch 110 and multiplier 109 in FIG. 19. The first clock and the second clock respectively correspond to receiving clock RCLK and transmitting clock SCLK.

When viewed from the signal processor side (118 in FIG. 20) the time at which timing difference data τ is produced from latch 156 is not constant as described above. Thus, a case can occur in which data of the previous period has not yet been processed, when the process of obtaining data of the present period based on receiving clock RCLK is occurring. Therefore, two buffer circuits 159 and 160 are provided in parallel as shown in FIG. 24. Switches SW1–SW6 are provided on the input side and the output side, and are switched depending on whether the cycle number of receiving clock RCLK is odd or even. Therefore, when data from latch 156 is written into one of buffer circuits 159 and 160, the other is connected to the signal processor, thereby enabling data to be read out. Signals obtained by dividing the frequency of receiving clock RCLK into ½ the frequency of the receiving clock by frequency divider 158 is used as a control signal for switching an even number/odd number cycle.

As described above, when the transmitting clock SCLK is slightly shorter than that of receiving clock RCLK, the timing difference must be detected twice during one period of RCLK, and before completing processing of the data of the previous period, the following data may be input. Therefore, respective buffer circuits 159 and 160 have a two-stage structure comprising respective memories #1, #2, 161 and 162, and the content of these memories is selected by selector 164.

In the above two-stage structure, data corresponding to the address pointer is required to designate how many pieces of data are input per period, and input data number memory 163 for storing the data is provided in respective buffers. As described above, where the period of receiving clock RCLK is slightly shorter than that of transmitting clock SCLK, the rising edge of SCLK is not positioned within a period of RCLK, and during such period, signal processor 118 in FIG. 20 cannot perform a process in interpolation processing unit 65. To make this judgment, the above input data number memory 163 is necessary. Memory 163 is reset by a control circuit, not shown, at the immediately preceding timing, every time the memory is connected to the latch circuit.

Signal processing unit 118 in FIG. 20 performs the following operation in correspondence with transmitting and receiving timing difference detecting circuit 66 (FIG. 20) shown in detail in FIG. 24. Firstly high-sampling low pass filter 64 operates continuously. Next, interpolation processing unit 65 obtains a timing difference τ from transmitting and receiving timing difference detecting circuit 66 at every period of respective receiving clocks RCLK, and performs the following processes. More specifically, when the contents of input data number memory 163 in the currently selected buffer circuit (159 or 160) in FIG. 24 is observed to be 0, it is unnecessary to output transmitting output signal SOUT; therefore interpolation processing is not conducted. When the number of input data is more than 1, they are input sequentially from the corresponding memory 161 or 162 through an operation of selector 164. Then, interpolation processings are conducted, the number being the same as that of data, thereby producing output signal SOUT.

An an operation of transmitting register 113 in FIG. 20, corresponding to the above timing difference detecting processing and interpolation processing will now be explained.

Output signal SOUT is arithmetically operated and produced by signal processing unit 118, which operates in synchronization with receiving clock RCLK. Therefore, signal processing unit 118 produces an output almost in synchoronization with receiving clock RCLK. As already described, output signal SOUT should be transmitted outwardly in synchronization with transmitting clock SCLK. Thus, a buffer circuit is required for time adjustment of output signal SOUT. This is a function of transmitting register 113 in FIG. 20. The condition required for a register is as follows.

Data input time from signal processing unit 118 to transmitting register 113 is independent of the output time of output signal SOUT from the register. The periods of receiving clock RCLK and transmitting clock SCLK are slightly different, and they are always moving relative to each other. Thus, over a relatively long period, inevitably they will sometimes coincide. Then this coincidence occurs, while data is being transmitted outward from transmitting register 113, a write process is conducted in the register, thereby damaging transmission data. Therefore, while output signal SOUT is output externally from transmitting register 113, data should be prevented from being transmitted from signal processor unit 118 to the register 113.

The number of output data from signal processor unit 118 is 0, 1, or 2 per period. As to output timing, when two data are output per period they are continuously output without a large time difference. However, when a zero-data period is interposed between two two-data periods, the next data will be produced after two periods have passed. Therefore, it is necessary to adjust the timing to output data at a time interval that matches transmitting clock SCLK.

In order to satisfy the latter condition, transmitting register 113 in FIG. 24 comprises a plurality of registers which are not described in detail. Further, a judging circuit for determining which data are output of the data stored in said plurality of registers, is also provided. This judging circuit may make a judgment, using the number of data received from signal processing unit 118, and the register number from which data are output in the previous period, as a parameter. Therefore, a counter is provided for counting the number of received data.

In order to satisfy the former condition, a control circuit for preventing input data from entering a counter when the counter is reset, or when the result of counting is being transferred, is provided in transmitting register 113.

A detailed circuit relating to transmitting register 113 will be explained in the following fourth embodiment.

The Fourth Embodiment

The fourth embodiment will now be explained. This embodiment describes in detail (transmitting and receiving) the timing difference detecting circuit 66 in FIGS. 13A and 20, and also recites interpolation processing unit 65 and transmitting register 113 in FIG. 20. In this embodiment, an operation relation between the first clock (receiving clock RCLK) and the second clock (transmitting clock SCLK) with regard to transmitting and receiving timing difference detecting circuit 66 is reversed to that of the third embodiment, thereby making the circuit structure simpler than in the third embodiment.

Figure 25:
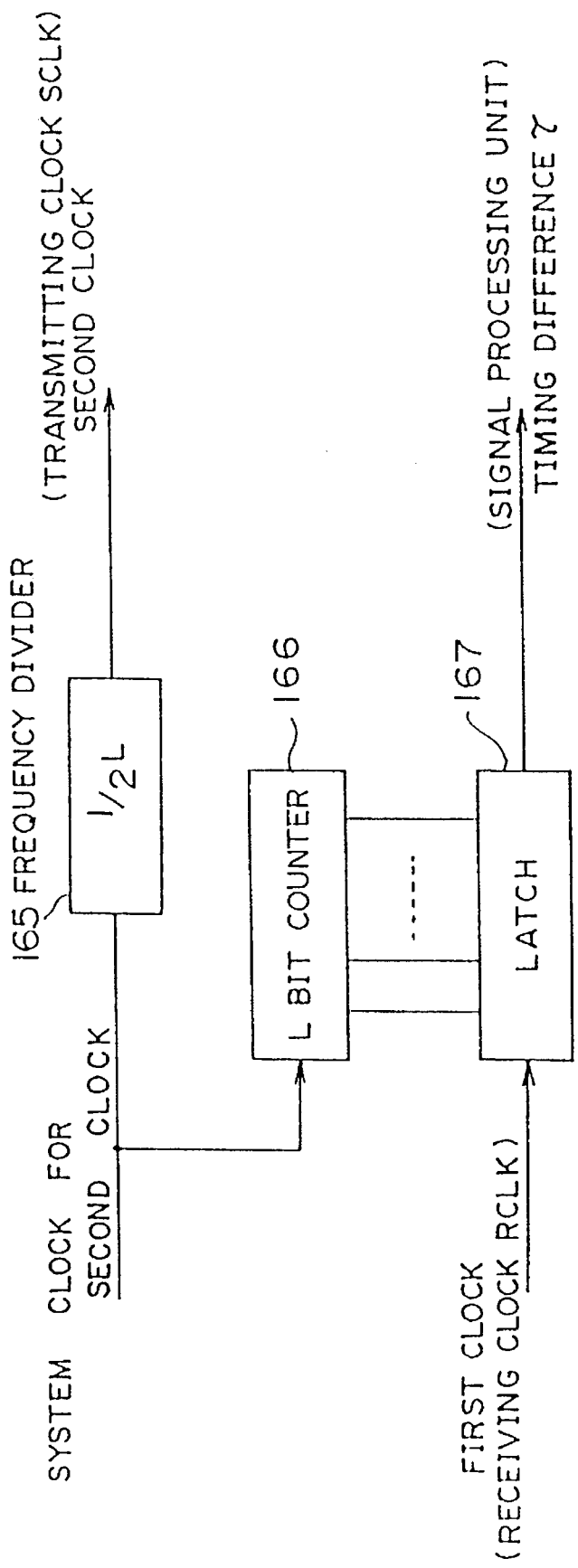
FIG. 25 show the detailed structure of a timing difference detecting circuit according to the fourth embodiment.
Figure 26:
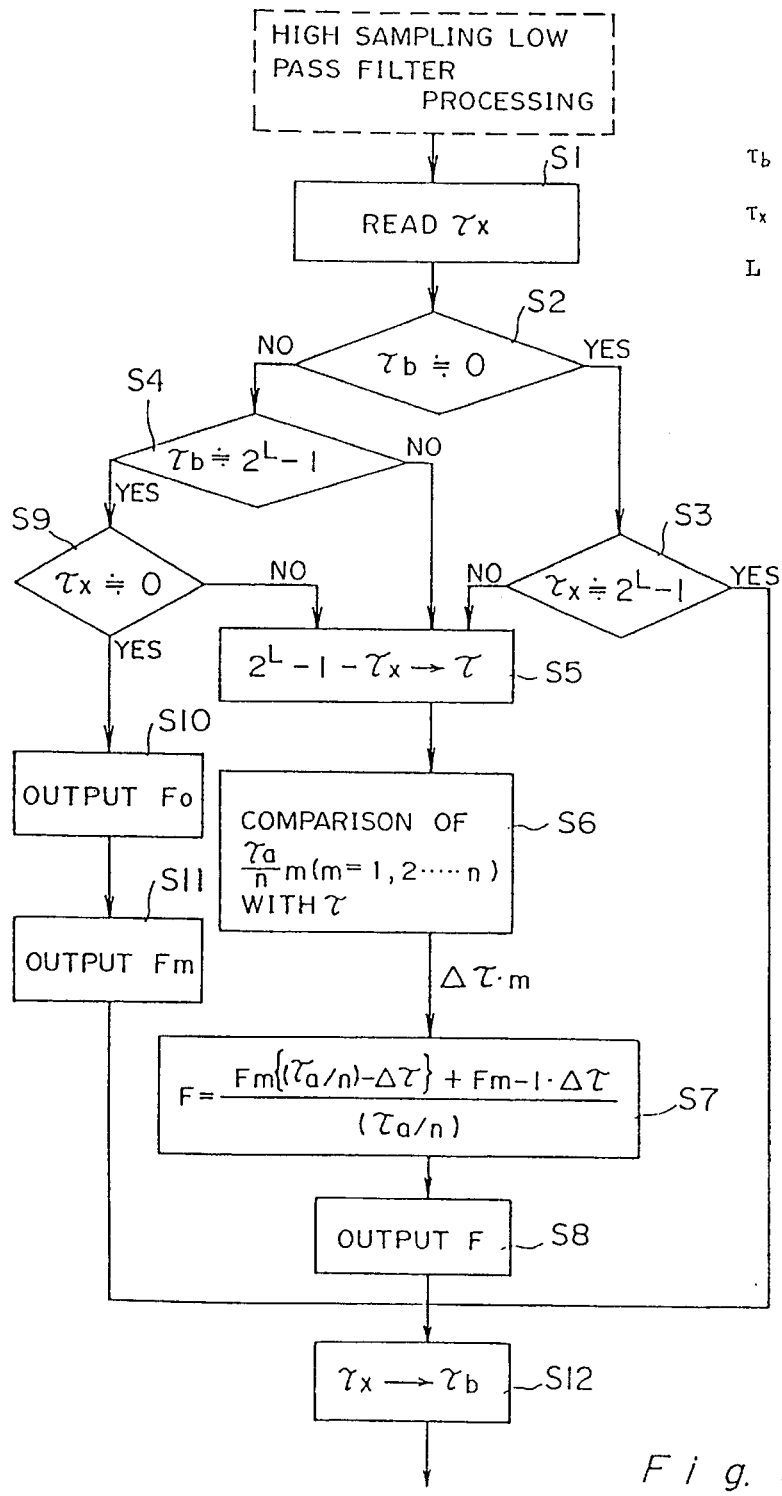
FIG. 26 is an operational flowchart of an interpolation processing unit according to the fourth embodiment.

FIG. 25 shows a block diagram of transmitting and receiving timing difference detecting circuit 66 and FIG. 26 shows an operation flow of signal processor 118 in FIG. 20 in the second embodiment.

In FIG. 25, the system clock of the second clock produced in the data PCM channel apparatus in FIG. 20 is frequency-divided by frequency divider 165 to provide $½^L$ times the frequency of the second system clock, thereby producing the second clock of transmitting clock SCLK. This portion corresponds to transmitting clock generator 114 in FIG. 20. As is opposite to the apparatuses in FIGS. 19 and 24, the reference clock, namely, receiving clock RCLK in signal processing unit 118 is used as a latch signal for latch circuit 167 in FIG. 25, and the system clock of the second clock of synchronized with SCLK is used as a counting operation clock for L-bit counter 166.

By enabling an operation of latch circuit 167 to be synchronized with receiving clock RCLK, an input time of the timing difference data to signal processing unit 118 is determined to have the same relationship as the signal processing unit 118, which operates in synchronization with RCLK.

Another feature of this embodiment is that the interpolation processing unit 65 (FIG. 20), which operates as shown in FIG. 26, determines the number of interpolation data to be operated within a period based on receiving clock RCLK as follows. As the period of transmitting clock SCLK differs by a maximum of $10^{-4}$ from that of the receiving clock, a timing difference between the transmitting clock and the receiving clock varies with the period, gradually increasing or gradually decreasing. Where the number of data per period with reference to RCLK is 0 or more-or-less 2, the value of the timing difference between two adjacent periods changes greatly. Interpolation processing unit 65 uses these characteristics and can recognize the number of interpolation data to be calculated within a period from a variation between a timing difference of the present period and a timing difference of the previous period.

As constructed above, a buffer circuit becomes unnecessary in the timing difference detecting circuit, thereby enabling the circuit scale to be greatly reduced.

An operation of transmitting and receiving in timing difference detecting circuit 66 and an interpolation process in interpolation processing unit 65 will be explained in more detail with regard to the fourth embodiment, shown in FIGS. 25 and 26.

In FIG. 25, a system clock with a frequency $2^L$ times that of transmitting clock SCLK is input to L-bit counter 166 for a count operation. For example, if L=10 and the frequency of SCLK is 8 KHz, the frequency of the system clock becomes 8.192 MHz. In this case counter 166 indicates a count value from 0 to $2^L-1$. This count value is returned to 0 in accordance with a period of transmitting clock SCLK, thereby being reset at every period of transmitting clock SCLK.

When the count value is latched at a rising edge of receiving clock RCLK, the value of the clock is a timing difference based on transmitting clock SCLK when the period of transmitting clock SCLK is $2^L$. Counter 166 can latch the count value without stopping. Thus, the counter is always reset by SCLK as described above.

The latch data is transmitted to an input register, not shown, in signal processing unit 118 in FIG. 20, by adding an L-bit transmitting clock to latch circuit 167 immediately after the latch operation is completed. Therefore, the time from a latch operation to a transmission is very small and is conducted at a predetermined timing within a respective period, based on receiving clock RCLK. The above transmission operation is thereby conducted in synchronization with receiving clock RCLK.

On the other hand, signal processing unit 118 operates based on receiving clock RCLK, as described above. This means that the difference between the time at which various processes are conducted in signal processing unit 118 and the time at which receiving clock RCLK rises, for example, is constant. Therefore, the period from the time at which timing difference data is transmitted from latch circuit 167 to signal processing unit 118 to the time at which the timing difference data is actually used, becomes constant. When the length of this period is less than the corresponding period based on transmitting clock SCLK, there is no unused data remaining in an input register when data is transferred from latch circuit 167 to an input register in signal processing unit 118. Therefore, a buffer circuit is unnecessary.

The operation of the present invention shown in FIGS. 25 and 26 is explained with reference to the timing chart shown in FIGS. 27A and 27B.

In FIGS. 27A and 27B, the abscissa represents time. In ① in FIGS. 27A and 27B, $t_0, t_1, t_2, \ldots$ are rising edge points of receiving clock RCLK and in ③ in FIGS. 27A and 27B, $T_0, T_1, T_2, \ldots$ are rising points of transmitting clock SCLK.

Plot '·' synchoronized with timing $t_0, t_1, t_2,$ in FIG. 27A is an original item of data synchronized with receiving clock RCLK input to data conversion circuit 63 in FIG. 20. The other plots '·' represent an output of high sampling low pass filter 64 of FIG. 20 and correspond to the second embodiment of FIG. 14C. In FIG. 14C, the data are highly-sampled 8 times per period, but in FIGS. 27A and 27B, it is highly-sampled 4 times per period to enable a brief explanation. Further in ② in the figure, plots 'o' represented by $S_0, S_1, S_2, \ldots$ synchronized with timings $T_0, T_1, T_2, \ldots$ of transmitting clock SCLK are signal values to be output as output signal SOUT after they are subjected to an interpolation process in interpolation processing unit 65 in FIG. 20 and are changed to transmitting clock SCLK.

FIG. 27A shows the case where the period length (S period) of transmitting clock SCLK is larger than the period length (R period) of receiving clock RCLK. As the difference in period length between SCLK and RCLK is $10^{-4}$ at maximum, the timing difference between ① and ③ is exaggerated for easy understanding.

L-bit counter clock 166 in FIG. 25 is synchronized with receiving clock SCLK, so the designated value of the counter is 0 at respective timings of $t_n(n=0, 1, 2, \ldots)$. At $t_0, t_1, t_2, \ldots$ the count value is latched and almost simultaneously transmitted to signal processing unit 118 (FIG. 20). The count value at this time, namely the timing difference between transmitting clock SCLK and receiving clock RCLK with transmitting clock SCLK made as a reference, is designated by two lines when a latch is performed, as shown by the upward-pointing arrow.

As shown in ④ in FIG. 27A, the timing difference decreases with time until it reaches 0, becomes a maximum at the beginning of the next period, and again gradually decreases. In such a period shown in $T_1-T_2$ or $T_6-T_7$, the arrow shows that two count values are transmitted per period with reference to the period of transmitting clock SCLK. However, from the viewpoint of signal processing unit 118 for receiving a transmission signal (signal transmitting unit 118 being synchronized with receiving clock RCLK), only a single interpolation process of FIG. 26 is conducted. In this case the timing difference (count value) at $t_0$ or $t_6$ is very small and the timing difference at $t_1$ or $t_7$ is almost equal to the length of one period. Based on these characteristics it is determined whether the interpolation processing is conducted or not, as described later.

In ⑤ in FIG. 27A, a time when an output signal is output from output register $R_0$ in signal processing unit 118 to register $R_1$ in an external timing adjusting circuit (the same as transmitting register 113 in FIG. 20) is designated by a row mark. An output timing adjusting circuit will be explained later. In FIG. 27A an output signal SOUT at $T_5$ of transmitting clock SCLK is transmitted to signal processing unit 118 after a timing difference between $T_5$ and $t_5$ is detected at $t_5$, and an interpolation calculation is conducted to provide $S_5$. This $S_5$ is output to an output timing adjusting circuit at $t_{5.5}$ (an intermediate time between $t_5$ and $t_6$) after 0.5 of a period. Similarly, SOUT at $T_6$ of SCLK is obtained as $S_6$ by detecting a timing difference between $T_6$ and $t_6$ at $t_6$ to transfer the timing difference to signal processing unit 118, and a calculation of an interpolation is conducted, thereby providing $S_6$. $S_6$ is output to an output timing adjusting circuit at $t_{6.5}$ after 0.5 of a period. In contrast, the timing difference between $T_7$ and $t_8$ is detected at $t_8$ and SOUT at timing $T_7$ of SCLK is subjected to an interpolation calculation, thereby enabling $S_7$ to be obtained. $S_7$ is then output to an output timing adjusting circuit at $t_{8.5}$ after 0.5 of a period.

As is clear from the above, transmitting clock SCLK, corresponding to a timing difference equal to almost one period length detected at $t_1$ or $t_7$, does not exist. Therefore the output signal SOUT (FIG. 20) need not be output. In FIG. 27A, while transmitting clock SCLK changes from $T_1$ to $T_{10}$ receiving clock RCLK changes from $t_0$ to $t_{11}$. Therefore, the above fact means that the output number of output signal SOUT per unit time is less than that of receiving PCM signal RIN (FIG. 20), as S period>R period.

Therefore, the trend of timing difference is made to correspond to an output operation of output signal SOUT from signal processing unit 118 to an output timing adjusting circuit. Then it is clear that "from the viewpoint of a timing difference determined by a rise of transmitting clock SCLK to a rise of receiving clock RCLK and a period based on receiving clock RCLK, output signal SOUT should not be output to an output timing adjusting circuit in a period when the timing difference of the previous period is almost 0 and the timing difference of the present period is about the length of a period". This corresponds to the fact that the interpolation process is conducted only once per period at the same timing. The above control is realized according to the operation flow chart of FIG. 26.

Next, FIG. 27B shows the case where the length of the period (R period) of receiving clock RCLK is larger than the length of period (S period) of the transmitting clock (SCLK). In this case, also, for easy understanding, the timing difference between ① and ③ is exaggerated.

Shown in ④, FIG. 27B, the timing difference increases with time until it reaches a length equal to a period, becomes 0 at the beginning of the next period, and again gradually increases. This operation is repeated.

Next output signal SOUT, at $T_5$ of transmitting clock SCLK, is transferred to signal processing unit 118 when the timing difference between $T_5$ and $t_5$ is detected at $t_5$ and provided as $S_5$ through an interpolation calculation. It is output to an output timing adjusting circuit at $t_{5.5}$ (intermediate between $t_5$ and $t_6$) after 0.5 of a period. Next, SOUT, at a timing of $T_6$ of SCLK, is transferred to signal processing unit 118 when the timing difference between $T_6$ and $t_6$ is detected at $t_6$, and then provided as $S_6$ through an interpolation calculation. It is then output to an output timing adjusting circuit at $t_{6.5}$ after 0.5 of a period.

On the other hand respective output signals SOUT are considered at $T_7$ and $T_8$ of SCLK. In this case it can be considered as similar to the case of $T_5$ and $T_6$. When a timing difference between $T_7$ and $t_7$ is detected at $t_7$, SOUT at $T_7$ is output to an output timing adjusting circuit as $S_7$ at $t_{7.5}$ after 0.5 of a period. However in FIG. 27B, the counter which starts to count at $T_7$ is returned to 0 at $T_8$. Thus, the timing difference between $T_7$ and $t_7$ is substantially equal to that between $T_8$ and $t_7$, thereby transmitting the value of the timing difference to signal processing unit 118. Therefore, the output-to-output value of the timing adjusting circuit at $t_{7.5}$ becomes an output signal $S_8$ at the timing $T_8$ of transmitting clock SCLK. In this case, an output $S_7$ at a time corresponding to $T_7$ becomes insufficient.

To compensate for the insufficient output, the present embodiment outputs output signal $S_7$ corresponding to $T_7$ to an output timing adjusting circuit before $t_{7.5}$.

The timing difference value, in this case, is equal to the timing difference between $T_7$ and $t_7$, and can be considered as substantially a period length, because the difference between receiving clock RCLK and transmitting clock SCLK is only about $10^{-4}$. Therefore, when the timing difference trend is made to correspond to the number of signals output from signal processing unit 118 to an output timing adjusting circuit, it is clear that "from the viewpoint of a timing difference determined by a rise of transmitting clock SCLK to a rise of receiving clock RCLK and a period based on a receiving clock RCLK, in a period in which the timing difference of the previous period is almost equal to a period and the timing difference of the present period is almost 0, the transmitting signal should be output to an output timing adjusting circuit twice and the first output is calculated by making the time difference equal to a period and the second output is calculated by making the time difference equal to 0."

By utilizing the above fact, in this embodiment, the process shown by the operation flow chart in FIG. 26 is carried out at interpolation processing unit 65 in signal processing unit 118 in FIG. 20. The problem of the number of an output signal and the amplitude thereof can be easily correlated when the output signal is applied to an output timing adjusting circuit (=transmitting register 113) from signal processing unit 118.

In FIG. 26, the timing difference of the present period designated by $\tau_x$ and the timing difference of the previous period is designated by $\tau_b$. The length of one period based on transmitting clock SCLK is determined as $2^L-1$ by using a bit length L of a counter. The operation of FIG. 26 is shown as follows.

Interpolation processing unit 65 in FIG. 20 starts to operate at timings $t_0$, $t_1$, $t_2$, . . . based on receiving clock RCLK, for example, and high-sampling low-pass filter 64 obtains highly sampled processing data of the previous period at these timings. For example, as shown in FIG. 27A, process data (shown by plot '·') in ② in the same figure are between $t_4$-$t_5$ at a timing of $t_5$.

Next, the timing difference data $\tau_x$ read from transmitting and receiving timing difference detecting circuit 66 (FIG. 20) is written into signal processing unit 118 (FIG. 20), and more particularly into an input register not shown (S1 of FIG. 26).

If $\tau_b \approx 0$ and $\tau_x \approx 2^L-1$, the transmitting signal is not output during the period (S1→S2→S3→S12 in FIG. 26). As described above, this corresponds to a process at a timing $t_1$ or $t_7$ in ① in FIG. 27A.

On the other hand if $\tau_b \approx 2^L-1$ and $\tau_x \approx 0$, the output signal is output twice during the period (S1→S2→S4→S9→S10→S11 in FIG. 26). For the first timing, $\tau_x = 2^L-1$ and this is expressed as $\tau = 2^L-1-\tau_x$ by using a timing difference $\tau$ upon changing the period of receiving clock RCLK to the reference, thereby providing $\tau = 0$. As is understood from FIG. 14C, the output value is no other than $F_0$, thereby enabling the value to be output. For the second timing, $\tau_x = 0$ and $\tau = 2^L-1$. In this case, the output value becomes $F_m$, thereby enabling the value to be output. As described above, this corresponds to a process at a timing of $t_2$ or $t_7$ in ① in FIG. 27B.

Except for the above case, the process advances to follow a route S1→S2→S3→S5 or S1→S2→S4→S5. $\tau = 2^L-1-\tau_x$ is calculated at S5, and at S6 and S7 the interpolation processing shown in the second embodiment of FIG. 18 is conducted. The output value obtained at S8 is output as an amplitude value of output signal SOUT.

At step S12, the timing difference $\tau_x$ in the present period is changed to the timing difference $\tau_b$ in the previous period and used for a process in the following period.

As described above, in this embodiment, (transmitting and receiving) timing difference detecting circuit 66 is constructed such that the timing difference is detected using the second clock (transmitting clock SCLK) as the reference. Interpolation processing unit 64 within signal processing unit 118 executes the process shown in an operation flow chart of FIG. 26. Therefore, by adding an extremely simple circuit structure and a simple logical judgment shown in FIG. 26, important data for changing a clock. More specifically, the timing difference between transmitting clock SCLK and receiving clock RCLK and the control of the number of data output per period, can be completely input to a signal processing unit.

An output timing adjusting circuit will now be explained.

As described above, the amplitude of output signal SOUT is processed by high-sampling low-pass filter 63 in signal processing unit 118 and interpolation processing unit 65 in FIG. 20, to have a amplitude value corresponding to a timing of a transmitting clock SCLK. In contrast, the output timing adjusting circuit described below receives, as an input signal, an output signal train from signal processing unit 118 at irregular time intervals, as shown in ⑤ in FIGS. 27A and 27B. It thereby performs a time adjustment on the signals and outputs them to an external line at equal intervals synchronized with transmitting clock SCLK as shown in ⑧ in FIGS. 27A and 27B. The circuit corresponds to transmitting register 113 in the second embodiment of FIG. 20.

The rectangles shown in ⑤ in FIGS. 27A and 27B indicate the times at which the data is output from signal processing unit 118 to an output timing adjusting circuit. The position of the rectangle is not exact but allows some tolerance, as it is the output from signal processing unit 118. The output from signal processing unit 118 is usually produced at an intermediate position of receiving clock RCLK, based on the receiving clock RCLK. As shown in ⑤ in FIG. 27A, in most of the periods, although it is irregular, the interval of output from signal processing unit 118 is almost equal to that of receiving clock RCLK, and the gap is large only when there is no output signal and only when two outputs are produced per period, for example, after $t_7$ in FIG. 27A and after $t_7$ in FIG. 27B. Although in most periods, the output intervals are set to be equal, they are synchronized with receiving clock RCLK and not with transmitting clock SCLK. Therefore, it is necessary to produce the output at an accurate timing of transmitting clock SCLK as shown in ⑧ in FIG. 27A. Thus, the provision of the output timing adjusting circuit is meaningful.

Figure 28:
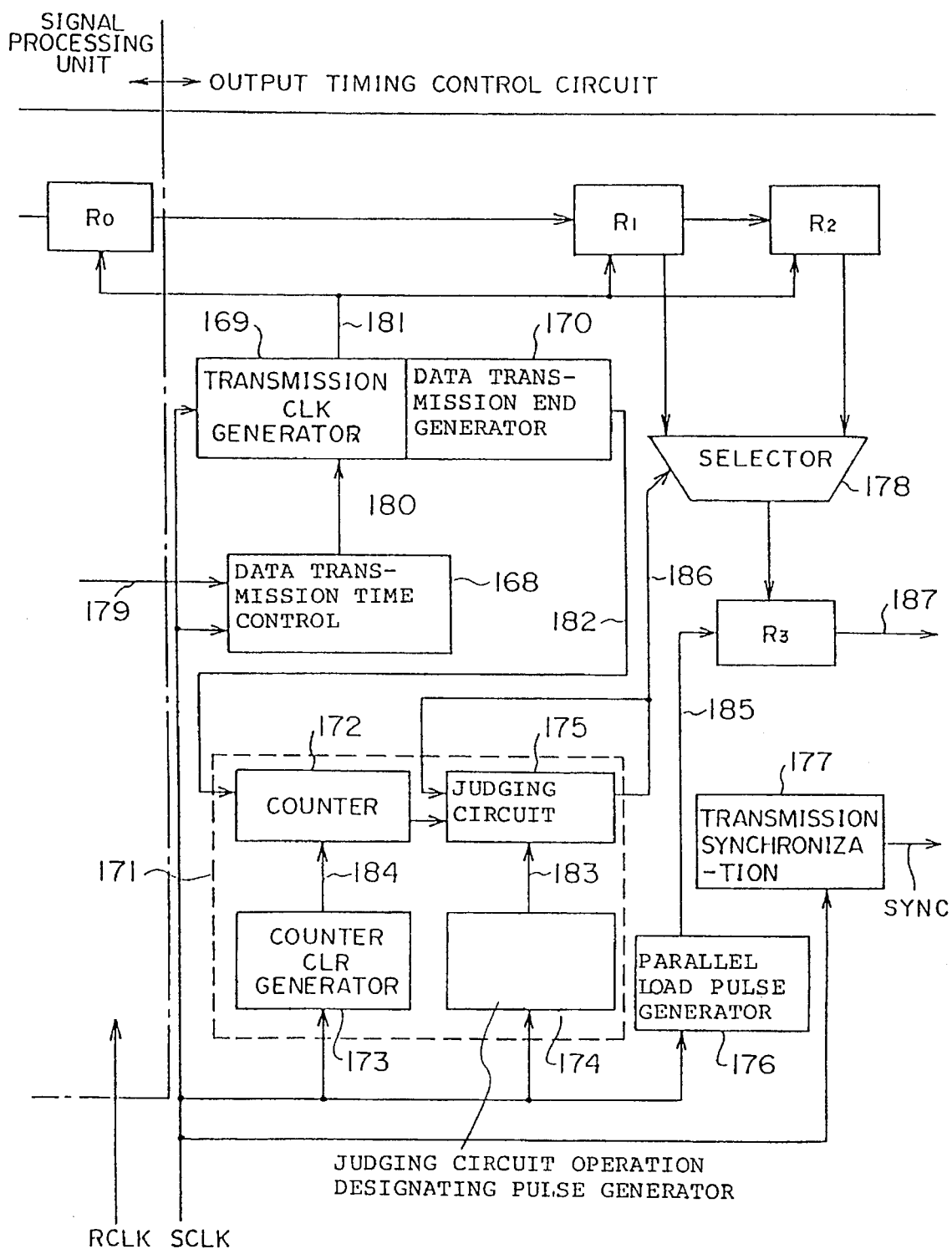
FIG. 28 is a structural view of an output timing adjusting circuit according to the fourth embodiment.

FIG. 28 shows the structure of an output timing adjusting circuit for satisfying the above requirement. The circuit is provided in place of transmitting register 113 in the second embodiment in FIG. 20.

In FIG. 28, register $R_0$ within signal processing unit 118 is the output register and the result obtained by a calculation in interpolation processing unit 65 (FIG. 20) in signal processing unit 118 is entered into the output register. Then, data output demand pulse 179 for demanding the output to an external circuit is output from signal processing unit 118. When the output timing adjusting circuit is able to receive data, data transferring clock generator 169 outputs transferring clock 181, whose number is equal to the bit length of register $R_1$, to which the data is transferred. In accordance with this clock, the content of register $R_0$ is output to register $R_1$ within an output timing adjusting circuit. Where input data is not allowed in data transmitting time adjusting unit 168, data transferring clock generator 169 is suppressed from producing transferring clock 181, thereby enabling the data output from signal processing unit 118 to be delayed. However, when the data is held in register $R_0$, the process stops at a timing when the next data is output to register $R_0$ in signal processing unit 118. Therefore, it is unnecessary to hold the data in register $R_0$ for a long period.

The operation of the output timing adjusting circuit shown in FIG. 28 is summarized as follows. An output signal is transferred from register $R_0$ to a circuit in which registers $R_1$ and $R_2$ are cascade-connected. After the signal is transferred from register $R_0$ to register $R_1$, selector 178 selects which of the signals stored in registers $R_1$ and $R_2$ is to be used as an output signal, and the output is parallelly transferred to register $R_3$. The signals in register $R_3$ are output as series data output 187. On the other hand, transmitting clock SCLK is input to transmitting synchronizing pulse output unit 177, and output therefrom as a transmitting synchronized pulse SYNC. The above series data output 187 and synchronizing pulse SYNC are multiplexed and thereafter, output to a line as output signal SOUT (FIG. 20).

On the other hand, for a control signal, as described above, data output demand pulse 179 is entered into data transferring time (timing) adjusting unit 168 from signal processing unit 118. The circuit receives transmitting clock SCLK and forms a transfer prohibition pulse synchronized with transferring clock SCLK. Data transfer time adjusting unit 168 outputs transfer designating pulse 180 to data transfer clock generator 169 immediately after data output demand pulse 179 is input. Therefore, data transfer clock generator 169 generates transfer clock 181. On the other hand, the above transfer prohibition pulse has a width in a time range determined by the width of the transfer prohibition pulse. If data output demand pulse 179 is input from signal processing unit 118 in this time range, data transfer time adjusting unit 168 does not produce a transfer designating pulse 180 until it passes the above time range and transfer clock 181 is thereby delayed. More specifically, a signal input from signal processing unit 118 is kept waiting. When transfer clock 179 is added to registers $R_0$, $R_1$, and $R_2$, the data is transferred in accordance with the route of register $R_0$→register $R_1$→register $R_2$. After completion of transfer, data transfer end pulse generator 170 produces data transfer end pulse 182 such that select signal generator 169 (explained later) can count the number of transfer inputs within a period.

Select signal generator 171 performs the following operation in a time range in which the transfer prohibition pulse becomes active.

More specifically, the number of signal inputs during the previous period is read into counter 172, and select signal 186 from judging circuit 175 is fed back to its own judging circuit 175. Therefore, which signals stored in register $R_1$ or $R_2$ are to be transferred to register $R_3$ during previous period, is fed back to the judging circuit 175 itself. Following this process, the judging circuit 175 operates and select signal 186 is subjected to an arithmetic operation to determine the direction of selector 178 for the present period. The judging circuit 175 is initialized in synchronization with the judging circuit initialization pulse 183 from the judging circuit operation designation pulse generator 174, which operates based on the transmitting clock SCLK.

To the number of signal inputs for the next period, counter 172 is cleared by counter clear signal 184 from counter clear signal generator 173. Simultaneously, parallel load pulse 185 from parallel load pulse generator 176 paralelly transfers either of signals stored in register $R_1$ or $R_2$ to register $R_3$ in accordance with a direction of selector 178. The signals transferred to register $R_3$ are transferred in parallel and thereafter, although not shown in the drawing, a clock pulse is applied to the clock terminal and output externally along with transmitting synchronizing pulse SYNC.

Figure 29:
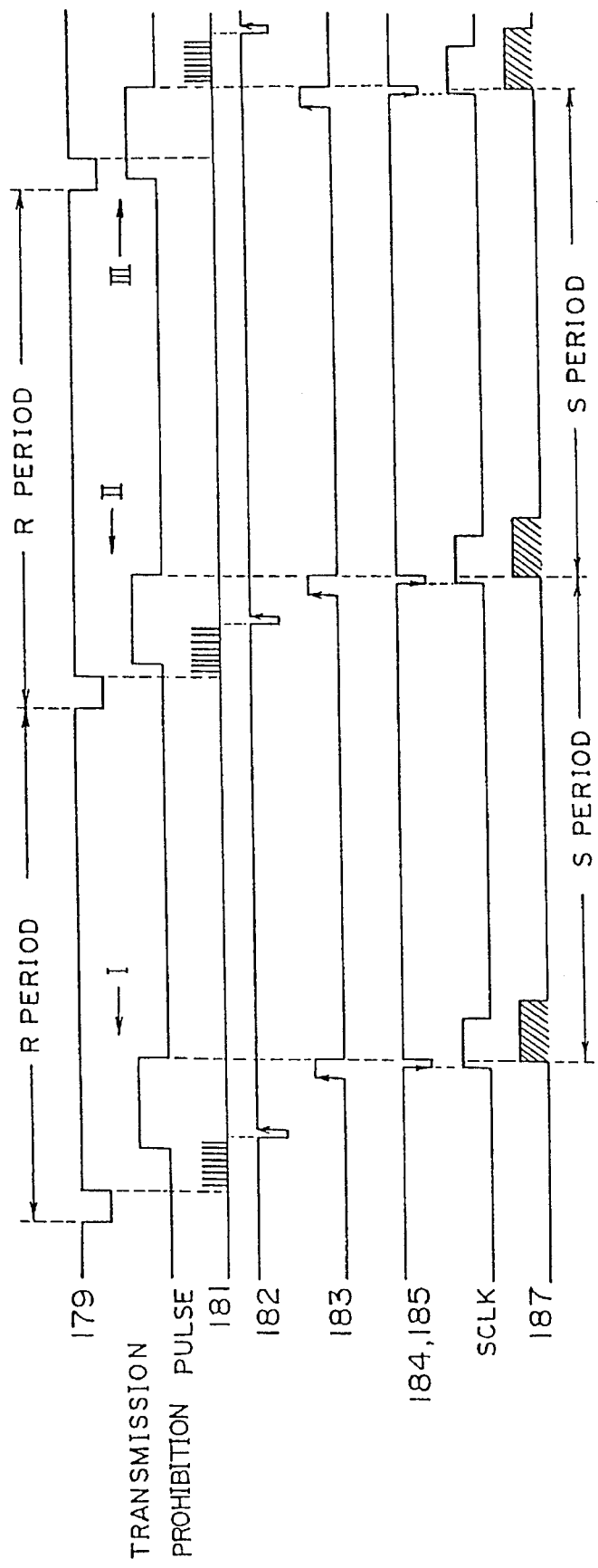
FIG. 29 is an operation timing chart of an output timing adjusting circuit.

The time chart of the above operation is shown in FIG. 29.

Data output demand pulse outputs 179 from signal processing unit 118, as shown in FIG. 29, have time intervals almost equal to the length of the period of receiving clock RCLK (R period).

A transfer prohibition pulse is generated in synchronization with transmitting clock SCLK in data transfer time adjusting unit 168. The pulse width must be sufficient to complete three processes comprising a series transfer operation by transfer clock 181, an operation of judging circuit by judging circuit initialization pulse 183 and parallel transfer from register $R_1/R_2$ to $R_3$ by parallel load pulse 185. Generally, as the frequency of transmitting clock SCLK differs slightly from that of receiving clock RCLK, in most cases, as shown in I or II in FIG. 29, the data output demand pulse 179 does not overlap with transfer prohibition pulse even if R period >S period or S period >R period. However, at a certain probability, they may overlap as shown in III in FIG. 29. In the case of I or II, the data transfer clock generator 169 immediately produces data clock 181 and performs a transfer of signals. Then the transfer end pulse 182 for designating the completion of the transfer is produced from data transfer end pulse generator 170. When the data output demand pulse 179 is overlapped on transfer prohibition pulse, transfer clock 181 is output after transfer prohibition pulse becomes inactive as shown in FIG. 29. If there is no transfer prohibition pulse, data transfer starts right after data output demand pulse 179. During transfer of data through a route register $R_0 \rightarrow$ register $R_1 \rightarrow$ register $R_2$ parallel transfer to a route register $R_1$, $R_2 \rightarrow$ register $R_3$ is completed. In this case the content of register $R_3$ is not always guaranteed.

A transfer prohibition pulse adjusts the signal input time from signal processing unit 118 and prevents the transfer time from register $R_1/R_2$, to register $R_3$ from overlapping with the transfer time from signal processing unit 118 to register $R_1/R_2$. This prevents a signal breakage, and also prevents transfer end pulse 182 in FIG. 29 from colliding with judgment initiating pulse 183 or counter clear signal 184. Thus, the transfer prohibition pulse is very important for exactly determining the number of the input signals in a pre-period.

Next, select signal generating circuit 171 for operating selector 178 is explained. To match an actual IC, the relationship between the sign of select signal 186 and respective registers is set as follows:

| Select Signal | Register connected to Register $R_3$ |
|---|---|
| 0 | Register $R_1$ |
| 1 | Register $R_2$ |

The numbers of signal inputs for a pre-period are 0, 1, 2 as described above, and they are combined with a code (0, 1) of select signal 186 for the pre-period, thereby providing six combinations. For these six combinations, a judgment circuit inputs the following codes of select signal 186 to selector 178.

| A | B | C |
|---|---|---|
| 0 | 0 | 0 |
| 1 | 0 | 0 |
| 0 | 1 | 0 |
| 1 | 1 | 1 |
| 0 | 2 | 1 |
| 1 | 2 | 1 |

In the above table, A represents a select signal for a pre-period, B a number of a signal input for a pre-period, and C a select signal (output) for the present period. A select signal 186 of 0 means that the signal is transferred from register $R_1$ to register $R_3$, and a select signal 186 of 1 means that the signal is transferred from register $R_2$ to register $R_3$.

Where the input signal in the pre-period occurs once a period (S period) based on transmitting clock SCLK (in the third and fourth rows of the above table), the contents of both registers $R_1$ and $R_2$ are renewed once by the input. Without changing a code of the selector signal, the same register signal as in the previous period is output, thereby providing a continuous signal output.

Next, when signal input for the previous S period is 0 (in the first and second rows of the table) the contents of the register are unchanged. Therefore, when the select signal for the current period is the same as that for the previous period, the same signal as for the previous period is output. Thus, when the select signal for the previous period is "1", it is changed to "0" in the current period. When the select signal for the previous period is "0", no new contents are contained in the register, which follows "0" content in the register 1. Thus, 0 is retained unchanged. In this case, the same signal is produced twice, thereby causing a distortion in the output signal waveform. However, this occurs only once and then the apparatus operates in its normal state. Thus, no problems occur.

When the input of the S period occurs twice for the previous period (shown in the fifth and sixth rows of that table), the contents of the register are renewed twice. Therefore, if the select signal is not changed, the signal to be obtained becomes a new signal which is skipped by one from the signal output for the previous period. In this case, if the select signal is 0 for the previous period, it is changed to 1 in the current period and a signal of the correct order is transferred to register 3. If the select signal for the previous period is 1, the signal which is older than that in register 2 is not stored. Thus the select signal is maintained for the present period at 1 period. In this case, signals which are skipped by 1 are output. This phenomenon occurs once at most until the apparatus begins to operate in its normal state.

The operation of the timing adjustment circuit is explained by referring to FIG. 27A. Signals in respective registers $R_1$ and $R_2$ are designated by ⑥ and ⑦. These signal values, corresponding to respective signal values $S_0$, $S_1$, $S_2$, ..., can be obtained at timings $T_0$, $T_1$, $T_2$, ... based on transmitting clock SCLK, in the process data shown in ② of FIG. 27A. For example, in ⑥ of FIG. 27A, $S_5$ is maintained from $t_{5.5}$ to $t_{6.5}$. This means that the output corresponding to a timing of $T_5$ based on transmitting clock SCLK is stored in register $R_1$ from $t_{5.5}$ to $t_{6.5}$. As shown in ⑦ in the FIG. 27A, the signal $S_4$ corresponding to $T_4$ is stored in register $R_2$ for the same period.

Further, when the period unit (S period) synchronized with transmitting clock SCLK from $T_5$ to $T_6$ is considered in FIG. 27A, the previous output is the signal $S_3$ in register $R_2$ in ⑧ in the same figure (selector signal is 1). From ⑤ and ⑨, as an input occurs once for the previous period, the signal in register $R_2$, namely, signal $S_4$ corresponding to a timing $T_4$, is output at the timing $T_6$. Similarly, the signal $S_4$ in the register $R_2$ is used for a previous output in the S period $T_6$ to $T_7$, and the number of inputs is one. Therefore, the signal in a register $R_2$, namely, the signal corresponding to $T_5$, is output at $T_7$.

Next, for the S period $T_7$ to $T_8$ no input exists. The content of register $R_1$ does not change when the signal $S_6$ corresponding to $T_6$ is maintained, and the content of the register $R_2$ does not change when the signal $S_5$ corresponding to $T_5$ is maintained. Select signal generator 171 in FIG. 28 judges that no input signal exists, thereby changing the select signal to 0 and outputting signal $S_6$ corresponding to the signal in register $R_1$, namely, signal $S_6$ corresponding to $T_6$ at $T_8$.

Further, in the case of an S period $T_8$ to $T_9$ a signal output occurs twice. The signal $S_7$ corresponding to a timing $T_7$ is stored in register $R_2$ at a time $T_9$. In this case, select signal generator 171 changes the select signal to 1 by judging two input signals and previous select signal 1, thereby producing a signal in register $R_2$, namely, signal $S_7$ corresponding to $T_7$.

As described above, the output from register $R_3$ is sequentially and correctly obtained. The above explanation applies to the case of S period >R period in FIG. 27A, but the same explanation can be applied to the case of R period >S period in FIG. 27B.

The judging circuit 175, shown in FIG. 28, for realizing the logic shown in the above table can be made by using a small scale circuit comprising a digital comparator operating together with counter 172 for counting the number of the signal input.

In the fourth embodiment, as the output from a counter synchronized with transmitting clock SCLK is latched in by receiving clock RCLK to detect the timing difference between them, (transmitting and receiving) the timing difference detecting circuit does not need a buffer circuit (register). Further, the control circuit is greatly simplified, the circuit scale is miniaturized and the operation is accurate.

As the transfer prohibition pulse is introduced, the output timing adjusting circuit simplifies the control circuit and ensures reliable operation, enabling a combination of selector signal and registers $R_1$ and $R_2$ to reduce the number of registers, thereby effectively suppressing the circuit scale.

As described above, the greatest problem encountered in realizing a digital PCM channel apparatus, is that the receiving clock RCLK is not synchronized with transmitting clock SCLK, and conversion from the former system to the latter system is difficult. From the viewpoint of the scale of hardware and software it is possible to provide the most suitable resolution. This embodiment facilitates the manufacture of the digital PCM channel apparatus in LSIs. The invention, can therefore realize the best digital PCM channel apparatus in respect of noise, power consumption, reliability and cost.

What is claimed is:

1. A signal processing apparatus for performing coding and decoding between analog input and output line signals and digital input and output line signals, comprising:

A/D converting and processing means, comprising a first A/D converter and processor unit and a second A/D converter and processor unit operatively connected in parallel, for individually amplifying an amplitude value of the analog input line signal to produce an amplified analog input line signal, for individually converting the amplified analog input line signal to produce first and second conversion results from the first and second A/D converter and processor units, respectively, and for obtaining an average value of the first and the second conversion results to produce a digital intermediate output signal with a higher conversion precision than a single A/D converter;

D/A converting and processing means, comprising a first D/A converter and processor unit and a second D/A converter and processor unit operatively connected in parallel, for individually converting a digital input signal, for detecting a quantizing error caused by a first conversion unit in said first D/A converter and processor unit for adding said quantizing error to the digital input signal input to said second D/A converter and processor unit and for mixing a result produced by said first D/A converter and processor unit with that produced by said second D/A converter and processor unit in a predetermined ratio to produce an analog output signal which has a higher conversion precision than is achieved by a single D/A converter;

digital signal processing means for synchronizing said first and second A/D converter and processor units and said first and second D/A converter and processor units with a receiving clock of the digital input line signal and for performing signal processing on the digital intermediate output signal from and processing means and the digital input line to produce an analog intermediate input signal and the digital output line signal, the digital output line signal being synchronized with the receiving clock; and digital signal clock changing means for performing a high frequency sampling of the digital output line signal and for detecting a timing difference between the receiving clock of the digital input line signal and a transmitting clock of the digital output line signal to produce a digital transmission signal synchronized with said transmitting clock in response to data obtained from said high frequency sampling through an interpolation process based on the timing difference.

2. The signal processing apparatus according to claim 1, wherein said digital signal processing means and said digital signal clock changing means comprise a digital signal processor.

3. A signal processing apparatus for converting an analog input line signal to a digital output line signal comprising:

first and second amplifying means for amplifying an amplitude value of the analog input line signal to produce first and second amplified analog input line signals, said first and second amplifying means having different gains;

means for individually converting the first amplified analog input line signal and the second amplified analog input line signal using first and second A/D converters operatively connected in parallel to produce first and second digital intermediate output signals, and means for computing an average value of the first and second digital intermediate output signals to provide the digital output line signal.

4. A signal processing apparatus for converting a digital input line signal to an analog output line signal, said signal processing apparatus comprising:

first and second converting means operatively Connected in parallel for receiving the digital input line signal and individually converting the digital input line signal;

detecting means for detecting a quantizing error caused by said first converting means;

addition means for adding the quantizing error to the digital input line signal input to the second converting means; and mixing means for mixing respective conversion results of said first and second converting means at a predetermined ratio to provide the analog output line signal.

5. A signal processing apparatus for converting a digital input line signal to an analog output line signal comprising:

first companding converting means for converting said digital input line signal to a first companded digital signal;

first D/A converting means for converting said first companded digital signal to a first analog signal;

first amplifying means for amplifying said first analog signal by k3 where k3 is a real number greater than zero, to produce a first amplified output;

detecting means for detecting a quantizing noise in said first companded digital signal;

noise adding means for adding said digital input line signal and a value obtained by amplifying the quantizing noise by k4, where k4 is selected to be a real number satisfying an equation k4=k3/(1−k3), to provide a compensated digital input line signal;

second companding converting means for converting the compensated digital input line signal from said noise adding means to a second companded digital signal;

second D/A converting means for converting the second companded digital signal to a second analog signal;

second amplifying means for amplifying the second analog signal by k5, where k5 is selected as a real number to satisfy an equation k5+k3=1, to produce a second amplified output; and adding means for adding the first amplified output and the second amplified output from said first and second amplifying means, respectively, to provide the analog output line signal.

6. A signal processing apparatus comprising a combination of a companding D/A converting unit and a digital signal processor for converting a digital input line signal to an analog output line signal, said digital signal processor comprising:
first companding conversion means for converting said digital input line signal comprising linear pulse code modulation codes to first companding pulse code modulation codes;
detecting means for detecting a quantizing noise in said first companding pulse code modulation codes;
noise adding means for amplifying said quantizing noise by k4 to produce amplified quantizing noise, where k4 is selected to be a real number satisfying an equation k4=k3/(1−k3) and for adding the amplified quantizing noise to the digital input line signal to produce a compensated digital input line signal; and
second companding converting means for converting the compensated digital input line signal from said noise adding means to second companding pulse code modulated codes;

said companding D/A converting unit comprising:
first companding D/A converting means for converting the first companding pulse code modulation codes to a first analog signal;
first amplifying means for amplifying the first analog signal by k3, where k3 is a real number greater than zero, to produce a first amplified analog signal;
second companding D/A converting means for converting said second companding pulse code modulated codes to a second analog signal;
second amplifying means for amplifying the second analog signal by k5, where k5+k3=1, and k5 is selected as a real number, to produce a second amplified analog signal; and
adding means for adding the first and the second amplified analog signals from said first and second amplifying means, respectively, to provide the analog output line signal.

7. A signal processing apparatus for converting an analog input line signal to a digital output line signal, comprising:
first amplifying means for amplifying the analog input line signal by k1 where k1 is a real number greater than one to produce a first amplified output;
second amplifying means for amplifying the analog input line signal by k2, where k2 is a real number satisfying k2×k1=1, to produce a second amplified output;
first companding A/D converting means for converting the first amplified output to a first companding pulse code modulation code;
second companding A/D converting means for converting the second amplified output from said second amplifying means to a second companding pulse code modulation code;
arithmetic operating means for arithmetically determining an average value of the first and second companding pulse code modulation codes to provide the digital output line signal.

8. A signal processing apparatus comprising a combination of a companding A/D converter unit and a digital signal processor for converting an analog input line signal to a digital output line signal, said companding A/D converter unit comprising:
first amplifying means for amplifying the analog input line signal by k1 where k1 is a real number greater than one to produce a first amplified output;
second amplifying means for amplifying the analog input line signal by k2, where k2 is a real number satisfying k2×k1=1, to produce a second amplified output;
first companding A/D converting means for converting the first amplified output to a first companding pulse code modulation code; and
second companding A/D converting means for converting the second amplified output from said second amplifying means to a second companding pulse code modulation code; and said digital signal processing means comprising:
first linear converting means for converting the first companding pulse code modulation code to a first linear signal;
second linear converting means for converting the second companding pulse code modulation code to a second linear signal; and
arithmetic operating means for arithmetically determining an average value of the first and second linear signals and outputting the digital output line signal.

9. A signal processing apparatus comprising:
first and second amplifying means for amplifying an analog input line signal by k1 and k2, respectively, where k1 is a real number greater than one, and k2 is a real number satisfying an equation k2×k1=1 to produce respective first and second amplified analog input line signals;
a pulse code modulation coder/decoder including first and second companding A/D converting means and first and second companding D/A converting means integrally formed therein;
a digital signal processor including a first and second linear converting means, an arithmetic operating means, a first and second companding converting means, a detecting means and an error adding means,
said first and second companding A/D converting means converting the respective first and second amplified analog output line signals respectively from said respective first and second amplifying means to respectively produce first and second companding pulse code modulation codes, and
said first and second linear converting means converting the first and second companding pulse code modulation codes to respectively produce first and second linear signals;
arithmetic operating means for arithmetically obtaining an average of the first and second linear signals to produce a digital output line signal,
said first companding converting means converting a digital input line signal comprising linear pulse code modulation codes to a third companding pulse code modulation code,
said first companding D/A converting means converting the third commanding pulse code modulation code to a first analog signal;
third amplifying means for amplifying the first analog signal by k3, where k3 is a real number greater than zero, to produce a first amplified analog signal,
said detecting means detecting a quantizing noise in the digital input line signal of said third companding pulse code modulation code,
said error adding means amplifying said quantizing noise by k4 to produce amplified quantizing noise, where k4 is a selected real number satisfying an equation k4=k3/

(1–k3) and adding the amplified quantizing noise to the digital input line signal to produce a compensated digital input line signal, said second companding converting means converting the compensated digital input line signal from said error adding means to a fourth companding pulse code modulation code, and said second companding D/A converting means for converting the fourth companding pulse code modulation code to a second analog signal;

fourth amplifying means for amplifying said second analog signal by k5, where k5 is a selected real number satisfying k5+k3=1, to produce a second amplified analog signal; and adding means for adding the first and second amplified analog signals from said third and fourth amplifying means, respectively, to provide an analog output line signal.

10. A signal processing apparatus for performing coding and decoding between analog input and output line signals and digital input and output line signals, comprising:

A/D converting and processing means, comprising a first A/D converter and processor unit and a second A/D converter and processor unit operatively connected in parallel, for amplifying an amplitude value of the analog input line signal to produce an amplified analog input line signal, for individually converting the amplified analog input line signal to obtain respective converted input signals, and for obtaining an average value of the respective converted input signals to produce the digital output line signal with a higher conversion precision than is achieved with a single A/D converter; and D/A converting and processing means, comprising a first D/A converter and processor unit which includes a first D/A conversion unit, and a second D/A converter and processor unit which includes a second D/A conversion unit, operatively connected in parallel, for converting the digital input line signal using said first D/A conversion unit, for detecting a quantizing error caused by said first D/A conversion unit during converting, for adding said quantizing error to the digital input line signal to produce a quantized digital signal, for converting the quantized digital signal using said second D/A conversion unit and for mixing an output produced by said first D/A conversion unit with an output produced by said second D/A conversion unit in a predetermined ratio to produce the analog output line signal which has a higher conversion precision than is achieved by a single D/A converter.

11. A signal processing apparatus for performing coding between an analog input line signal and a digital output line signal, comprising:

A/D converting and processing means, comprising a first A/D converter and processor unit and a second A/D converter and processor unit operatively connected in parallel, for amplifying an amplitude value of the analog input line signal by a first gain in said first A/D converter and processor unit and by a second gain, different from the first gain, in said second A/D converter and processor unit, for individually converting the analog input line signal and for obtaining an average value of a conversion result obtained by said first and second A/D converter and processor units to produce the digital output line signal with a higher conversion precision than is achieved with a single A/D converter.

12. A signal processing apparatus for performing conversion between a digital input and an analog output line signal, comprising:

D/A converting and processing means, comprising a first D/A converter and processor unit which includes a first D/A conversion unit, and a second D/A converter and processor unit which includes a second D/A conversion unit, operatively connected in parallel, for converting the digital input line signal using said first D/A conversion unit, for detecting a quantizing error caused by said first D/A conversion unit during converting, for adding said quantizing error to the digital input line signal to produce a quantized digital signal, for converting the quantized digital signal using said second D/A conversion unit and for mixing an output produced by said first D/A conversion unit with an output produced by said second D/A conversion unit in a predetermined ratio to produce the analog output line signal which has a higher conversion precision than is achieved by a single D/A converter.

* * * * *

UNITED STATES PATENT AND TRADEMARK OFFICE
CERTIFICATE OF CORRECTION

PATENT NO. : 5,610,943
DATED : March 11, 1997
INVENTOR(S) : Mitsuo KAKUISHI, et al.

It is certified that error appears in the above-indentified patent and that said Letters Patent is hereby corrected as shown below:

<u>Column 5</u>

Line 2, "DSP119" should be --DSP 19--.

<u>Column 11</u>

Line 58, "$\alpha\cdot/k$" should be --$\alpha/k$--.

<u>Column 12</u>

Line 44, "$k\approx 1+...$" should be --$k\doteq 1+...$--.

<u>Column 14</u>

Line 1, "(6)-8)" should be --(6)-(8)--.

<u>Column 15</u>

Line 2, "$(256 \times 3 \approx 2^{9.5})$" should be --$(256 \times 3 \doteq 2^{9.5})$--.

<u>Column 16</u>

Line 11, "tile" should be --the--.

<u>Column 17</u>

Line 18, "$S_n, S_{n+2}, S_{n+1}, S_{n+3},...$" should be --$S_n, S_{n+1}, S_{n+2}, S_{n+3},...$--.

Line 57, "$....(\tau_a n)$" should be --$....(\tau_{a/n})$--.

<u>Column 21</u>

Line 39, "Q" should be --③--.

UNITED STATES PATENT AND TRADEMARK OFFICE
CERTIFICATE OF CORRECTION

PATENT NO. : 5,610,943
DATED : March 11, 1997
INVENTOR(S) : Mitsuo KAKUISHI, et al.

It is certified that error appears in the above-indentified patent and that said Letters Patent is hereby corrected as shown below:

Column 23

Line 24, after "therefore" --,--.

Line 30, delete "an".

Line 50, "Then" should be --When--.

Column 28

Line 17, "$\tau_b \approx 0$ and $\tau_x \approx 2^L-1$" should be --$\tau_b \fallingdotseq 0$ and $\tau_x \fallingdotseq 2^L-1$--.

Line 21, "$\tau_b \approx 2^L-1$ and $\tau_x \approx 0$" should be --$\tau_b \fallingdotseq 2^L-1$ and $\tau_x \fallingdotseq 0$--.

Column 30

Line 33, after "To" insert --count--.

Signed and Sealed this

Fifth Day of August, 1997

Attest:

BRUCE LEHMAN

*Attesting Officer*      *Commissioner of Patents and Trademarks*